United States Patent
Wu et al.

(10) Patent No.: US 12,080,647 B2
(45) Date of Patent: *Sep. 3, 2024

(54) INTEGRATED CIRCUIT, SYSTEM AND METHOD OF FORMING THE SAME

(71) Applicant: TAIWAN SEMICONDUCTOR MANUFACTURING COMPANY, LTD., Hsinchu (TW)

(72) Inventors: Guo-Huei Wu, Hsinchu (TW); Pochun Wang, Hsinchu (TW); Wei-Hsin Tsai, Hsinchu (TW); Chih-Liang Chen, Hsinchu (TW); Li-Chun Tien, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/065,963

(22) Filed: Dec. 14, 2022

(65) Prior Publication Data
US 2023/0114558 A1    Apr. 13, 2023

Related U.S. Application Data

(63) Continuation of application No. 17/195,868, filed on Mar. 9, 2021, now Pat. No. 11,569,168.

(Continued)

(51) Int. Cl.
*H01L 23/528* (2006.01)
*H01L 21/768* (2006.01)
(Continued)

(52) U.S. Cl.
CPC ........ *H01L 23/5286* (2013.01); *H01L 21/768* (2013.01); *H01L 23/5226* (2013.01); *H01L 27/092* (2013.01)

(58) Field of Classification Search
CPC ............. H01L 23/5286; H01L 23/5226; H01L 21/768; H01L 27/092
(Continued)

(56) References Cited

U.S. PATENT DOCUMENTS 7,260,442 B2    8/2007 Hwang et al.
9,035,686 B1 *  5/2015 Hsu .................. H03K 3/356104
                                                          327/203

(Continued)

FOREIGN PATENT DOCUMENTS

KR    1020090064747    6/2009
KR    1020200008529    1/2020

(Continued)

OTHER PUBLICATIONS

Notice of Allowance of Patent from corresponding application No. KR 10-2021-0057343 (pp. 1-8).

(Continued)

*Primary Examiner* — Tu-Tu V Ho
(74) *Attorney, Agent, or Firm* — Hauptman Ham, LLP

(57) ABSTRACT

An integrated circuit includes a first power rail, a conductive structure, a first active region of a first set of transistors and a second active region of a second set of transistors. The first power rail is on a back-side of a substrate, extends in a first direction, and is configured to supply a first supply voltage. The first active region extends in the first direction, and is on a first level of a front-side of the substrate opposite from the back-side. The second active region extends in the first direction, is on the first level of the front-side of the substrate, and is separated from the first active region in a second direction different from the first direction. The conductive structure is on the back-side of the substrate, extends in the first direction, and is electrically coupled to the first active region and the second active region.

20 Claims, 24 Drawing Sheets

Related U.S. Application Data

(60) Provisional application No. 63/024,972, filed on May 14, 2020.

(51) Int. Cl.
*H01L 23/522* (2006.01)
*H01L 27/092* (2006.01)

(58) Field of Classification Search
USPC ........................................................ 257/203
See application file for complete search history.

(56) References Cited

U.S. PATENT DOCUMENTS

| | | |
|---|---|---|
| 9,256,709 B2 | 2/2016 | Yu et al. |
| 10,950,545 B2 | 3/2021 | Shao et al. |
| 11,569,168 B2 * | 1/2023 | Wu ................. H01L 21/823871 |
| 2007/0046369 A1 | 3/2007 | Schober et al. |
| 2014/0040838 A1 | 2/2014 | Liu et al. |
| 2015/0278429 A1 | 10/2015 | Chang |
| 2018/0145030 A1 | 5/2018 | Beyne et al. |
| 2018/0374791 A1 | 12/2018 | Smith et al. |
| 2019/0164882 A1 | 5/2019 | Chen et al. |
| 2020/0105671 A1 | 4/2020 | Lai et al. |
| 2020/0134123 A1 | 4/2020 | Wang et al. |
| 2021/0028112 A1 * | 1/2021 | Kim ................. H01L 21/76843 |

FOREIGN PATENT DOCUMENTS

| | | |
|---|---|---|
| KR | 1020200011035 | 1/2020 |
| TW | I686923 | 3/2020 |

OTHER PUBLICATIONS

Office Action dated Apr. 26, 2022 from corresponding application No. TW 11120401780 (pp. 1-6).

* cited by examiner

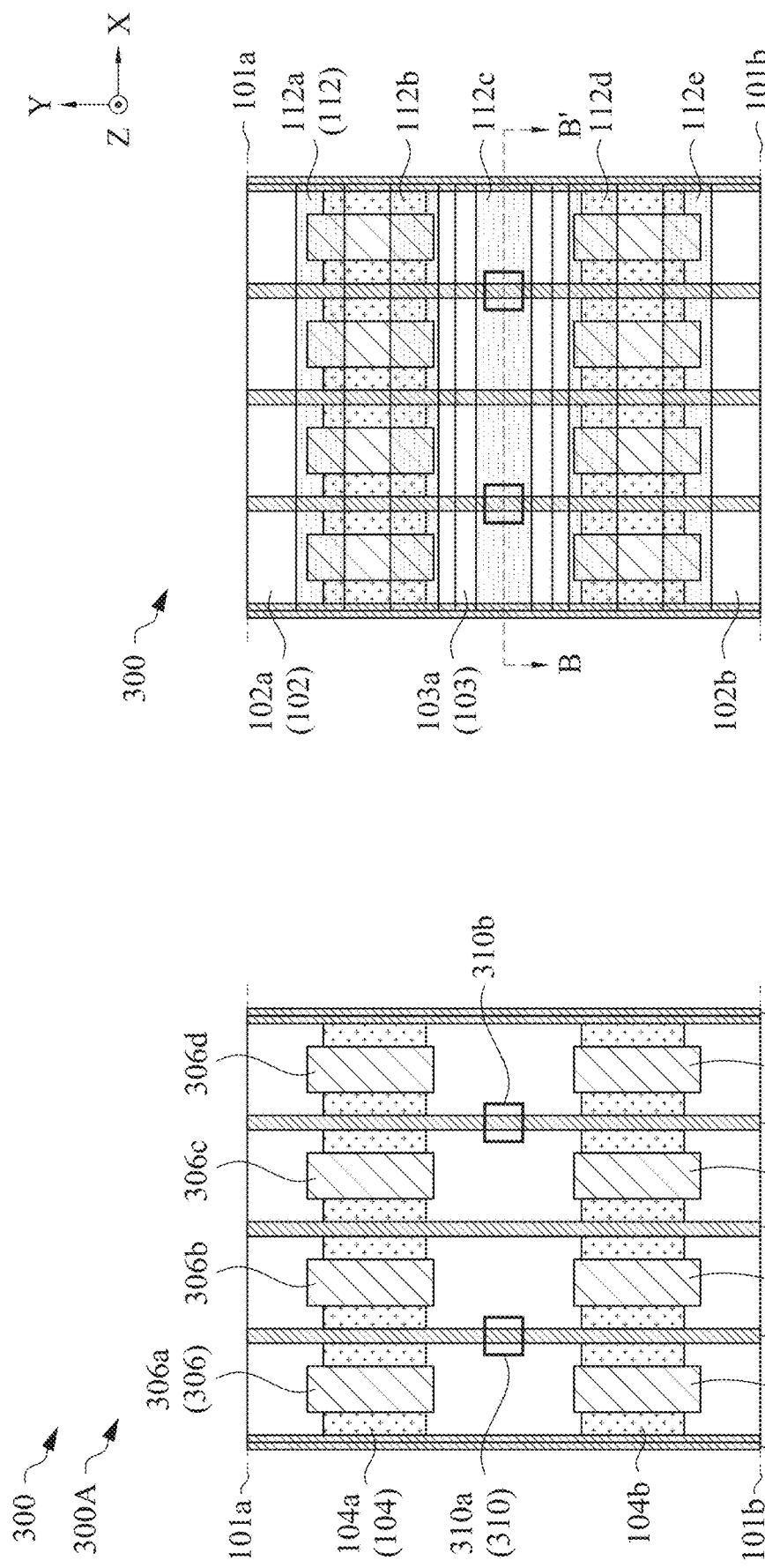

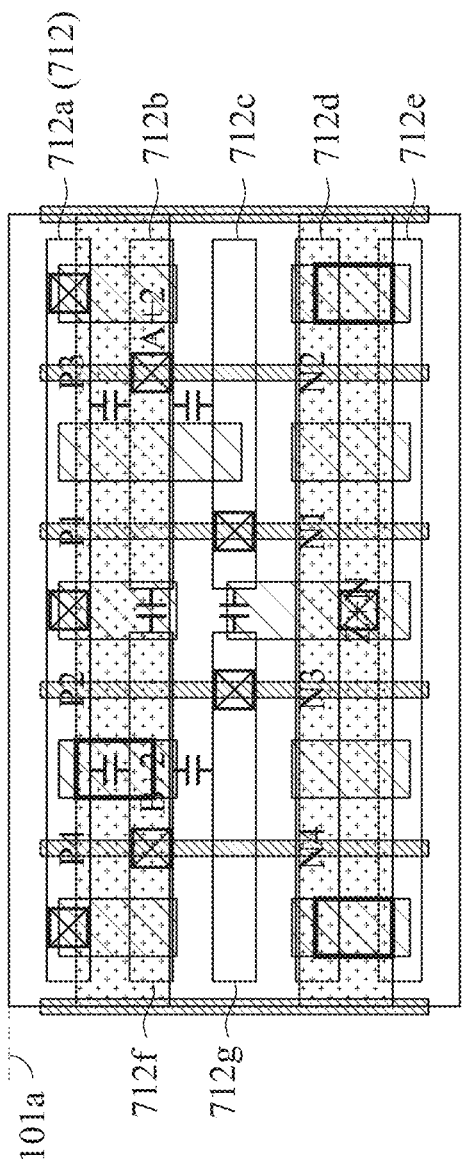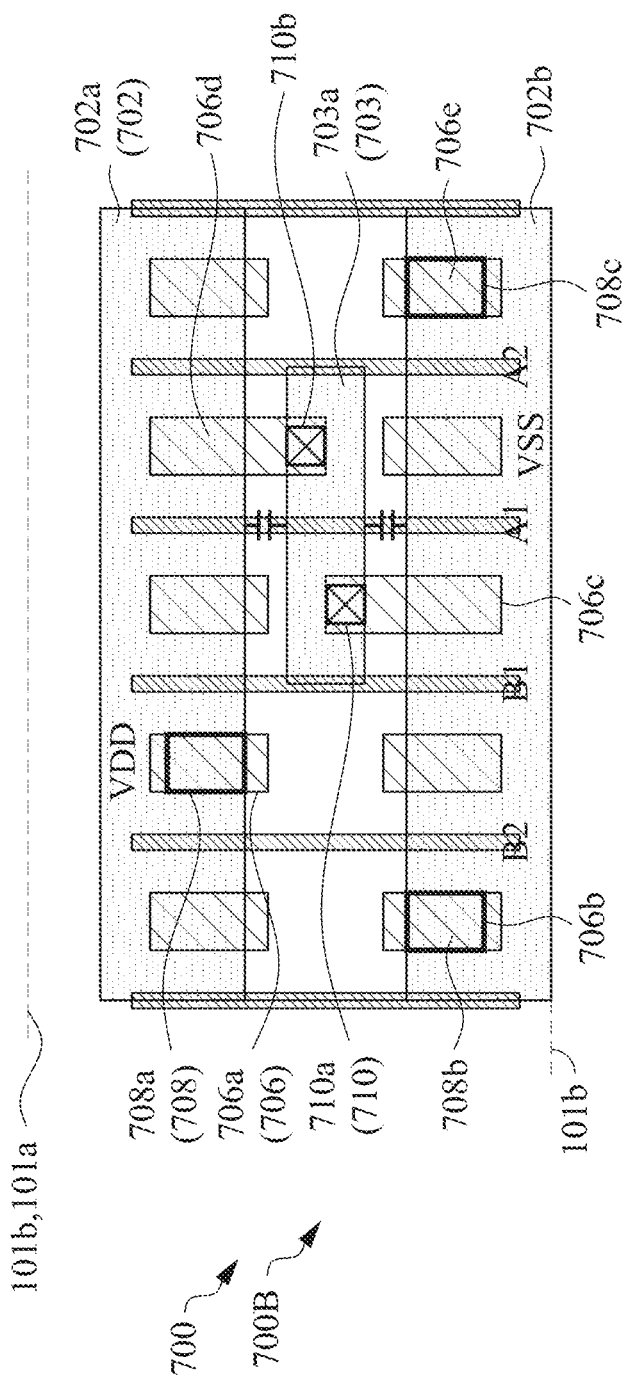

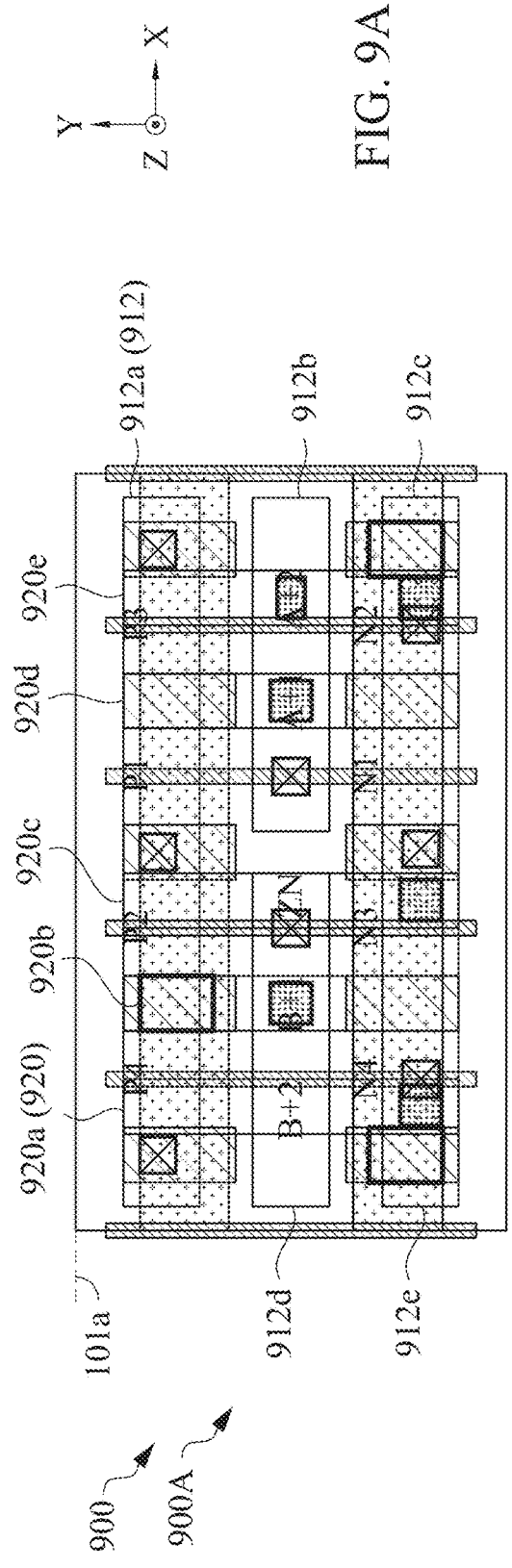
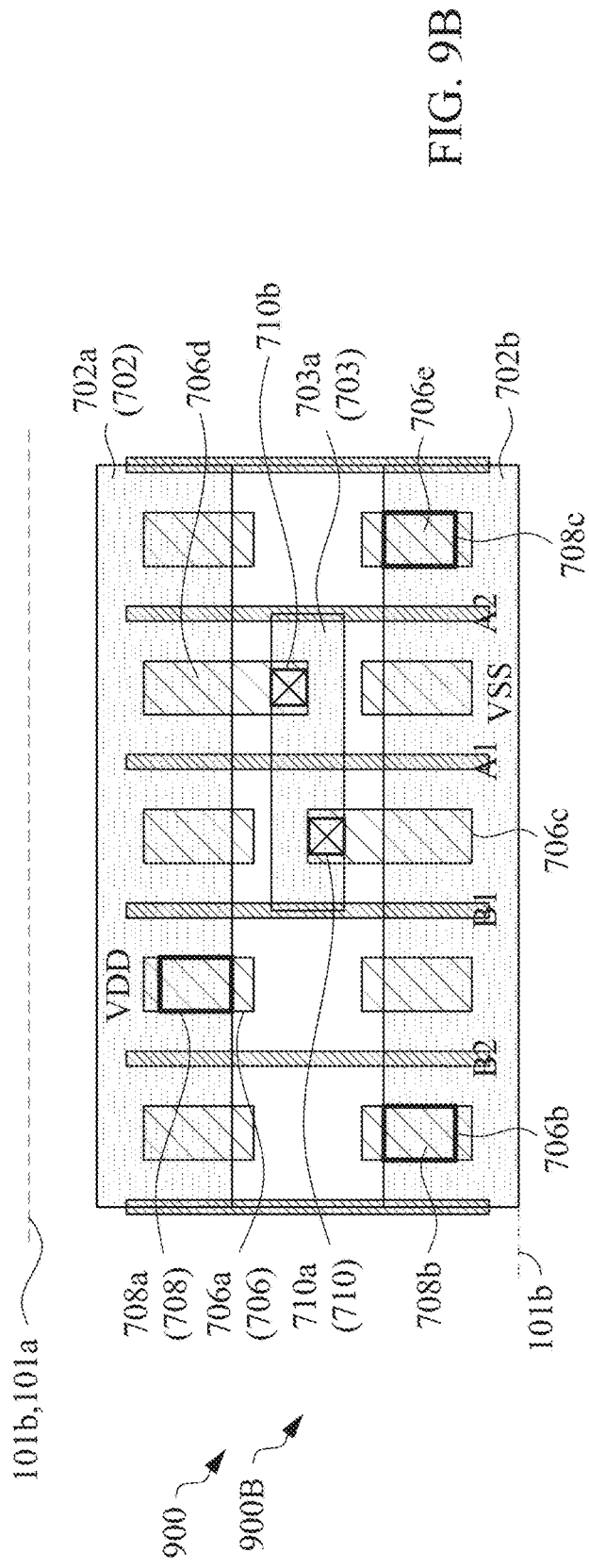
FIG. 9A
FIG. 9B

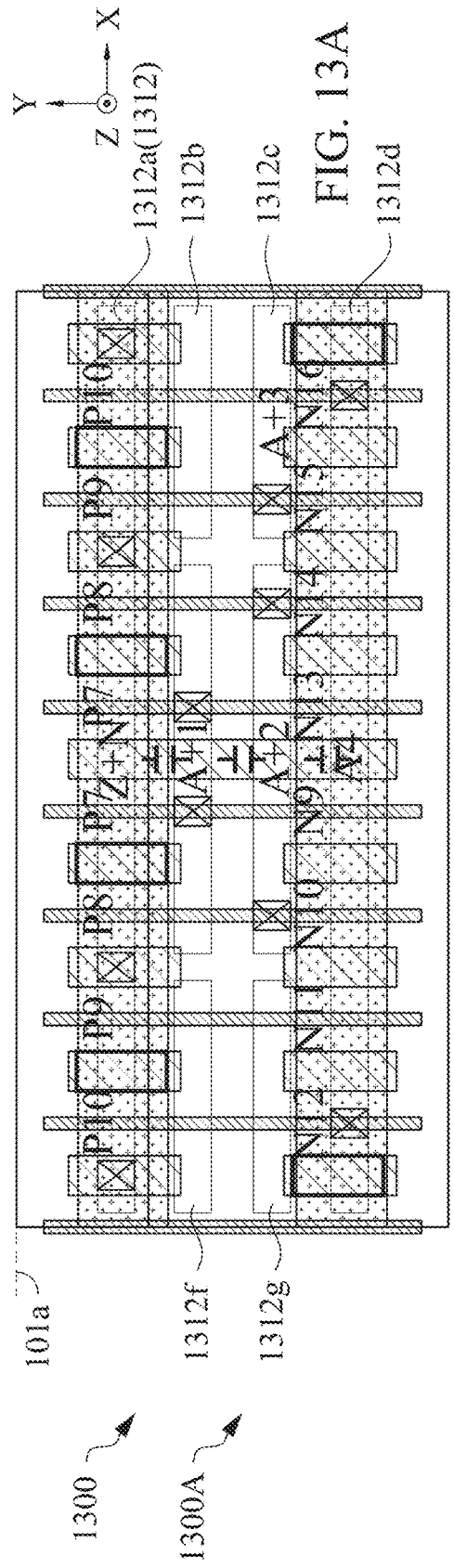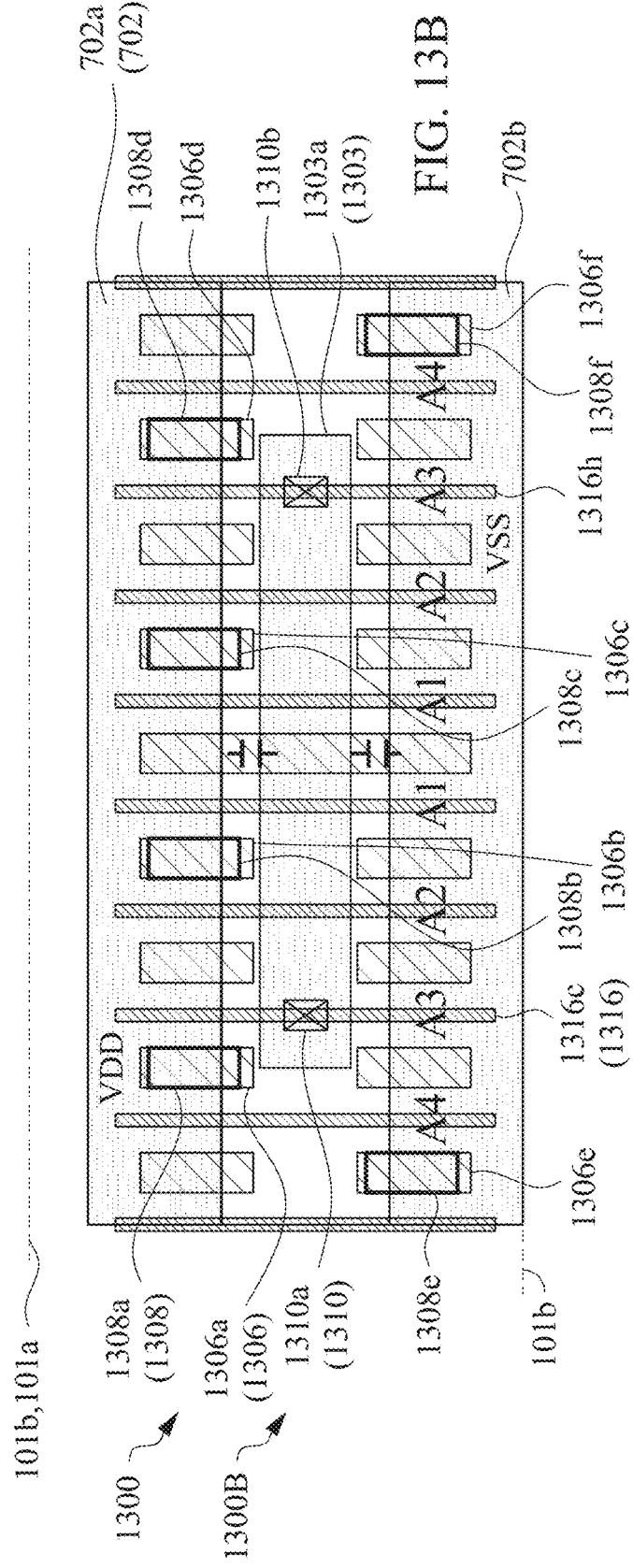
FIG. 13A
FIG. 13B

INTEGRATED CIRCUIT, SYSTEM AND METHOD OF FORMING THE SAME

PRIORITY CLAIM

The present application is a continuation of U.S. application Ser. No. 17/195,868, filed Mar. 9, 2021, now U.S. Pat. No. 11,569,168, issued Jan. 31, 2023, which claims the benefit of U.S. Provisional Application No. 63/024,972, filed May 14, 2020, which are herein incorporated by reference in their entireties.

BACKGROUND

The recent trend in miniaturizing integrated circuits (ICs) has resulted in smaller devices which consume less power yet provide more functionality at higher speeds. The miniaturization process has also resulted in stricter design and manufacturing specifications as well as reliability challenges. Various electronic design automation (EDA) tools generate, optimize and verify standard cell layout designs for integrated circuits while ensuring that the standard cell layout design and manufacturing specifications are met.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3A-3B are diagrams of a layout design of an integrated circuit, in accordance with some embodiments.

FIGS. 7A-7B are diagrams of an integrated circuit, in accordance with some embodiments.

FIGS. 9A-9B are diagrams of an integrated circuit, in accordance with some embodiments.

FIGS. 13A-13B are diagrams of an integrated circuit, in accordance with some embodiments.

DETAILED DESCRIPTION

Figures 1A, 1B:
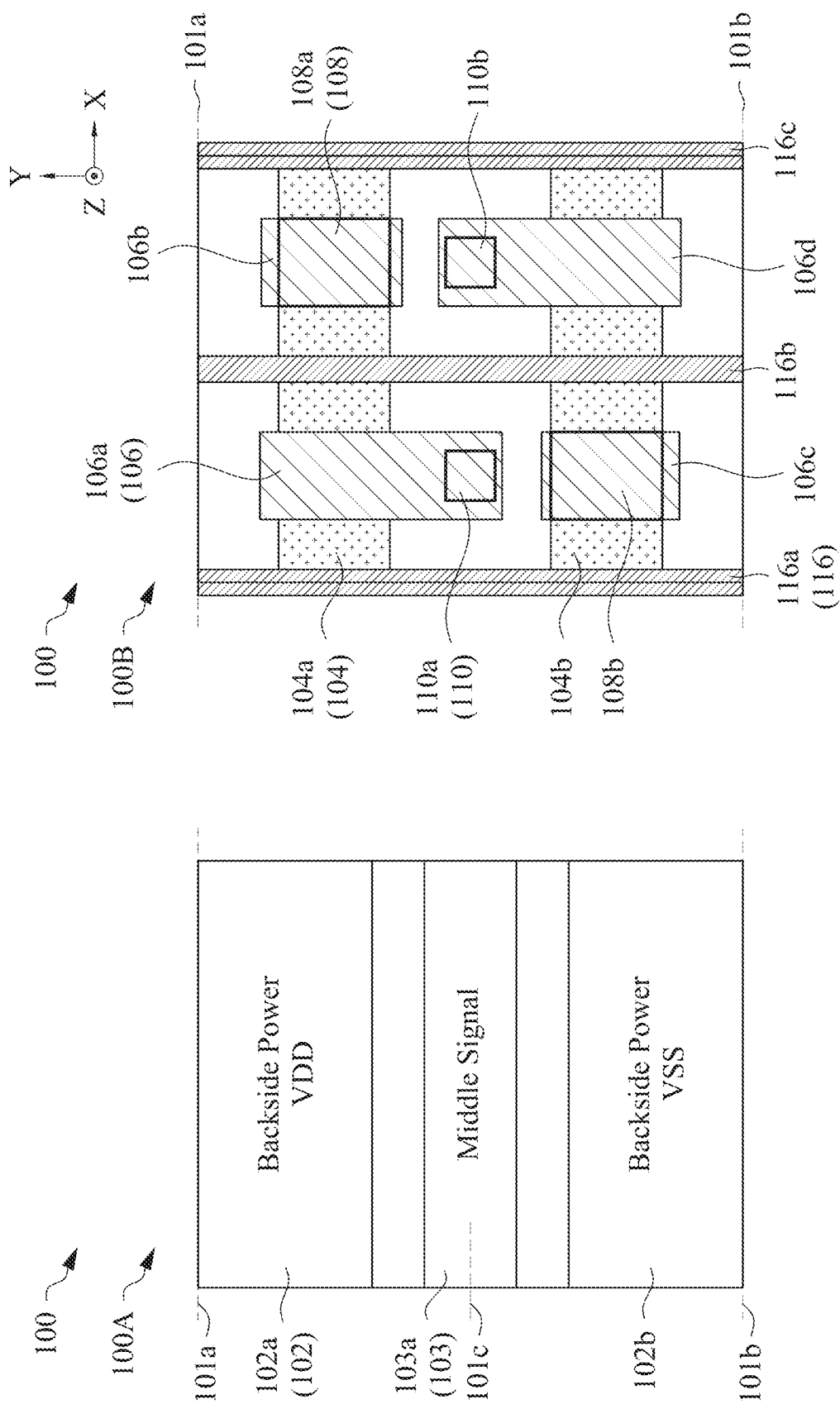
FIGS. 1A-1D are diagrams of a layout design of an integrated circuit, in accordance with some embodiments.

The following disclosure provides different embodiments, or examples, for implementing features of the provided subject matter. Specific examples of components, materials, values, steps, arrangements, or the like, are described below to simplify the present disclosure. These are, of course, merely examples and are not limiting. Other components, materials, values, steps, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, an integrated circuit includes a first power rail, a second power rail, a signal line, a first gate and a second gate. In some embodiments, the integrated circuit further includes a first contact and a second contact of a first set of transistors.

In some embodiments, the first power rail is on a back-side of a substrate or a wafer, and extends in a first direction. In some embodiments, the second power rail is on the back-side of the substrate, extends in the first direction, and is separated from the first power rail in a second direction different from the first direction. In some embodiments, the signal line is on the back-side of the substrate, extends in the first direction, and is between the first power rail and the second power rail.

In some embodiments, the first gate and the second gate extend in the second direction, overlap at least the signal line, and are located on a first level of a front-side of the substrate opposite from the back-side.

In some embodiments, the signal line electrically couples the first gate to the second gate. In some embodiments, the signal line electrically couples the first contact to the second contact.

In some embodiments, by electrically coupling the first gate and the second gate or electrically coupling the first contact and the second contact by the signal line, at least one upper metal layer track in the integrated circuit of the present disclosure is reduced yielding an integrated circuit with better current resistance (IR), electromigration (EM) and resistance capacitance (RC) metal performance compared with other approaches.

In some embodiments, by positioning the first power rail, the second power rail and the signal line on the back-side of the substrate, a gate density of the integrated circuit of the present disclosure is increased compared with other approaches. In some embodiments, by positioning the first power rail, the second power rail and the signal line on the back-side of the substrate, the integrated circuit of the present disclosure offers more routing flexibility and increases routing resources compared to other approaches.

FIGS. 1A-1D are diagrams of a layout design 100 of an integrated circuit, in accordance with some embodiments. Layout design 100 is a layout diagram of integrated circuit 200 of FIGS. 2A-2B.

Figure 1D:
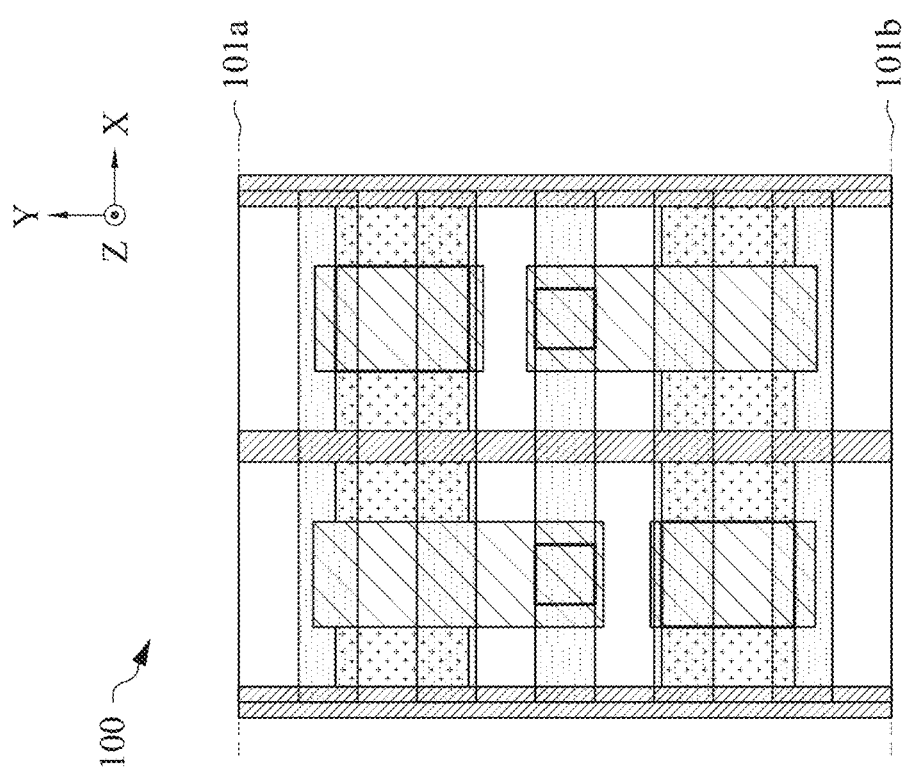
Figure 1C:
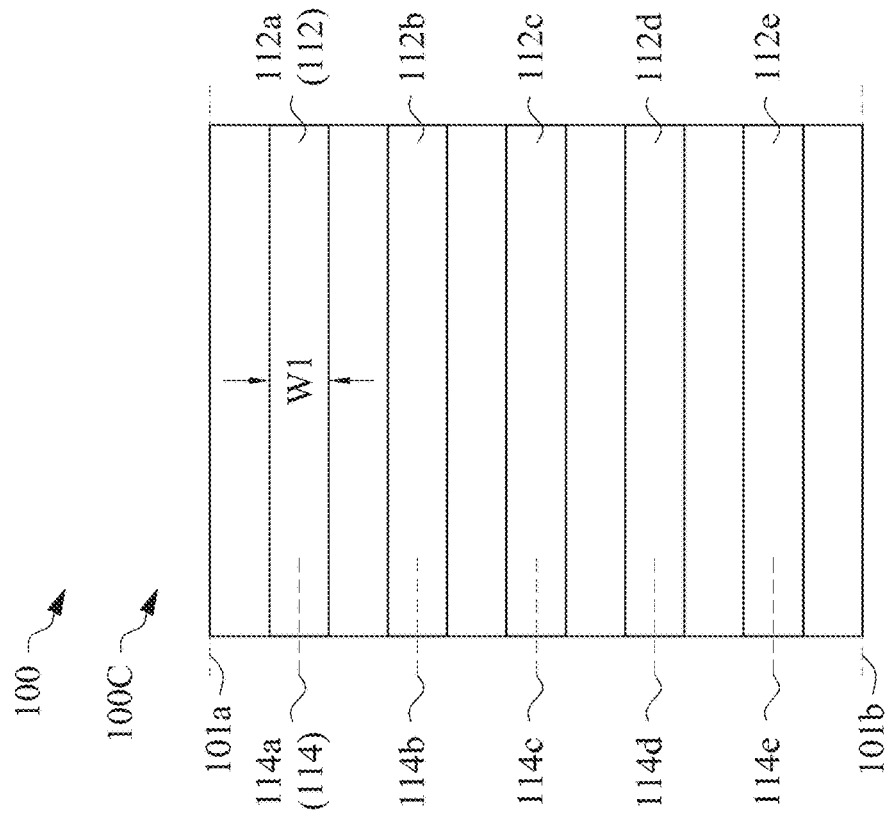

FIGS. 1A-1C are diagrams of a corresponding portion 100A-100C of layout design 100 of FIG. 1D, simplified for ease of illustration. FIG. 1D is a diagram of layout design 100 and includes portions 100A, 100B and 100C, simplified for ease of illustration.

For ease of illustration, some of the elements of FIGS. 1A-1D are not labelled in FIGS. 1A-1D. In some embodiments, layout design 100 includes additional elements not shown in FIGS. 1A-1D.

Portion 100A includes one or more features of layout design 100 of FIG. 1D of the buried power (BP) level of layout design 100. Portion 100B includes one or more features of layout design 100 of FIG. 1D of the oxide diffusion (OD) level, gate (POLY) level, the metal over diffusion (MD) level, the via buried power (VBP) level and the via buried signal (VBS) level of layout design 100. Portion 100C includes one or more features of layout design 100 of FIG. 1D of the metal 0 (M0) level of layout design 100.

Figure 2A:
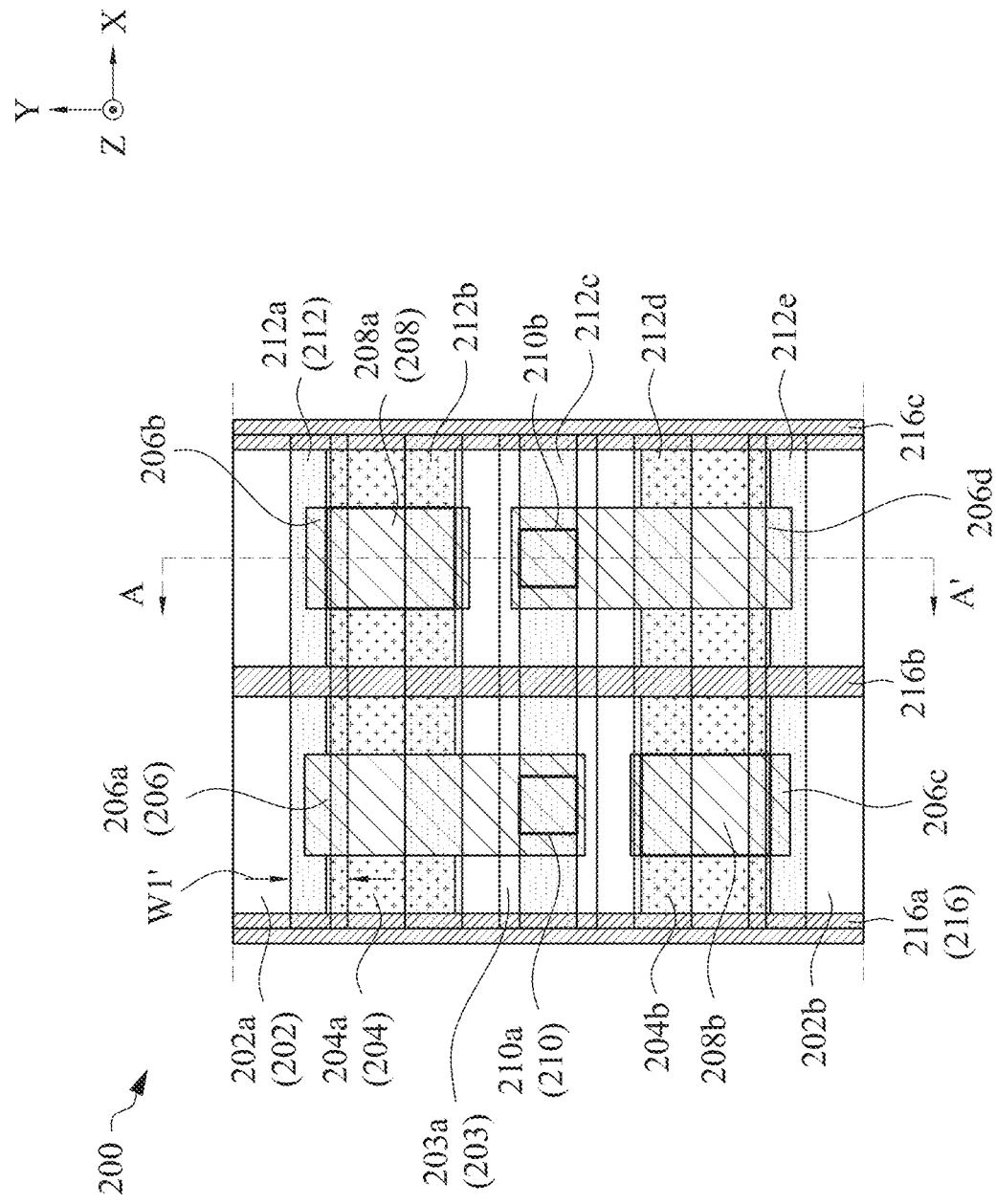
FIGS. 2A-2B are diagrams of an integrated circuit, in accordance with some embodiments.
Figure 2B:
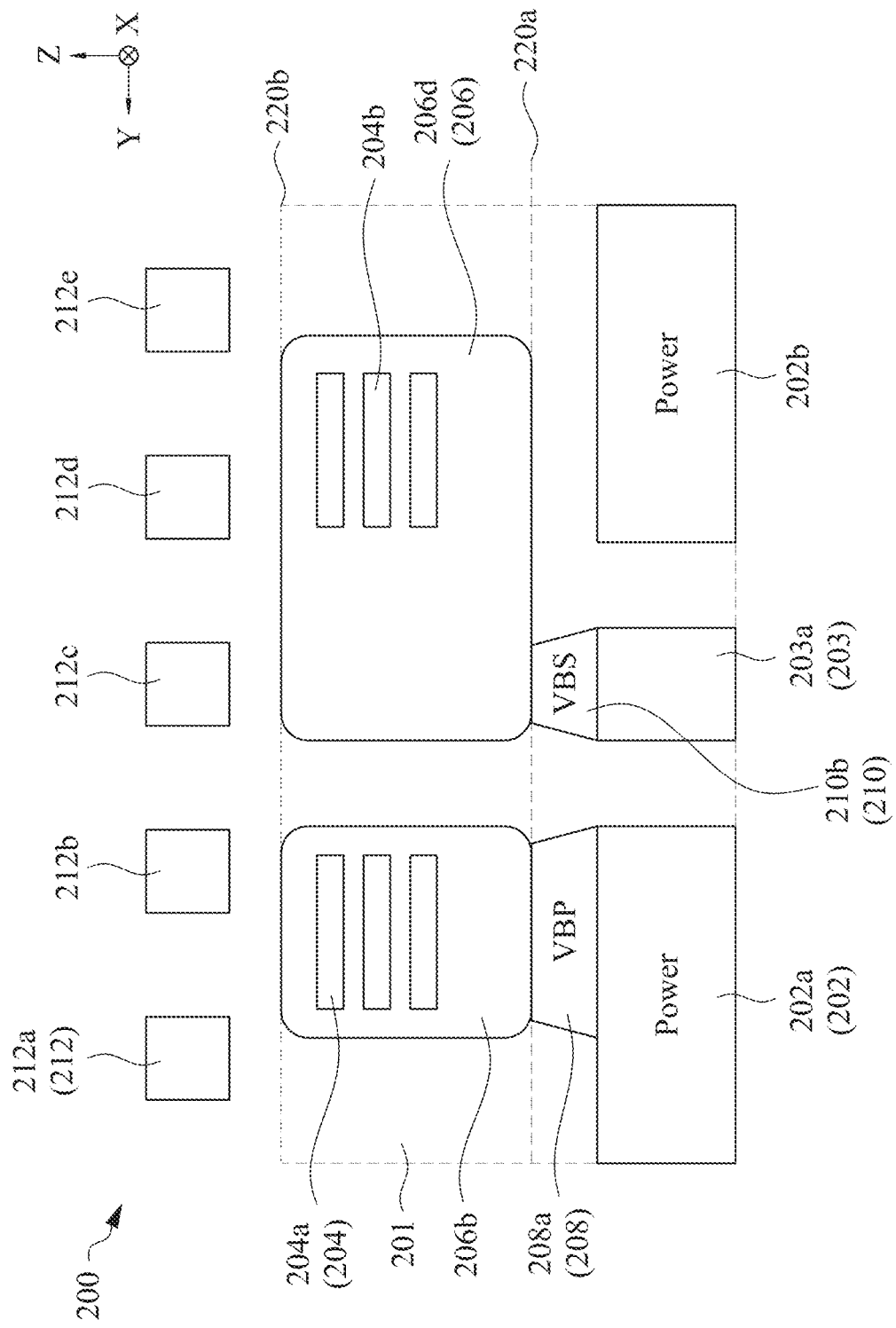

Layout design 100 is usable to manufacture integrated circuit 200 of FIGS. 2A-2B.

Layout design 100 has a cell boundary 101a and cell boundary 101b that extend in a first direction X. Layout design 100 has a height (not labelled) in a second direction Y from cell boundary 101b to cell boundary 101a. In some embodiments, the second direction Y is different from the first direction X. In some embodiments, layout design 100 abuts other cell layout designs (not shown) along cell boundaries 101a and 101b.

Layout design 100 includes one or more power rail layout patterns 102a or 102b extending in the first direction X, and being located on a first layout level. Embodiments of the present disclosure use the term "layout pattern" which is hereinafter also referred to as "patterns" in the remainder of the present disclosure for brevity.

The one or more power rail patterns 102a or 102b are collectively referred to as a "set of power rail patterns 102". In some embodiments, the first layout level corresponds to a buried power (BP) level or a buried signal (BS) level of one or more of layout designs 100 or 300 (FIGS. 1A-1D or 3A-3B), integrated circuit 200 or 400 (FIGS. 2A-2B or 4A-4B), or layout 500A-500B, 700, 800, 900, 1100, 1300, 1400 or 1600 (FIGS. 5A-5B, 7A-7B, 8A-8B, 9A-9B, 11A-11B, 13A-13B, 14A-14B or 16A-16B).

The set of power rail patterns 102 is usable to manufacture a corresponding set of power rails 202 of integrated circuit 200 or 400 (FIGS. 2A-2B or 4A-4B). In some embodiments, the set of power rails 202 are located on a back-side 220a of integrated circuit 200 or 400. In some embodiments, power rail patterns 102a, 102b, 102c of the set of power rail patterns 102 are usable to manufacture corresponding power rails 202a, 202b, 202c of the set of power rails 202 (FIGS. 2A-2B) of integrated circuit 200 or 400.

In some embodiments, power rail patterns 102a and 102b of the set of power rail patterns 102 are located along corresponding cell boundaries 101a and 101b of layout design 100. Other configurations, arrangements on other layout levels or quantities of patterns in the set of power rail patterns 102 are within the scope of the present disclosure.

Layout design 100 further includes one or more signal line patterns 103a (collectively referred to as a "set of signal line patterns 103") extending in the first direction X, and being located on the first layout level. In some embodiments, the set of signal line patterns 103 includes more than one signal line pattern (e.g., FIG. 14B). In some embodiments, the set of signal line patterns is on the BS level.

The set of signal line patterns 103 is usable to manufacture a corresponding set of signal lines 203 of integrated circuit 200 or 400 (FIGS. 2A-2B or 4A-4B). In some embodiments, the set of signal lines 203 are located on a back-side 220a of integrated circuit 200 or 400. In some embodiments, signal line pattern 103a is usable to manufacture corresponding signal line 203a of the set of signal lines 203 (FIGS. 2A-2B) of integrated circuit 200 or 400.

In some embodiments, signal line pattern 103a is located between power rail patterns 102a and 102b. In some embodiments, signal line pattern 103a of the set of signal line patterns 103 is located along a mid-point 101c of layout design 100 in the first direction X.

Other configurations, arrangements on other layout levels or quantities of patterns in the set of signal line patterns 103 are within the scope of the present disclosure.

Layout design 100 further includes one or more active region patterns 104a or 104b (collectively referred to as a "set of active region patterns 104") extending in the first direction X. Active region patterns 104a, 104b of the set of active region patterns 104 are separated from one another in the second direction Y. The set of active region patterns 104 is usable to manufacture a corresponding set of active regions 204 (FIGS. 2A-2B) of integrated circuit 200. In some embodiments, the set of active regions 204 are located on the front-side of integrated circuit 200 or 400. In some embodiments, active region patterns 104a, 104b of the set of active region patterns 104 are usable to manufacture corresponding active regions 204a, 204b of the set of active regions 204 (FIGS. 2A-2B or 4A-4B) of integrated circuit 200 or 400.

In some embodiments, the set of active region patterns 104 is referred to as an oxide diffusion (OD) region which defines the source or drain diffusion regions of at least integrated circuit 200, 400, 600, 1000, 1200 or 1500 (FIGS. 2A-2B, 4A-4B, 6, 10, 12 or 15) or layout 500A-500B, 700, 800, 900, 1100, 1300, 1400 or 1600 (FIGS. 5A-5B, 7A-7B, 8A-8B, 9A-9B, 11A-11B, 13A-13B, 14A-14B or 16A-16B).

In some embodiments, one of active region pattern 104a or 104b of the set of active region patterns 104 is usable to manufacture source and drain regions of NMOS transistors of integrated circuits 600, 1000, 1200 and 1500, and the other of active region pattern 104b or 104a of the set of active region patterns 104 is usable to manufacture source and drain regions of PMOS transistors of integrated circuits 600, 1000, 1200 and 1500.

In some embodiments, the set of active region patterns 104 is located on a second layout level. In some embodiments, the second layout level is above the first layout level. In some embodiments, the second layout level corresponds to an active level or an OD level of one or more of layout designs 100 or 300 (FIGS. 1A-1D or 3A-3B), integrated circuit 200 or 400 (FIGS. 2A-2B or 4A-4B), or layout 500A-500B, 700, 800, 900, 1100, 1300, 1400 or 1600 (FIGS. 5A-5B, 7A-7B, 8A-8B, 9A-9B, 11A-11B, 13A-13B, 14A-14B or 16A-16B). In some embodiments, the BP or BS level is below the OD level.

Other configurations, arrangements on other layout levels or quantities of patterns in the set of active region patterns 104 are within the scope of the present disclosure.

Layout design 100 further includes one or more contact patterns 106a, 106b, 106c or 106d (collectively referred to as a "set of contact patterns 106") extending in the second direction Y. Each of the contact patterns of the set of contact patterns 106 is separated from an adjacent contact pattern of the set of contact patterns 106 in the first direction X. The set of contact patterns 106 is usable to manufacture a corresponding set of contacts 206 (FIGS. 2A-2B) of integrated circuit 200. In some embodiments, contact pattern 106a, 106b, 106c or 106d of the set of contact patterns 106 is usable to manufacture corresponding contact 206a, 206b, 206c or 206d of the set of contact patterns 206. In some embodiments, the set of contact patterns 106 is also referred to as a set of metal over diffusion (MD) patterns.

In some embodiments, at least one of contact pattern 106a or 106b of the set of contact patterns 106 is usable to manufacture source and drain terminals of one of NMOS or PMOS transistors of integrated circuits 600, 1000, 1200 and 1500, and at least contact pattern 106c or 106d of the set of contact patterns 106 is usable to manufacture source and drain terminals of the other of PMOS or NMOS transistors of integrated circuits 600, 1000, 1200 and 1500.

In some embodiments, the set of contact patterns 106 overlap the set of active region patterns 104. In some embodiments, at least contact pattern 106a or 106b is over active region pattern 104a. In some embodiments, at least contact pattern 106c or 106d is over active region pattern 104b.

The set of contact patterns is located on a third layout level. In some embodiments, the third layout level is different from the first layout level and the second layout level. In some embodiments, the third layout level is above the first layout level and the second layout level. In some embodiments, a first portion of the third layout level is above the first layout level and the second layout level, and a second portion of the of the third layout level is below the first layout level and the second layout level. In some embodiments, the third layout level corresponds to contact level or the MD level of one or more of layout designs 100 or 300 (FIGS. 1A-1D or 3A-3B), integrated circuit 200 or 400 (FIGS. 2A-2B or 4A-4B), or layout 500A-500B, 700, 800, 900, 1100, 1300, 1400 or 1600 (FIGS. 5A-5B, 7A-7B, 8A-8B, 9A-9B, 11A-11B, 13A-13B, 14A-14B or 16A-16B).

Other configurations, arrangements on other layout levels or quantities of patterns in the set of contact patterns 106 are within the scope of the present disclosure.

Layout design 100 further includes one or more via patterns 108a or 108b (collectively referred to as a "set of via patterns 108"). The set of via patterns 108 is usable to manufacture a corresponding set of vias 208 (FIGS. 2A-2B). In some embodiments, via patterns 108a, 108b of the set of via patterns 108 are usable to manufacture corresponding vias 208a, 208b of the set of vias 208 (FIGS. 2A-2B) of integrated circuit 200.

In some embodiments, the set of via patterns 108 are between the set of power rail patterns 102 and the set of active region patterns 106. In some embodiments, the set of via patterns 108 are between the set of power rail patterns 102 and the set of contact patterns 106.

Set of via patterns 108 are positioned at a via buried power (VBP) level of one or more of layout designs 100 or 300 (FIGS. 1A-1D or 3A-3B), integrated circuit 200 or 400 (FIGS. 2A-2B or 4A-4B), or layout 500A-500B, 700, 800, 900, 1100, 1300, 1400 or 1600 (FIGS. 5A-5B, 7A-7B, 8A-8B, 9A-9B, 11A-11B, 13A-13B, 14A-14B or 16A-16B). In some embodiments, the VBP level is between the BP level and at least the OD level or the MD level. In some embodiments, the VBP level is between the first layout level and at least the second layout level or the third layout level. Other layout levels are within the scope of the present disclosure.

Via pattern 108a is between power rail pattern 102a and active region pattern 104a. In some embodiments, via pattern 108a is between power rail pattern 102a and contact pattern 106b. Via pattern 108b is between power rail pattern 102b and active region pattern 104b. In some embodiments, via pattern 108b is between power rail pattern 102b and contact pattern 106c. In some embodiments, at least one via pattern of the set of via patterns 108 is not included in layout design 100.

Other configurations, arrangements on other layout levels or quantities of patterns in the set of via patterns 108 are within the scope of the present disclosure.

Layout design 100 further includes one or more via patterns 110a or 110b (collectively referred to as a "set of via patterns 110"). The set of via patterns 110 is usable to manufacture a corresponding set of vias 210 (FIGS. 2A-2B). In some embodiments, via patterns 110a, 110b of the set of via patterns 110 are usable to manufacture corresponding vias 210a, 210b of the set of vias 210 (FIGS. 2A-2B) of integrated circuit 200.

In some embodiments, the set of via patterns 110 are between the set of signal line patterns 103 and the set of contact patterns 106.

Set of via patterns 110 are positioned at a via buried signal (VBS) level of one or more of layout designs 100 or 300 (FIGS. 1A-1D or 3A-3B), integrated circuit 200 or 400 (FIGS. 2A-2B or 4A-4B), or layout 500A-500B, 700, 800, 900, 1100, 1300, 1400 or 1600 (FIGS. 5A-5B, 7A-7B, 8A-8B, 9A-9B, 11A-11B, 13A-13B, 14A-14B or 16A-16B). In some embodiments, the VBS level is between the BS level and the MD level. In some embodiments, the VBS level is between the first layout level and at least the third layout level. In some embodiments, the VBS level and the VBP level are the same. Other layout levels are within the scope of the present disclosure.

Via pattern 110a is between signal line pattern 103a and contact pattern 106a. Via pattern 110b is between signal line pattern 103a and contact pattern 106d. In some embodiments, at least one via pattern of the set of via patterns 110 is not included in layout design 100.

Other configurations, arrangements on other layout levels or quantities of patterns in the set of via patterns 110 are within the scope of the present disclosure.

Layout design 100 further includes one or more gate patterns 116a, 116b or 116c (collectively referred to as a "set of gate patterns 116") extending in the second direction Y. Each of the gate patterns of the set of gate patterns 116 is separated from an adjacent gate pattern of the set of gate patterns 116 in the first direction X by a first pitch (not shown).

The set of gate patterns 116 is usable to manufacture a corresponding set of gates 216 (FIGS. 2A-2B) of integrated circuit 200. In some embodiments, gate patterns 116a, 116b, 116c of the set of gate patterns 116 is usable to manufacture corresponding gates 216a, 216b, 216c of the set of gates 216 (FIGS. 2A-2B) of integrated circuit 200.

In some embodiments, at least a portion of gate pattern 116a, 116b or 116c of the set of gate patterns 116 is usable to manufacture gates of NMOS transistors of integrated circuits 600, 1000, 1200 and 1500, and at least a portion of gate pattern 116a, 116b or 116c of the set of gate patterns 116 is usable to manufacture gates of PMOS transistors of integrated circuits 600, 1000, 1200 and 1500.

The set of gate patterns 116 are above the set of power rail patterns 102, the set of signal line patterns 103 and the set of active region patterns 104. The set of gate patterns 116 is positioned on a fourth layout level (POLY) different from the first layout level and the second layout level. In some embodiments, the fourth layout level is the same as the third layout level. In some embodiments, the fourth layout level is different from the third layout level.

Other configurations, arrangements on other layout levels or quantities of patterns in the set of gate patterns 116 are within the scope of the present disclosure.

Layout design 100 further includes one or more conductive feature patterns 112a, 112b, 112c, 112d or 112e (collectively referred to as a "set of conductive feature patterns 112") extending in the first direction X, and being located on a fifth layout level. In some embodiments, the fifth layout level is different from the first layout level, the second layout level, the third layout level and the fourth layout level. In some embodiments, the fifth layout level corresponds to a metal 0 (M0) level of one or more of layout designs 100 or 300 (FIGS. 1A-1D or 3A-3B), integrated circuit 200 or 400 (FIGS. 2A-2B or 4A-4B), or layout 500A-500B, 700, 800, 900, 1100, 1300, 1400 or 1600 (FIGS. 5A-5B, 7A-7B, 8A-8B, 9A-9B, 11A-11B, 13A-13B, 14A-14B or 16A-16B).

In some embodiments, the M0 level is above the OD level, the BPR level, the MD level and the POLY level.

The set of conductive feature patterns 112 is usable to manufacture a corresponding set of conductive structures 212 (FIGS. 2A-2B) of integrated circuit 200. Conductive feature patterns 112a, 112b, 112c, 112d, 112e are usable to manufacture corresponding conductive structures 212a, 212b, 212c, 212d, 212e (FIGS. 2A-2B and 4A-4B).

The set of conductive feature patterns 112 overlaps at least one power rail pattern of the set of power rail patterns 102. In some embodiments, the set of conductive feature patterns 112 overlaps other underlying patterns (not shown for ease of illustration) of other layout levels of layout design 100. For example, layout design does not show via patterns (e.g., via over diffusion (VD) or via over gate (VG)) located between the set of conductive feature patterns 112 and at least the set of gate patterns 116 or the set of contact patterns 106 for ease of illustration.

In some embodiments, each pattern 112a, 112b, 112c, 112d, 112e of the set of conductive feature patterns 112 overlaps a corresponding gridline 114a, 114b, 114c, 114d, 114e of a set of gridlines 114. In some embodiments, a center of each pattern 112a, 112b, 112c, 112d, 112e of the set of conductive feature patterns 112 is aligned in the first direction X with a corresponding gridline 114a, 114b, 114c, 114d, 114e of the set of gridlines 114.

At least pattern 112a, 112b, 112c, 112d or 112e of the set of conductive feature patterns 112 has a width W1 in the second direction Y. Other widths for the set of conductive feature patterns 112 are within the scope of the present disclosure. In some embodiments, at least one conductive feature pattern of the set of conductive feature patterns 112 has a width in the second direction Y different from width W1.

In some embodiments, conductive feature patterns 112a, 112b, 112c, 112d, 112e of the set of conductive feature patterns 112 correspond to 5 M0 routing tracks in layout design 100. Other numbers of M0 routing tracks are within the scope of the present disclosure. For example, in some embodiments, each of FIGS. 5A-5B, 8A-8B, 9A-9B, 13A-13B, 14A-14B and 16A-16B show a number of M0 routing tracks different from FIGS. 1A-1D.

Other configurations, arrangements on other layout levels or quantities of patterns in the set of conductive feature patterns 112 are within the scope of the present disclosure.

Other configurations, arrangements on other layout levels or quantities of patterns in layout design 100 are within the scope of the present disclosure.

In some embodiments, the set of conductive feature patterns 112 is an upper metal layer track located on the M0 level, metal 1 (M1) level, or the like of the front-side of layout design 100 or 300. In some embodiments, when compared with other approaches, the set of power rail patterns 102 and the set of signal line patterns 103 are moved from the front-side of layout design 100 or 300 to the back-side of layout design 100 or 300. In some embodiments, moving the set of power rail patterns 102 and the set of signal line patterns 103 from the front-side of layout design 100 or 300 to the back-side of layout design 100 or 300, results in layout design 100 or 300 using at least one less upper metal layer track in the set of conductive feature patterns 112, resulting in a layout design with a smaller height and smaller area compared with other approaches.

In some embodiments, since at least one upper metal layer track in the set of conductive feature patterns 112 is reduced, the width of one or more conductive feature patterns in the set of conductive feature patterns 112 is increased, yielding a layout design 100 or 300 with better current resistance (IR), electromigration (EM) and resistance capacitance (RC) metal performance compared with other approaches. In some embodiments, by utilizing the set of power rail patterns 102 or the set of signal line patterns 103 of the present disclosure, the gate density of the set of gate patterns 116 or 316 of layout design 100 or 300 is increased compared with other approaches. In some embodiments, by utilizing at least the set of power rail patterns 102 or the set of signal line patterns 103 of the present disclosure, layout design 100 or 300 offers more routing flexibility and increases routing resources compared to other approaches.

FIGS. 2A-2B are diagrams of an integrated circuit 200, in accordance with some embodiments.

FIG. 2A is a top view of integrated circuit 200, in accordance with some embodiments.

FIG. 2B is a cross-sectional view of integrated circuit 200, in accordance with some embodiments.

FIG. 2B is a cross-sectional view of integrated circuit 200 as intersected by plane A-A', in accordance with some embodiments. Components that are the same or similar to those in one or more of FIGS. 2A-2B and 4A-4B (shown below) are given the same reference numbers, and detailed description thereof is thus omitted.

Integrated circuit 200 is manufactured by layout design 100. Structural relationships including alignment, lengths and widths, as well as configurations and layers of integrated circuit 200 are similar to the structural relationships and configurations and layers of layout design 100 of FIGS. 1A-1D, and similar detailed description will not be described in at least FIGS. 2A-2B, for brevity.

Integrated circuit 200 includes at least the set of power rails 202, the set of signal lines 203, the set of active regions 204, the set of contacts 206, the set of vias 208, the set of vias 210, the set of conductive structures 212 or the set of gates 216.

The set of power rails 202 include one or more of power rails 202a or 202b. In some embodiments, the set of power rails 202 is configured to provide a first supply voltage of a voltage supply VDD or a second supply voltage of a reference voltage supply VSS to the integrated circuit, such as integrated circuit 200. In some embodiments, the first supply voltage is different from the second supply voltage.

In some embodiments, power rail 202a is configured to provide the first supply voltage of voltage supply VDD, and power rail 202b is configured to provide the second supply voltage of reference voltage supply VSS. In some embodiments, power rail 202a is configured to provide the second supply voltage of reference voltage supply VSS, and power rail 202b is configured to provide the first supply voltage of voltage supply VDD. In some embodiments, the set of power rails 202 are configured to provide power to the set of active regions 204.

The set of signal lines 203 includes at least signal line 203a. The set of signal lines 203 are configured to provide routing of signals from upper layers. For example, in some embodiments, the set of signal lines 203 are configured to provide signal routing between active regions of the set of active regions 204 or signal routing between contacts of the set of contacts 206. In some embodiments, signal line 203a is configured to electrically couple a drain or source of a PMOS or NMOS transistor and a drain or source of another PMOS or NMOS transistors. In some embodiments, the set of signal lines 203 are configured to electrically couple the set of active regions of integrated circuit 200, resulting in additional routing resources compared to other approaches. In some embodiments, the set of signal lines 203 are configured to electrically couple a set of gates 416 (FIGS. 4A-4B) of integrated circuit 400, resulting in additional routing resources compared to other approaches.

In some embodiments, the set of signal lines 203 corresponds to a set of conductive structures. In some embodiments, the set of signal lines 203 is located below at least the set of gates 216, the OD level, the M0 level and the MD level of integrated circuit 200 or 400.

The set of signal lines 203 is between the set of active regions 204. In some embodiments, a top surface of signal line 203a is below a bottom surface of at least active region 204a or 204b or at least contact 206a, 206b, 206c or 206d.

In some embodiments, the set of power rails 202 and the set of signal lines are located on the back-side 220a of a substrate 201 of integrated circuit 200 or 400. In some embodiments, the set of active regions 204 are located on a front-side 220b of the substrate 201 of integrated circuit 200 or 400. The front-side 220b of integrated circuit 200 is opposite from the back-side 220a of integrated circuit 200 or 400 in the second direction Y. In some embodiments, by positioning the set of power rails 202 or set of signal lines 203 on the back-side 220a of integrated circuit 200, results in integrated circuit 200 or 400 occupying less area than other approaches.

Other configurations, arrangements on other layout levels or quantities of structures in the set of power rails 202 or set of signal lines 203 are within the scope of the present disclosure.

The set of active regions 204 include one or more of active regions 204a or 204b in substrate 201. In some embodiments, the set of active regions 204 corresponds to planar structures (not shown) of planar transistors. In some embodiments, the set of active regions 204 corresponds to fin structures (not shown) of finFETs. In some embodiments, the set of active regions 204 corresponds to nanosheet structures (not shown) of nanosheet transistors. In some embodiments, the set of active regions 204 corresponds to nanowire structures (not shown) of nanowire transistors. In some embodiments, the set of active regions 204 include drain regions and source regions grown by an epitaxial growth process. In some embodiments, the set of active regions 204 include drain regions and source regions that are grown with an epitaxial material at the corresponding drain regions and source regions.

In some embodiments, one of active region 204a or 204b of the set of active regions 204 corresponds to source and drain regions of NMOS transistors of integrated circuits 200, 400, 600, 1000, 1200 and 1500, and the other of active region 204b or 204a of the set of active regions 204 corresponds to source and drain regions of PMOS transistors of integrated circuits 200, 400, 600, 1000, 1200 and 1500.

In some embodiments, the set of active regions 204 is above the set of power rails 202 and the set of signal lines 203. Other configurations, arrangements on other layout levels or quantities of structures in the set of active regions 204 are within the scope of the present disclosure.

The set of contacts 206 includes one or more of contacts 206a, 206b, 206c or 206d. In some embodiments, at least one of contact 206a, 206b, 206c or 206d of the set of contacts 206 corresponds to source and drain terminals of NMOS transistors of integrated circuits 200, 600, 1000, 1200 and 1500, and at least the other of contact 206a, 206b, 206c or 206d of the set of contacts 206 corresponds to source and drain terminals of PMOS transistors of integrated circuits 200, 600, 1000, 1200 and 1500.

In some embodiments, the set of contacts 206 is above the set of active regions 204, the set of power rails 202 and the set of signal lines 203. In some embodiments, the set of contacts 206 encapsulates the set of active regions 204. In some embodiments, a first portion of the set of contacts 206 is above the set of active regions 204, and a second portion of the set of contacts 206 is below the set of active regions 204.

Other configurations, arrangements on other layout levels or quantities of contacts in the set of contacts 206 are within the scope of the present disclosure.

The set of vias 208 includes one or more of vias 208a or 208b. In some embodiments, the set of vias 208 are between the set of power rails 202 and the set of active regions 206. In some embodiments, the set of vias 208 are between the set of power rails 202 and the set of contacts 206.

Via 208a is between power rail 202a and active region 204a, and thereby provides an electrical connection between power rail 202a and active region 204a. In some embodiments, via 208a is between power rail 202a and contact 206b, and thereby provides an electrical connection between power rail 202a and at least contact 206b or active region 204a.

Via 208b is between power rail 202b and active region 204b, and thereby provides an electrical connection between power rail 202b and active region 204b. In some embodiments, via 208b is between power rail 202b and contact 206c, and thereby provides an electrical connection between power rail 202b and at least contact 206c or active region 204b.

In some embodiments, at least one via of the set of vias 208 is not included in integrated circuit 200. Other configurations, arrangements on other layout levels or quantities of vias in the set of vias 208 are within the scope of the present disclosure.

The set of vias 210 includes one or more of vias 210a or 210b. The set of vias 210 are between the set of signal lines 203 and the set of contacts 206.

Via 210a is between signal line 203a and contact 206a, and thereby provides an electrical connection between signal line 203a and contact 206a. Via 210b is between signal line 203a and contact 206d, and thereby provides an electrical connection between signal line 203a and contact 206d.

Active region 204a is electrically coupled to contact 206a. Contact 206a is electrically coupled to signal line 203a by via 210a. Signal line 203a is electrically coupled to contact 206d by via 210b. Contact 206d is electrically coupled to active region 204b.

In some embodiments, at least one via of the set of vias 210 is not included in integrated circuit 200. Other configurations, arrangements on other layout levels or quantities of vias in the set of vias 210 are within the scope of the present disclosure.

Other electrical connections between one or more of the set of signal lines 203, the set of active regions 204, the set of contacts 206 and the set of vias 210 are within the scope of the present disclosure.

The set of gates 216 includes one or more of gates 216a, 216b or 216c. In some embodiments, at least a portion of gate 216a, 216b or 216c of the set of gates corresponds to gates of NMOS transistors of integrated circuits 200, 600, 1000, 1200 and 1500, and at least a portion of gate 216a, 216b or 216c of the set of gates 216 corresponds to gates of PMOS transistors of integrated circuits 200, 600, 1000, 1200 and 1500. The set of gates 216 are above the set of power rails 202, the set of signal lines 203 and the set of active regions 204.

Other configurations, arrangements on other layout levels or quantities of gates in the set of gates 216 are within the scope of the present disclosure.

The set of conductive features 212 includes one or more of conductive features 212a, 212b, 212c, 212d or 212e.

The set of conductive features 212 overlap at least one power rail of the set of power rails 202 or the set of signal lines 203. In some embodiments, the set of conductive features 212 overlaps other underlying features (not shown for ease of illustration) of other layout levels of integrated circuit 200 or 400. For example, integrated circuit 200 does not show vias (e.g., VD or VG) located between the set of conductive features 212 and at least the set of gates 216 or the set of contacts 206 for ease of illustration.

At least conductive feature 212a, 212b, 212c, 212d or 212e of the set of conductive features 212 has a width W1' in the second direction Y. Other widths for the set of conductive features 212 is within the scope of the present disclosure. In some embodiments, at least one conductive feature of the set of conductive features 212 has a width in the second direction Y different from width W1'.

Other configurations, arrangements on other layout levels or quantities of conductive features in the set of conductive features 212 are within the scope of the present disclosure.

In some embodiments, at least one power rail of the set of power rails 202, at least one signal line of the set of signal lines 203, at least one contact of the set of contacts 206 or 406, at least one via of the set of vias 208, at least one via of the set of vias 210 or 410 or at least one conductive structure of the set of conductive structures 212, 512' or 514' includes one or more layers of a conductive material, a metal, a metal compound or a doped semiconductor. In some embodiments, the conductive material includes Tungsten, Cobalt, Ruthenium, Copper, or the like or combinations thereof. In some embodiments, a metal includes at least Cu (Copper), Co, W, Ru, Al, or the like. In some embodiments, a metal compound includes at least AlCu, W—TiN, TiSix, NiSix, TiN, TaN, or the like. In some embodiments, a doped semiconductor includes at least doped silicon, or the like.

In some embodiments, the set of conductive features 212 is an upper metal layer track located on the M0 level, M1 level, or the like of the front-side of integrated circuit 200 or 400. In some embodiments, when compared with other approaches, the set of power rails 202 and the set of signal lines 203 are moved from the front-side of integrated circuit 200 to the back-side of integrated circuit 200. In some embodiments, moving the set of power rails 202 and the set of signal lines 203 from the front-side of integrated circuit 200 to the back-side of integrated circuit 200, results in integrated circuit 200 or 400 using at least one less upper metal layer track in the set of conductive features 212, resulting in an integrated circuit (e.g., integrated circuit 200 or 400) with a smaller height and smaller area compared with other approaches.

In some embodiments, since at least one upper metal layer track in the set of conductive features 212 is reduced, the width of one or more conductive features in the set of conductive features 212 is increased, yielding an integrated circuit 200 or 400 with better current resistance (IR), electromigration (EM) and resistance capacitance (RC) metal performance compared with other approaches. In some embodiments, by utilizing the set of power rails 202 or the set of signal lines 203 of the present disclosure, the gate density of the set of gates 216 or 416 of integrated circuit 200 or 400 is increased compared with other approaches. In some embodiments, by utilizing at least the set of power rails 202 or the set of signal lines 203 of the present disclosure, integrated circuit 200 or 400 offers more routing flexibility and increases routing resources compared to other approaches.

FIGS. 3A-3B are diagrams of a layout design 300 of an integrated circuit, in accordance with some embodiments. Layout design 300 is a layout diagram of integrated circuit 400 of FIGS. 4A-4B.

FIG. 3A is a diagram of a corresponding portion 300A of layout design 300 of FIG. 3B, simplified for ease of illustration. FIG. 3B is a diagram of layout design 300, and includes portions 100A (FIG. 1A), 300A and 100C (FIG. 1C), simplified for ease of illustration. For ease of illustration, some of the labeled elements of FIGS. 1A & 1C are not labelled in FIGS. 3A-3B. In some embodiments, layout design 300 includes additional elements not shown in FIGS. 3A-3B.

Portion 300A is a variation of portion 100B of FIG. 1B, and similar detailed description is therefore omitted. Portion 300A includes one or more features of layout design 300 of FIG. 3B of the OD level, POLY level, the MD level, the VBP level and the VBS level of layout design 300.

Figure 4A:
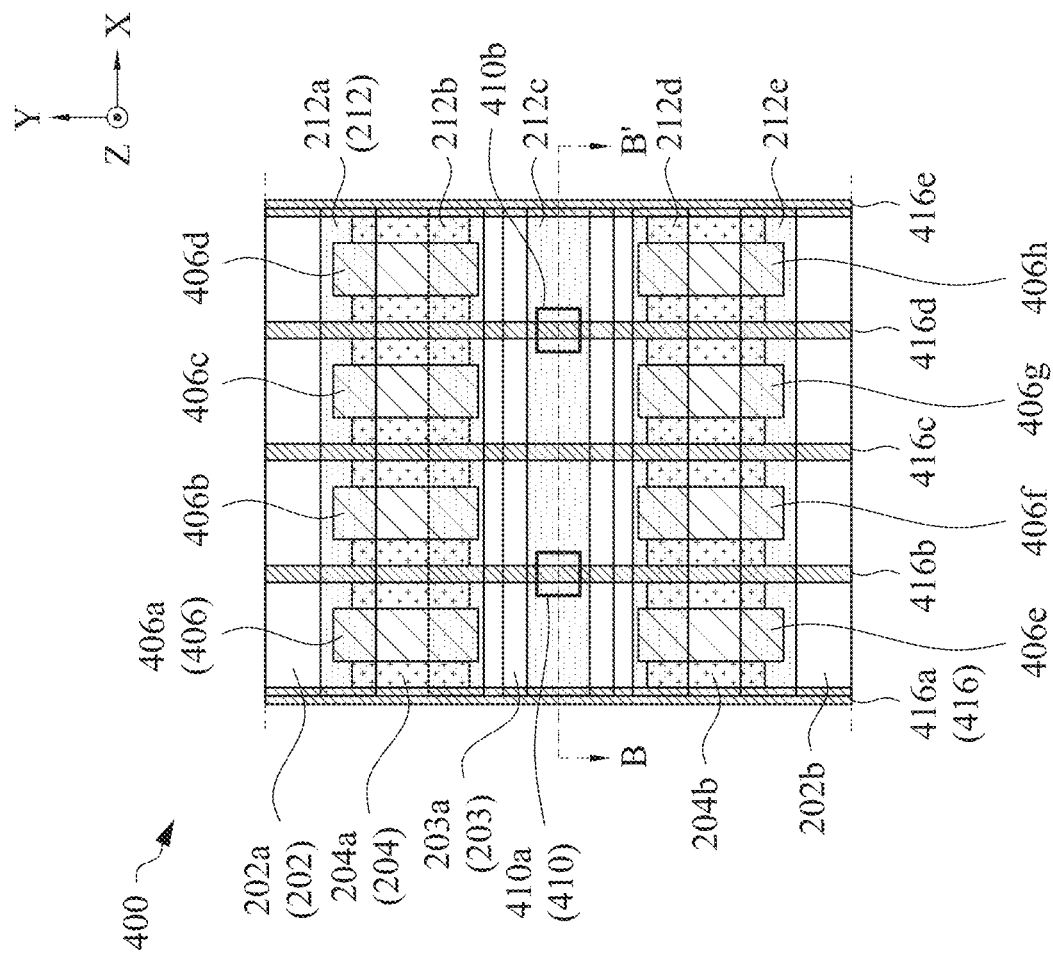
FIGS. 4A-4B are diagrams of an integrated circuit, in accordance with some embodiments.
Figure 4B:
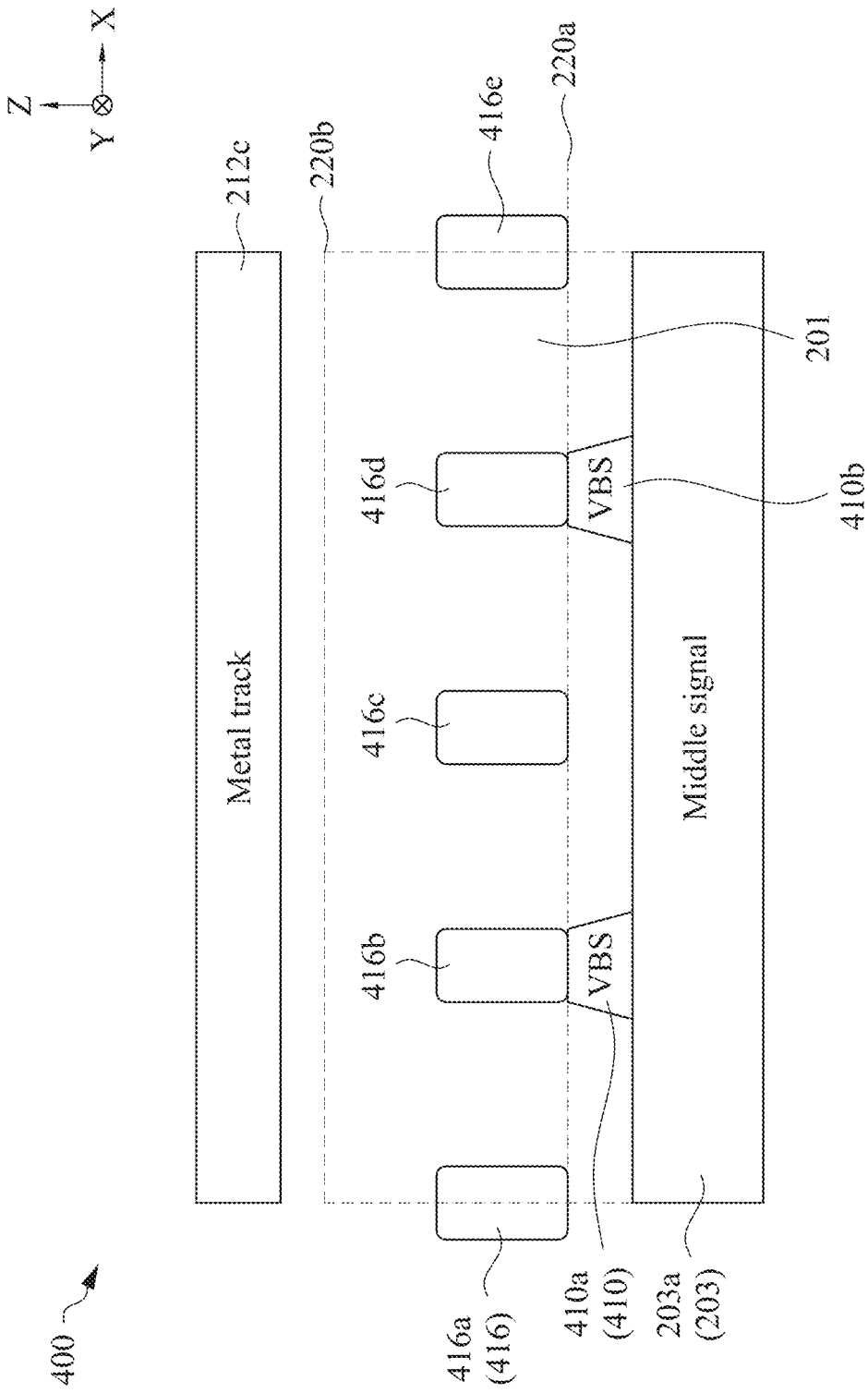

Layout design 300 is usable to manufacture integrated circuit 400 of FIGS. 4A-4B.

Layout design 300 is a variation of layout design 100 (FIGS. 1A-1D). For example, layout design 300 illustrates an example of where the VBS level (e.g., set of signal line patterns 203) is used for extra routing resources to electrically couple at least a pair of gate patterns 316.

In comparison with layout design 100 of FIGS. 1A-1D, a set of contact patterns 306 of layout design 300 replaces the set of contact patterns 106, a set of via patterns 310 replaces the set of via patterns 110, and a set of gate patterns 316 of layout design 300 replaces the set of gate patterns 116, and similar detailed description is therefore omitted.

Layout design 100 includes set of power rail patterns 102, set of signal line patterns 103, set of active region patterns 104, set of contact patterns 306, set of via patterns 108 (not shown in FIGS. 3A-3B), set of via patterns 310, the set of conductive feature patterns 112, and set of gate patterns 316.

The set of contact patterns 306 includes one or more contact patterns 306a, 306b, 306c, 306d, 306e or 306f. At least one of contact patterns 306a, 306b, 306c, 306d, 306e or 306f is similar to at least one of contact patterns 106a, 106b, 106c or 106d, and similar detailed description is therefore omitted.

The set of contact patterns 306 is usable to manufacture a corresponding set of contacts 406 (FIGS. 4A-4B) of integrated circuit 400. In some embodiments, contact pattern 306a, 306b, 306c, 306d, 306e or 306f of the set of contact patterns 306 is usable to manufacture corresponding contact 406a, 406b, 406c, 406d, 406e or 406f of the set of contact patterns 406.

In some embodiments, at least one of contact pattern 306a, 306b, 306c or 306d of the set of contact patterns 306 is usable to manufacture source and drain terminals of one of NMOS or PMOS transistors of integrated circuits 600, 1000, 1200 and 1500, and at least one of contact pattern 306e, 306f, 306g or 306h of the set of contact patterns 306 is usable to manufacture source and drain terminals of the other of PMOS or NMOS transistors of integrated circuits 600, 1000, 1200 and 1500.

In some embodiments, the set of contact patterns 306 overlap the set of active region patterns 104. In some embodiments, at least contact pattern 306a, 306b, 306c or 306d is over active region pattern 104a. In some embodiments, at least contact pattern 306e, 306f, 306g or 306h is over active region pattern 104b.

Other configurations, arrangements on other layout levels or quantities of patterns in the set of contact patterns 306 are within the scope of the present disclosure.

The set of via patterns 310 includes one or more via patterns 310a or 310b. At least one of via patterns 310a or 310b is similar to at least one of via patterns 110a or 110b, and similar detailed description is therefore omitted.

The set of via patterns 310 is usable to manufacture a corresponding set of vias 410 (FIGS. 4A-4B). In some embodiments, via patterns 310a, 310b of the set of via patterns 310 are usable to manufacture corresponding vias 410a, 410b of the set of vias 410 (FIGS. 4A-4B) of integrated circuit 400.

In some embodiments, the set of via patterns 310 are between the set of signal line patterns 103 and the set of gate patterns 316. Via pattern 310a is between signal line pattern 103a and gate pattern 316b. In some embodiments, via pattern 310a is located where gate pattern 316b overlaps signal line pattern 103a. Via pattern 310b is between signal line pattern 103a and gate pattern 316d. In some embodiments, via pattern 310b is located where gate pattern 316d overlaps signal line pattern 103a. In some embodiments, at least one via pattern of the set of via patterns 310 is not included in layout design 300.

Other configurations, arrangements on other layout levels or quantities of patterns in the set of via patterns 310 are within the scope of the present disclosure.

The set of gate patterns 316 includes one or more gate patterns 316a, 316b, 316c, 316d or 316e. At least one of gate patterns 316a, 316b, 316c, 316d or 316e is similar to at least one of gate patterns 116a, 116b or 116c, and similar detailed description is therefore omitted.

The set of gate patterns 316 is usable to manufacture a corresponding set of gates 416 (FIGS. 4A-4B) of integrated circuit 400. In some embodiments, gate patterns 316a, 316b, 316c, 316d, 316e of the set of gate patterns 316 is usable to manufacture corresponding gates 416a, 416b, 416c, 416d, 416e of the set of gates 416 (FIGS. 4A-4B) of integrated circuit 400.

In some embodiments, at least a portion of gate pattern 316a, 316b, 316c, 316d or 316e of the set of gate patterns 316 is usable to manufacture gates of NMOS transistors of integrated circuits 600, 1000, 1200 and 1500, and at least a portion of gate pattern 316a, 316b, 316c, 316d or 316e of the set of gate patterns 316 is usable to manufacture gates of PMOS transistors of integrated circuits 600, 1000, 1200 and 1500.

Gate pattern 316b overlaps via pattern 310a and signal line pattern 103a. Gate pattern 316d overlaps via pattern 310b and signal line pattern 103a.

Other configurations, arrangements on other layout levels or quantities of patterns in the set of gate patterns 316 are within the scope of the present disclosure.

Other overlap positions or numbers of overlap positions between one or more of the set of gate patterns 316, the set of via patterns 310 and the set of signal line patterns 103 are within the scope of the present disclosure.

FIGS. 4A-4B are diagrams of an integrated circuit 400, in accordance with some embodiments.

FIG. 4A is a top view of integrated circuit 400, in accordance with some embodiments. FIG. 4B is a cross-sectional view of integrated circuit 400, in accordance with some embodiments. FIG. 4B is a cross-sectional view of integrated circuit 400 as intersected by plane B-B', in accordance with some embodiments.

Integrated circuit 400 is manufactured by layout design 400. Structural relationships including alignment, lengths and widths, as well as configurations and layers of integrated circuit 400 are similar to the structural relationships and configurations and layers of layout design 300 of FIGS. 3A-3B, and similar detailed description will not be described in at least FIGS. 4A-4B, for brevity.

Integrated circuit 400 is a variation of integrated circuit 200 (FIGS. 2A-2B). For example, integrated circuit 400 illustrates an example of where the VBS level (e.g., set of signal lines 203) is used for extra routing resources to electrically couple at least a pair of gates 416.

In comparison with integrated circuit 400 of FIGS. 3A-3B, a set of contacts 406 of integrated circuit 400 replaces the set of contacts 206, a set of vias 410 of integrated circuit 400 replaces the set of vias 210, and a set of gates 416 of integrated circuit 400 replaces the set of gates 216, and similar detailed description is therefore omitted.

Integrated circuit 400 includes at least the set of power rails 202, the set of signal lines 203, the set of active regions 204, the set of contacts 406, the set of vias 208 (not shown in FIGS. 4A-4B), the set of vias 410, the set of conductive structures 212 or the set of gates 416.

The set of contacts 406 includes one or more contacts 406a, 406b, 406c, 406d, 406e or 406f. At least one of contacts 406a, 406b, 406c, 406d, 406e or 406f is similar to at least one of contacts 206a, 206b, 206c or 206d, and similar detailed description is therefore omitted.

In some embodiments, at least one of contact 406a, 406b, 406c or 406d of the set of contacts 406 corresponds to source and drain terminals of one of NMOS or PMOS transistors of integrated circuits 400, 600, 1000, 1200 and 1500, and at least one of contact 406e, 406f, 406g or 406h of the set of contacts 406 corresponds to source and drain terminals of the other of PMOS or NMOS transistors of integrated circuits 400, 600, 1000, 1200 and 1500.

In some embodiments, at least contact 406a, 406b, 406c or 406d is over active region 104a. In some embodiments, at least contact 406e, 406f, 406g or 406h is over active region 104b.

Other configurations, arrangements on other layout levels or quantities of contacts in the set of contacts 406 are within the scope of the present disclosure.

The set of vias 410 includes one or more vias 410a or 410b. At least one of vias 410a or 410b is similar to at least one of vias 210a or 210b, and similar detailed description is therefore omitted.

In some embodiments, the set of vias 410 are between the set of signal lines 203 and the set of gates 416. Via 410a is between signal line 203a and gate 416b, and thereby provides an electrical connection between signal line 203a and gate 416b. In some embodiments, via 410a is located where gate 416b overlaps signal line 203a. Via 410b is between signal line 203a and gate 416d, and thereby provides an electrical connection between signal line 203a and gate 416d. In some embodiments, via 410b is located where gate 416d overlaps signal line 203a. In some embodiments, at least one via of the set of vias 410 is not included in integrated circuit 400.

Other configurations, arrangements on other layout levels or quantities of vias in the set of vias 410 are within the scope of the present disclosure.

The set of gates 416 includes one or more gates 416a, 416b, 416c, 416d or 416e. At least one of gate 416a, 416b, 416c, 416d or 416e is similar to at least one of gates 216a, 216b or 216c, and similar detailed description is therefore omitted.

In some embodiments, at least a portion of gate 416a, 416b, 416c, 416d or 416e of the set of gates 416 corresponds to gates of NMOS transistors of integrated circuits 400, 600, 1000, 1200 and 1500, and at least a portion of gate 416a, 416b, 416c, 416d or 416e of the set of gates 416 corresponds to gates of PMOS transistors of integrated circuits 400, 600, 1000, 1200 and 1500.

Gate 416b overlaps via 410a and signal line 203a. Gate 416d overlaps via 410b and signal line 203a. Gate 416b is electrically coupled to signal line 203a by via 410a. Signal line 203a is electrically coupled to gate 416d by via 410b.

Signal line 403a electrically couples at least a first gate region (e.g., gate 416b) to at least a second gate region (e.g., gate 416d) of integrated circuit 400, thereby using at least one less upper metal layer track in the set of conductive features 212, resulting in integrated circuit 400 with a smaller height and smaller area compared with other approaches.

In some embodiments, since at least one upper metal layer track in the set of conductive features 212 is reduced, the width of one or more conductive features in the set of conductive features 212 is increased, yielding integrated circuit 400 with better current resistance (IR), electromigration (EM) and resistance capacitance (RC) metal performance compared with other approaches. In some embodiments, by utilizing the set of power rails 202 or the set of signal lines 203 of the present disclosure, the gate density of the set of gates 416 of integrated circuit 400 is increased compared with other approaches. In some embodiments, by utilizing at least the set of power rails 202 or the set of signal lines 203 of the present disclosure, integrated circuit 400 offers more routing flexibility and increases routing resources compared to other approaches.

Other configurations, arrangements on other layout levels or quantities of gates in the set of gates 416 are within the scope of the present disclosure.

Other overlap positions or numbers of overlap positions between one or more of the set of gates 416, the set of vias 410 and the set of signal lines 203 are within the scope of the present disclosure.

Figures 5A, 5B, 5C, 5D:
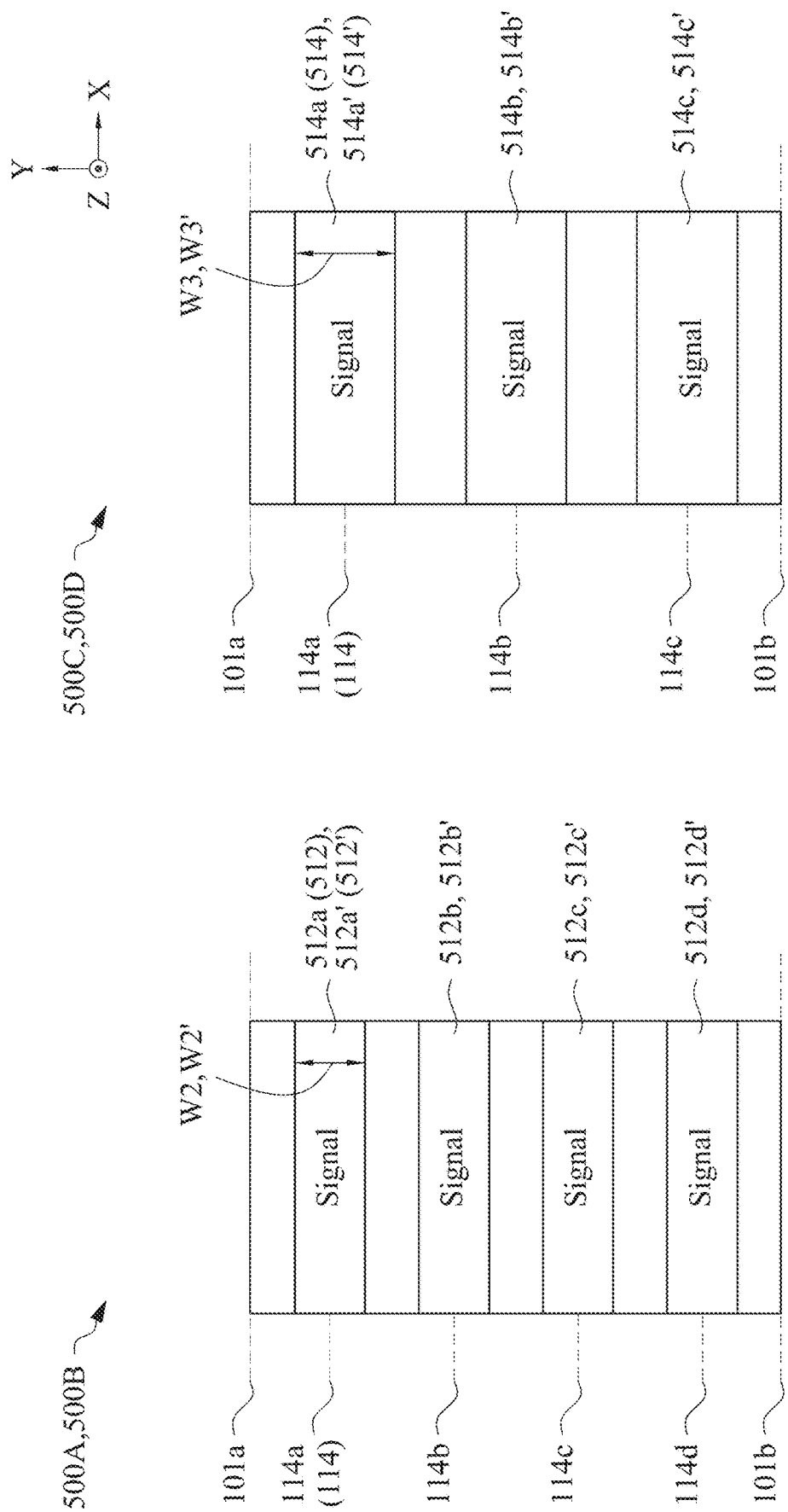
FIG. 5A is a diagram of a layout design, in accordance with various embodiments of the present disclosure.
FIG. 5B is a top view of integrated circuit, in accordance with some embodiments.
FIG. 5C is a diagram of a layout design, in accordance with various embodiments of the present disclosure.
FIG. 5D is a top view of integrated circuit, in accordance with some embodiments.

FIG. 5A is a diagram of a layout design 500A, in accordance with various embodiments of the present disclosure. FIG. 5B is a top view of integrated circuit 500B, in accordance with some embodiments.

Layout design 500A is a layout diagram of integrated circuit 500B.

Layout design 500A is a variation of portion 100C of FIGS. 1C-1D and FIG. 3B, and integrated circuit 500B is a variation of integrated circuit 200 (FIG. 2A). For example, layout design 500A and integrated circuit 500B illustrate an example of where the M0 routing tracks have 4 routing tracks.

In comparison with portion 100C of layout design 100 of FIG. 1C, a set of conductive feature patterns 512 of layout design 500A replaces the set of conductive feature patterns 112, and similar detailed description is therefore omitted. In comparison with integrated circuit 200 of FIG. 2A, a set of conductive structures 512' of integrated circuit 500B replaces the set of conductive structures 212, and similar detailed description is therefore omitted.

The set of conductive feature patterns 512 includes conductive feature patterns 512a, 512b, 512c, 512d. The set of conductive feature patterns 512 is usable to manufacture a corresponding set of conductive structures 512' (FIG. 5B) of integrated circuit 500B. The set of conductive structures 512' includes conductive structures 512a', 512b', 512c', 512d'. Conductive feature patterns 512a, 512b, 512c, 512d are usable to manufacture corresponding conductive structures 512a', 512b', 512c', 512d' (FIG. 5B).

In some embodiments, conductive feature patterns 512a, 512b, 512c, 512d correspond to 4 M0 routing tracks in layout design 500A. In some embodiments, conductive structures 512a', 512b', 512c', 512d' correspond to 4 M0 routing tracks in integrated circuit 500B.

At least pattern 512a, 512b, 512c or 512d of the set of conductive feature patterns 512 has a width W2 in the second direction Y. At least structure 512a', 512b', 512c' or 512d' of the set of conductive structures 512' has a width W2' in the second direction Y. In some embodiments, the width W2 or W2' is greater than corresponding width W1 or W1'.

Other widths, configurations, arrangements on other layout levels or quantities of patterns or structures in the set of conductive feature patterns 512 or set of conductive structures 512' are within the scope of the present disclosure.

FIG. 5C is a diagram of a layout design 500C, in accordance with various embodiments of the present disclosure. FIG. 5D is a top view of integrated circuit 500D, in accordance with some embodiments.

Layout design 500C is a layout diagram of integrated circuit 500D.

Layout design 500C is a variation of layout design 500A or portion 100C of FIGS. 1C-1D and FIG. 3B, and integrated circuit 500D is a variation of integrated circuit 500B or integrated circuit 200 (FIG. 2A). For example, layout design 500C and integrated circuit 500D illustrate an example of where the M0 routing tracks have 3 routing tracks.

In comparison with portion 100C of layout design 100 of FIG. 1C, a set of conductive feature patterns 514 of layout design 500C replaces the set of conductive feature patterns 112, and similar detailed description is therefore omitted. In comparison with integrated circuit 200 of FIG. 2A, a set of conductive structures 514' of integrated circuit 500D replaces the set of conductive structures 212, and similar detailed description is therefore omitted.

The set of conductive feature patterns 514 includes conductive feature patterns 514a, 514b, 514c. The set of conductive feature patterns 514 is usable to manufacture a corresponding set of conductive structures 514' (FIG. 5D) of integrated circuit 500D. The set of conductive structures 514' includes conductive structures 514a', 514b', 514c'. Conductive feature patterns 514a, 514b, 514c are usable to manufacture corresponding conductive structures 514a', 514b', 514c' (FIG. 5D).

In some embodiments, conductive feature patterns 514a, 514b, 514c correspond to 3 M0 routing tracks in layout design 500C. In some embodiments, conductive structures 514a', 514b', 514c' correspond to 3 M0 routing tracks in integrated circuit 500D.

At least pattern 514a, 514b or 514c of the set of conductive feature patterns 514 has a width W3 in the second direction Y. At least structure 514a', 514b' or 514c' of the set of conductive structures 514' has a width W3' in the second direction Y. In some embodiments, the width W3 or W3' is greater than corresponding width W1 or W1' or corresponding width W2 or W2'.

Other widths, configurations, arrangements on other layout levels or quantities of patterns or structures in the set of conductive feature patterns 514 or set of conductive structures 514' are within the scope of the present disclosure.

In some embodiments, since at least one upper metal layer track in the set of conductive features 212 is reduced, the width of one or more conductive features in the set of conductive features 212 is increased, yielding layout design 500A or 500C or integrated circuit 500B or 500D with better IR, EM and RC metal performance compared with other approaches.

Figure 6:
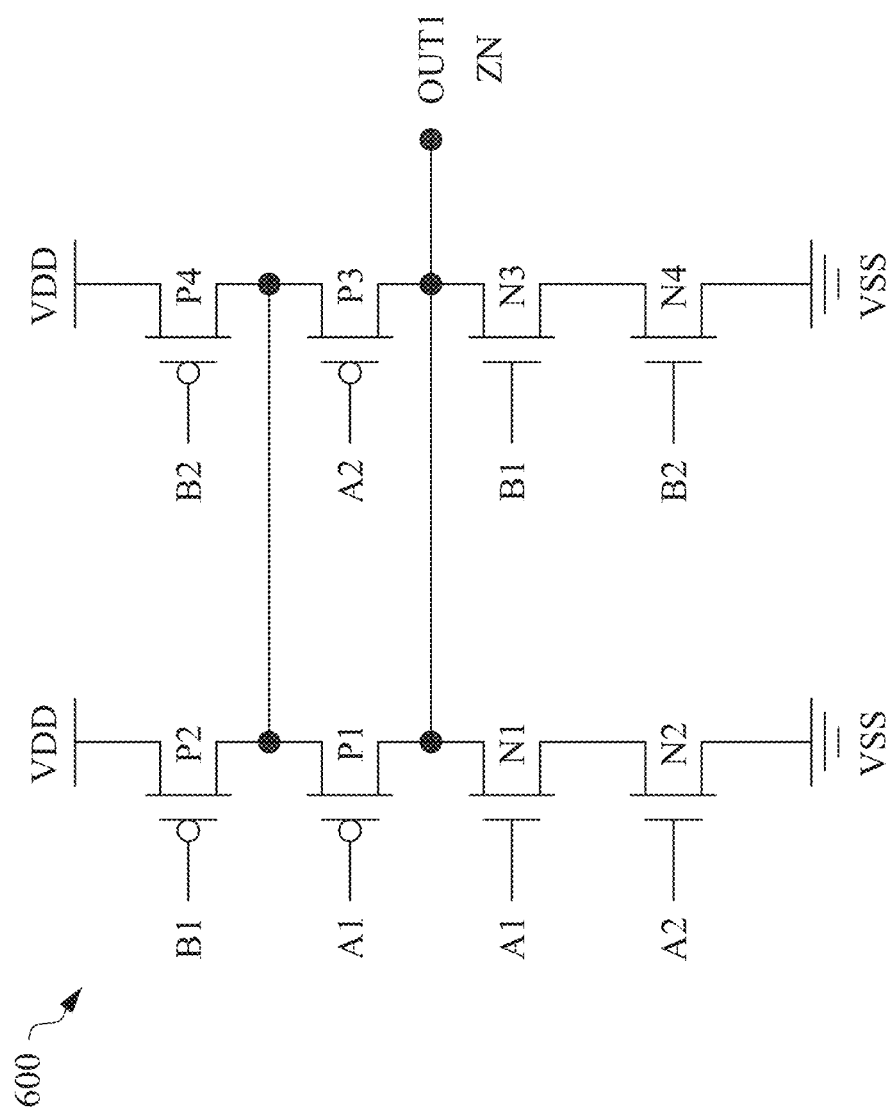
FIG. 6 is a circuit diagram of an integrated circuit, in accordance with some embodiments.

FIG. 6 is a circuit diagram of an integrated circuit 600, in accordance with some embodiments. In some embodiments, integrated circuit 600 is a 2-2 AND OR INVERT (AOI) circuit. A 2-2 AOI circuit is used for illustration, other types of circuits including other types of AOI circuits are within the scope of the present disclosure.

Integrated circuit 600 includes P-type metal oxide semiconductor (PMOS) transistors P1, P2, P3 and P4 and N-type metal oxide semiconductor (NMOS) transistors N1, N2, N3 and N4.

A gate terminal of PMOS transistor P1 is configured as an input node (not labelled) configured to receive an input signal A1. A gate terminal of NMOS transistor N1 is configured as an input node (not labelled) configured to receive input signal A1. In some embodiments, the gate terminal of PMOS transistor P1 is coupled to the gate terminal of NMOS transistor N1.

A gate terminal of PMOS transistor P2 is configured as an input node (not labelled) configured to receive an input signal B1. A gate terminal of NMOS transistor N3 is configured as an input node (not labelled) configured to receive input signal B1. In some embodiments, the gate terminal of PMOS transistor P2 is coupled to the gate terminal of NMOS transistor N3.

A gate terminal of PMOS transistor P3 is configured as an input node (not labelled) configured to receive an input signal A2. A gate terminal of NMOS transistor N2 is configured as an input node (not labelled) configured to receive input signal A2. In some embodiments, the gate terminal of PMOS transistor P3 is coupled to the gate terminal of NMOS transistor N2.

A gate terminal of PMOS transistor P4 is configured as an input node (not labelled) configured to receive an input signal B2. A gate terminal of NMOS transistor N4 is configured as an input node (not labelled) configured to receive input signal B2. In some embodiments, the gate terminal of PMOS transistor P4 is coupled to the gate terminal of NMOS transistor N4. In some embodiments, at least input signal A1, A2, B1 or B2 is a logically low signal or a logically high signal.

A source terminal of PMOS transistor P2 and a source terminal of PMOS transistor P4 are coupled to the voltage supply VDD. In some embodiments, the source terminal of PMOS transistor P2 and the source terminal of PMOS transistor P4 are coupled together.

A drain terminal of PMOS transistor P2, a source terminal of PMOS transistor P1, a drain terminal of PMOS transistor P4, and a source terminal of PMOS transistor P3 are coupled to each other.

A drain terminal of PMOS transistor P1, a drain terminal of PMOS transistor P3, a drain terminal of NMOS transistor N1 and a drain terminal of NMOS transistor N3 are coupled to each other, and are configured as an output node OUT1.

A source terminal of NMOS transistor N1 and a drain terminal of NMOS transistor N2 are coupled to each other. A source terminal of NMOS transistor N3 and a drain terminal of NMOS transistor N4 are coupled to each other.

A source terminal of NMOS transistor N2 and a source terminal of NMOS transistor N4 are each coupled to a reference voltage supply VSS. In some embodiments, the source terminal of NMOS transistor N2 and the source terminal of NMOS transistor N4 are coupled together.

Other circuits, other types of transistors, and/or quantities of transistors are within the scope of various embodiments. For example, in some embodiments, integrated circuit 600 includes other types of AOI logic circuits, such as a 2-1 AOI logic circuit. Other values of at least input signal A1, A2, B1 or B2 are within the scope of various embodiments.

FIGS. 7A-7B are diagrams of an integrated circuit 700, in accordance with some embodiments.

FIGS. 7A-7B are top views of corresponding portions 700A-700B of integrated circuit 700, simplified for ease of illustration. Integrated circuit 700 is an embodiment of integrated circuit 600 with 5 M0 routing tracks (e.g., set of conductive features 712).

Portion 700A includes one or more features of integrated circuit 700 of the VBP level, the OD level, POLY level, the MD level or the M0 level of integrated circuit 700. Portion 700B includes one or more features of integrated circuit 700 of the BP level, the BS level, the VBP level, the VBS level, the OD level, POLY level or the MD level of integrated circuit 700.

For ease of illustration, some of the elements of FIGS. 7A-7B are not labelled in FIGS. 7A-7B. In some embodiments, integrated circuit 700 includes additional elements not shown in FIGS. 7A-7B.

Integrated circuit 700 is manufactured by a corresponding layout design similar to integrated circuit 700. For brevity FIGS. 7A-7B are described as integrated circuit 700, but in some embodiments, FIGS. 7A-7B also correspond to layout designs similar to layout designs 100, 400, 500A and 500C, structural elements of integrated circuit 700 also correspond to layout patterns, and structural relationships including alignment, lengths and widths, as well as configurations and layers of a corresponding layout design of integrated circuit 700 are similar to the structural relationships and configurations and layers of integrated circuit 700, and similar detailed description will not be described for brevity.

Integrated circuit 700 is an embodiment of integrated circuit 200 (FIGS. 2A-2B) or integrated circuit 600. In comparison with integrated circuit 200 of FIGS. 2A-2B, a set of power rails 702 of integrated circuit 700 replaces the set of power rails 202, a set of signal lines 703 replaces the set of signal lines 203, a set of contacts 706 replaces the set of contacts 206, a set of vias 708 of replaces the set of vias 208, a set of vias 710 replaces the set of vias 210, and a set of conductive features 712 replaces the set of conductive features 212, and similar detailed description is therefore omitted.

The set of power rails 702 include one or more of power rails 702a or 702b. Power rail 702a is configured to provide the first supply voltage of voltage supply VDD, and power rail 702b is configured to provide the second supply voltage of reference voltage supply VSS. In some embodiments, power rail 702a is configured to provide the second supply voltage of reference voltage supply VSS, and power rail 702b is configured to provide the first supply voltage of voltage supply VDD.

The set of signal lines 703 include at least signal line 703a. The set of signal lines 703 are configured to provide routing of signals. In some embodiments, the routing of signals provided by the set of signal lines 703 corresponds to signal routing that is performed by upper layers in other approaches. Signal line 703a is configured to electrically couple drains of NMOS transistors N1 and N3 and the drains of PMOS transistors P1 and P3, resulting in additional routing resources compared to other approaches.

Other configurations, arrangements on other layout levels or quantities of structures in the set of power rails 702 or set of signal lines 703 are within the scope of the present disclosure. In some embodiments, set of signal lines 703 electrically couple source or drain features of a transistor in FIGS. 7B, 8B and 9B with gate features of another transistor in FIGS. 7B, 8B and 9B. In some embodiments, set of signal lines 703 electrically couple gate features of a transistor in FIGS. 7B, 8B and 9B with gate features of another transistor in FIGS. 7B, 8B and 9B.

The set of contacts 706 includes one or more contacts 706a, 706b, 706c, 706d or 706e. At least one of contacts 706a, 706b, 706c, 706d or 706e is similar to at least one of contacts 206a, 206b, 206c or 206d, and similar detailed description is therefore omitted.

In some embodiments, contact 706a corresponds to source terminals of PMOS transistors P2 and P4. In some embodiments, contact 706d corresponds to drain terminals of PMOS transistors P1 and P3.

In some embodiments, contact 706b corresponds to the source terminal of NMOS transistor N4. In some embodiments, contact 706e corresponds to the source terminal of NMOS transistor N2. In some embodiments, contact 706c corresponds to drain terminals of NMOS transistors N1 and N3.

Other configurations, arrangements on other layout levels or quantities of contacts in the set of contacts 706 are within the scope of the present disclosure.

The set of vias 708 includes one or more vias 708a, 708b or 708c. At least one of vias 708a, 708b or 708c is similar to at least one of vias 208a or 208b, and similar detailed description is therefore omitted.

Via 708a electrically couples power rail 702a and contact 706a to each other, thereby coupling the source terminals of PMOS transistors P2 and P4 to supply voltage VDD. Via 708b electrically couples power rail 702b and contact 706b to each other, thereby coupling the source terminal of NMOS transistor N4 to reference supply voltage VSS. Via 708c electrically couples power rail 702b and contact 706e to each other, thereby coupling the source terminal of NMOS transistor N2 to reference supply voltage VSS.

Other configurations, arrangements on other layout levels or quantities of vias in the set of vias 708 are within the scope of the present disclosure.

The set of vias 710 includes one or more vias 710a or 710b. At least one of vias 710a or 710b is similar to at least one of vias 210a or 210b, and similar detailed description is therefore omitted.

Via 710a electrically couples signal line 703a and contact 706c to each other, thereby coupling the drain terminals of NMOS transistors N1 and N3 to signal line 703a. Via 710b electrically couples signal line 703a and contact 706d to each other, thereby coupling the drain terminals of PMOS transistors P1 and P3 to signal line 703a. Thus, signal line 703a and vias 710a and 710b electrically couple contacts 706c and 706d to each other, thereby coupling the drain terminals of NMOS transistors N1 and N3 and the drain terminals of PMOS transistors P1 and P3 to each other, resulting in additional routing resources on other metal layer compared to other approaches.

Other configurations, arrangements on other layout levels or quantities of vias in the set of vias 710 are within the scope of the present disclosure. Other overlap positions or numbers of overlap positions between one or more of the set of contacts 706, the set of vias 710 and the set of signal lines 703 are within the scope of the present disclosure, and therefore other electrical connections are within the scope of the present disclosure.

The set of conductive features 712 includes one or more of conductive features 712a, 712b, 712c, 712d, 712e, 712f or 712g. At least one of conductive features 712a, 712b, 712c, 712d, 712e, 712f or 712g is similar to at least one of conductive features 212a, 212b, 212c, 212d or 212e, and similar detailed description is therefore omitted. Conductive feature 712a electrically couples each of the drain terminals of PMOS transistors P2 and P4 and the source terminals of PMOS transistors P1 and P3 together.

Other configurations, arrangements on other layout levels or quantities of conductive features in the set of conductive features 712 are within the scope of the present disclosure.

Figure 8A:
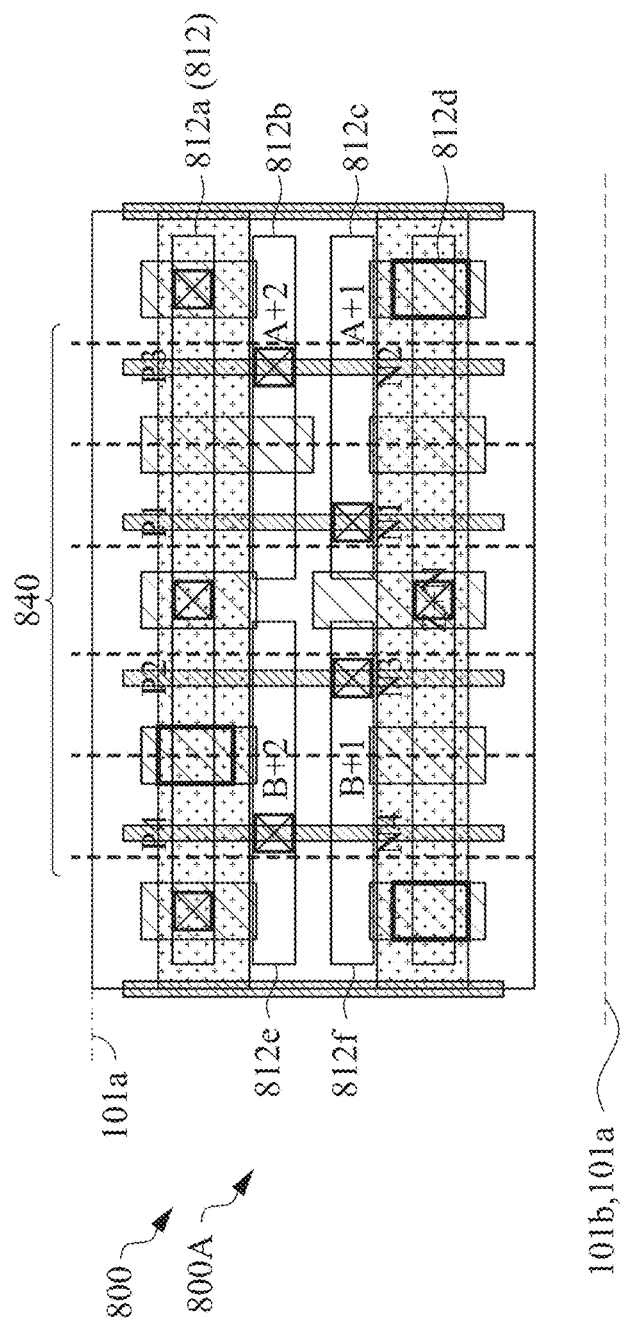
FIGS. 8A-8B are diagrams of an integrated circuit, in accordance with some embodiments.
Figure 8B:
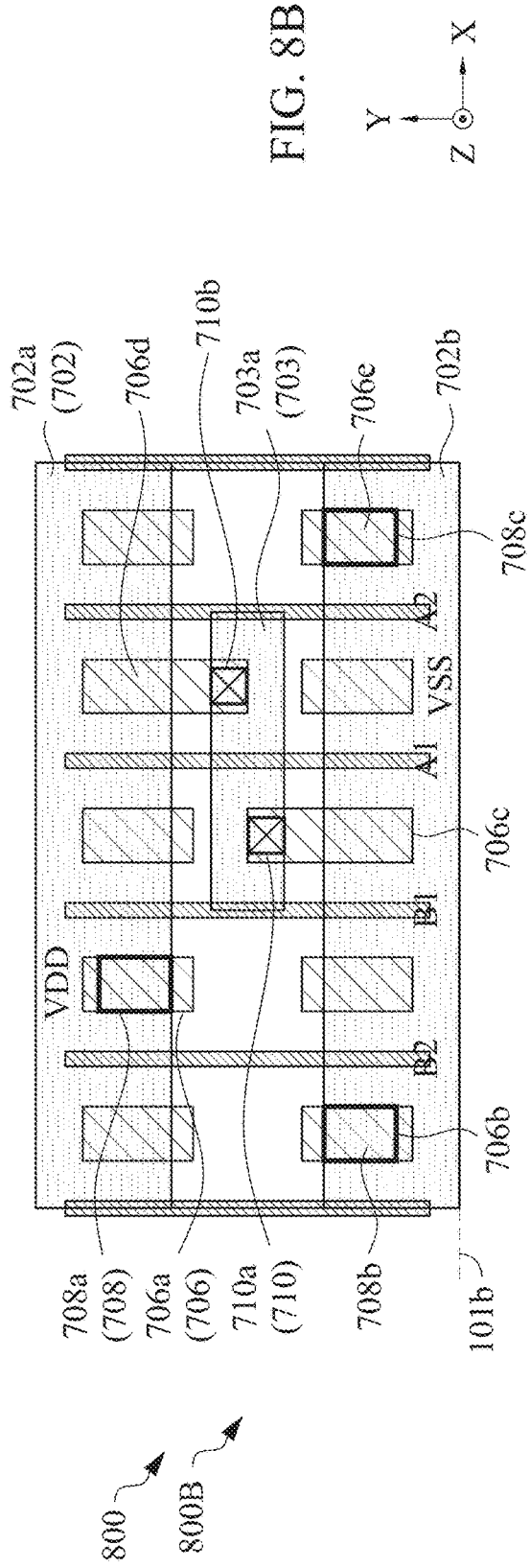

FIGS. 8A-8B are diagrams of an integrated circuit 800, in accordance with some embodiments.

FIGS. 8A-8B are top views of corresponding portions 800A-800B of integrated circuit 800, simplified for ease of illustration. Integrated circuit 800 is an embodiment of integrated circuit 600 with 4 M0 routing tracks (e.g., set of conductive features 812).

Portion 800A includes one or more features of integrated circuit 800 of the VBP level, the OD level, POLY level, the MD level or the M0 level of integrated circuit 800. Portion 800B includes one or more features of integrated circuit 800 of the BP level, the BS level, the VBP level, the VBS level, the POLY level or the MD level of integrated circuit 800.

For ease of illustration, some of the elements of FIGS. 8A-8B are not labelled in FIGS. 8A-8B. In some embodiments, integrated circuit 800 includes additional elements not shown in FIGS. 8A-8B.

Integrated circuit 800 is manufactured by a corresponding layout design similar to integrated circuit 800. For brevity FIGS. 8A-8B are described as integrated circuit 800, but in some embodiments, FIGS. 8A-8B also correspond to layout designs similar to layout designs 100, 400, 500A and 500C, structural elements of integrated circuit 800 also correspond to layout patterns and structural relationships including alignment, lengths and widths, as well as configurations and layers of a corresponding layout design of integrated circuit 800 are similar to the structural relationships and configurations and layers of integrated circuit 800, and similar detailed description will not be described for brevity.

Integrated circuit 800 is a variation of integrated circuit 700 (FIGS. 7A-7B), and similar detailed description will not be described for brevity. In comparison with integrated circuit 700 of FIGS. 7A-7B, a set of conductive features 812 of integrated circuit 800 replaces the set of conductive features 712, and similar detailed description is therefore omitted. In further comparison with integrated circuit 700 of FIGS. 7A-7B, integrated circuit 800 further includes a set of gridlines 840. In some embodiments, the set of gridlines 840 corresponds to M1 routing tracks that provide pin access points to other layers of integrated circuit 800. Other configurations of the set of gridlines 840 are within the scope of the present disclosure.

Integrated circuit 800 is an embodiment of integrated circuit 200 (FIGS. 2A-2B) or integrated circuit 600. In comparison with integrated circuit 200 of FIGS. 2A-2B, a set of power rails 702 of integrated circuit 800 replaces the set of power rails 202, a set of signal lines 703 replaces the set of signal lines 203, a set of contacts 706 replaces the set of contacts 206, a set of vias 708 of replaces the set of vias 208, a set of vias 710 replaces the set of vias 210, and a set of conductive features 812 replaces the set of conductive features 212, and similar detailed description is therefore omitted.

The set of conductive features 812 includes one or more of conductive features 812*a*, 812*b*, 812*c*, 812*d*, 812*e* or 812*f*. At least one of conductive features 812*a*, 812*b*, 812*c*, 812*d*, 812*e* or 812*f* is similar to at least one of conductive features 212*a*, 212*b*, 212*c*, 212*d* or 212*e*, and similar detailed description is therefore omitted. The set of conductive features 812 correspond to 4 M0 routing tracks. Routing tracks on other metal layers numbers or other numbers of routing tracks are within the scope of the present disclosure.

Conductive feature 812*a* is similar to conductive feature 712*a*, and similar detailed description is therefore omitted. Conductive features 812*b* and 812*e* are separated from each other in the second direction Y, thereby providing different conductive features to upper metal layers for routing resources and pin access when compared with continuous conductive features.

Conductive features 812*c* and 812*f* are separated from each other in the second direction Y, thereby providing different conductive features to upper metal layers for routing resources and pin access when compared with continuous conductive features. Conductive feature 812*d* corresponds to the output node OUT1 of integrated circuit 600 or 800, and is electrically coupled to the drain terminal of PMOS transistor P1, the drain terminal of PMOS transistor P3, the drain terminal of NMOS transistor N1 and the drain terminal of NMOS transistor N3.

Other configurations, arrangements on other layout levels or quantities of conductive features in the set of conductive features 812 are within the scope of the present disclosure.

In some embodiments, since at least one upper metal layer track in the set of conductive features 812 is reduced compared with other approaches, the height and area of integrated circuit 800 is reduced compared with other approaches. In some embodiments, since at least one upper metal layer track in the set of conductive features 812 is reduced, the width of one or more conductive features in the set of conductive features 812 is increased compared other approaches, yielding integrated circuit 800 with lower IR, EM and RC metal performance compared with other approaches.

FIGS. 9A-9B are diagrams of an integrated circuit 900, in accordance with some embodiments.

FIGS. 9A-9B are top views of corresponding portions 900A-900B of integrated circuit 900, simplified for ease of illustration. Integrated circuit 900 is an embodiment of integrated circuit 600 with 3 M0 routing tracks (e.g., set of conductive features 912).

Portion 900A includes one or more features of integrated circuit 900 of the VBP level, the OD level, POLY level, the MD level, the M0 level or the metal-1 (M1) level of integrated circuit 900. Portion 900B includes one or more features of integrated circuit 900 of the BP level, the BS level, the VBP level, the VBS level, the POLY level or the MD level of integrated circuit 900.

For ease of illustration, some of the elements of FIGS. 9A-9B are not labelled in FIGS. 9A-9B. In some embodiments, integrated circuit 900 includes additional elements not shown in FIGS. 9A-9B.

Integrated circuit 900 is manufactured by a corresponding layout design similar to integrated circuit 900. For brevity FIGS. 9A-9B are described as integrated circuit 900, but in some embodiments, FIGS. 9A-9B also correspond to layout designs similar to layout designs 100, 400, 500A and 500C, structural elements of integrated circuit 900 also correspond to layout patterns, and structural relationships including alignment, lengths and widths, as well as configurations and layers of a corresponding layout design of integrated circuit 900 are similar to the structural relationships and configurations and layers of integrated circuit 900, and similar detailed description will not be described for brevity.

Integrated circuit 900 is a variation of integrated circuit 700 (FIGS. 7A-7B) or 800 (FIGS. 8A-8B), and similar detailed description will not be described for brevity. In comparison with integrated circuit 700 of FIGS. 7A-7B, a set of conductive features 912 of integrated circuit 900 replaces the set of conductive features 712, and integrated circuit 900 further includes a set of conductive features 920, and similar detailed description is therefore omitted.

Integrated circuit 900 is an embodiment of integrated circuit 200 (FIGS. 2A-2B) or integrated circuit 600. In comparison with integrated circuit 200 of FIGS. 2A-2B, a set of power rails 702 of integrated circuit 900 replaces the set of power rails 202, a set of signal lines 703 replaces the set of signal lines 203, a set of contacts 706 replaces the set of contacts 206, a set of vias 708 of replaces the set of vias 208, a set of vias 710 replaces the set of vias 210, and a set of conductive features 912 replaces the set of conductive features 212, and similar detailed description is therefore omitted.

The set of conductive features 912 includes one or more of conductive features 912a, 912b, 912c, 912d or 912e. At least one of conductive features 912a, 912b, 912c, 912d or 912e is similar to at least one of conductive features 212a, 212b, 212c, 212d or 212e, and similar detailed description is therefore omitted. The set of conductive features 912 correspond to 3 M0 routing tracks. Routing tracks on other metal layers numbers are within the scope of the present disclosure.

Conductive features 912d and 912b are separated from each other in the second direction Y, thereby providing different conductive features to upper metal layers for routing resources and pin access when compared with continuous conductive features.

Conductive features 912e and 912c are separated from each other in the second direction Y, thereby providing different conductive features to upper metal layers for routing resources and pin access when compared with continuous conductive features.

Other configurations, arrangements on other layout levels or quantities of conductive features in the set of conductive features 912 are within the scope of the present disclosure.

The set of conductive features 920 includes one or more of conductive features 920a, 920b, 920c, 920d or 920e. At least one of conductive features 920a, 920b, 920c, 920d or 920e is similar to at least one of conductive features 212a, 212b, 212c, 212d or 212e, and similar detailed description is therefore omitted.

The set of conductive features 920 extend in the second direction Y. Each conductive feature of the set of conductive features 920 is separated from an adjacent conductive feature in the first direction X. The set of conductive features 920 overlap at least the set of conductive features 912. The set of conductive features 912 correspond to M1 routing tracks. Routing tracks on other metal layers numbers are within the scope of the present disclosure. Other configurations, arrangements on other layout levels or quantities of conductive features in the set of conductive features 920 are within the scope of the present disclosure.

In some embodiments, since at least one upper metal layer track in the set of conductive features 912 is reduced, the height and area of integrated circuit 900 is reduced compared with other approaches. In some embodiments, since at least one upper metal layer track in the set of conductive features 912 is reduced, the width of one or more conductive features in the set of conductive features 912 is increased compared other approaches, yielding integrated circuit 900 with lower IR, EM and RC metal performance compared with other approaches.

Figure 10:
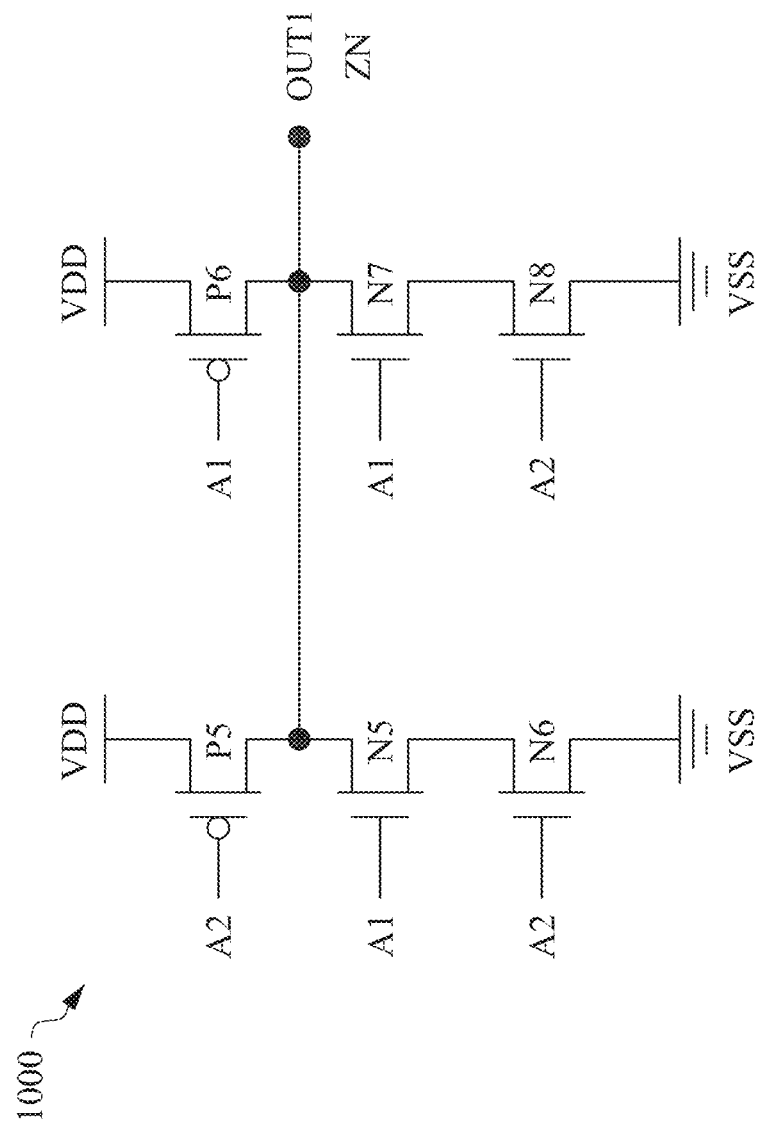
FIG. 10 is a circuit diagram of an integrated circuit, in accordance with some embodiments.

FIG. 10 is a circuit diagram of an integrated circuit 1000, in accordance with some embodiments. In some embodiments, integrated circuit 1000 is a 2-2 NAND logic gate (hereinafter "NAND") circuit. A 2-2 NAND circuit is used for illustration, other types of circuits including other types of NAND circuits are within the scope of the present disclosure.

Integrated circuit 1000 includes PMOS transistors P5 and P6, and NMOS transistors N5, N6, N7 and N8.

A gate terminal of PMOS transistor P5 is configured as an input node (not labelled) configured to receive an input signal A2. A gate terminal of NMOS transistor N6 is configured as an input node (not labelled) configured to receive input signal A2. A gate terminal of NMOS transistor N8 is configured as an input node (not labelled) configured to receive input signal A2.

In some embodiments, at least two of the gate terminal of PMOS transistor P5, the gate terminal of NMOS transistor N6 and the gate terminal of NMOS transistor N8 are coupled together.

A gate terminal of PMOS transistor P6 is configured as an input node (not labelled) configured to receive input signal A1. A gate terminal of NMOS transistor N5 is configured as an input node (not labelled) configured to receive input signal A1. A gate terminal of NMOS transistor N7 is configured as an input node (not labelled) configured to receive input signal A1.

In some embodiments, at least two of the gate terminal of PMOS transistor P6, the gate terminal of NMOS transistor N5 and the gate terminal of NMOS transistor N7 are coupled together.

In some embodiments, at least input signal A1 or A2 is a logically low signal or a logically high signal.

A source terminal of PMOS transistor P5 and a source terminal of PMOS transistor P6 are coupled to the voltage supply VDD. In some embodiments, the source terminal of PMOS transistor P5 and the source terminal of PMOS transistor P6 are coupled together.

A drain terminal of PMOS transistor P5, a drain terminal of PMOS transistor P6, a drain terminal of NMOS transistor N5 and a drain terminal of NMOS transistor N7 are coupled to each other, and are configured as an output node OUT1.

A source terminal of NMOS transistor N5 and a drain terminal of NMOS transistor N6 are coupled to each other. A source terminal of NMOS transistor N7 and a drain terminal of NMOS transistor N8 are coupled to each other.

A source terminal of NMOS transistor N6 and a source terminal of NMOS transistor N8 are each coupled to a reference voltage supply VSS. In some embodiments, the source terminal of NMOS transistor N6 and the source terminal of NMOS transistor N8 are coupled together.

Other circuits, other types of transistors, and/or quantities of transistors are within the scope of various embodiments. For example, in some embodiments, integrated circuit 1000 includes other types of NAND circuits, such as a 2-1 NAND circuit. Other values of at least input signal A1 or A2 are within the scope of various embodiments.

Figure 11A:
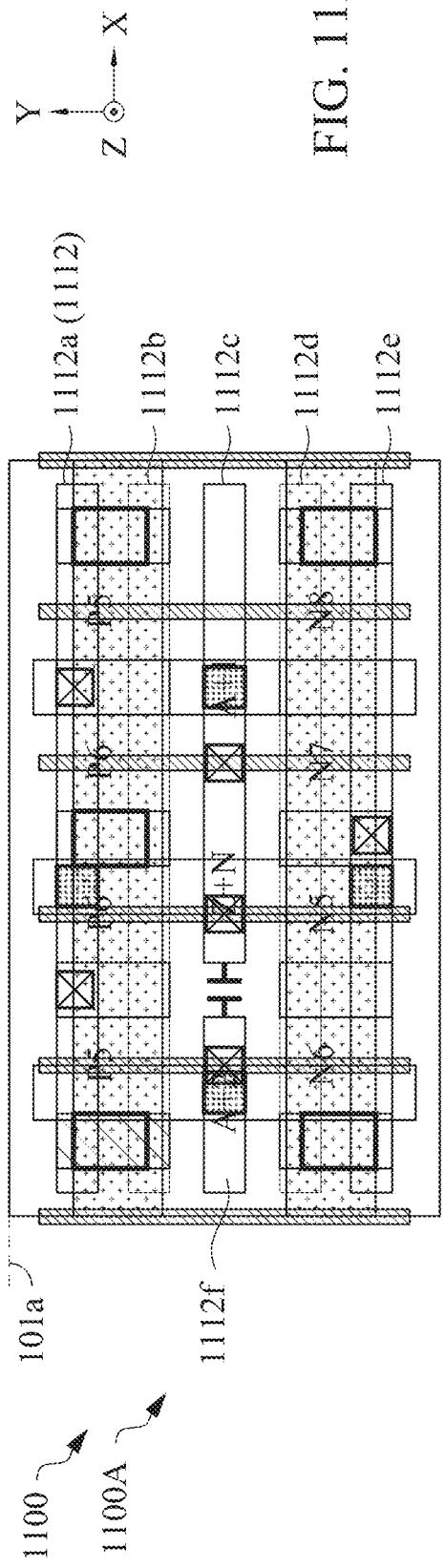
FIGS. 11A-11B are diagrams of an integrated circuit, in accordance with some embodiments.
Figure 11B:
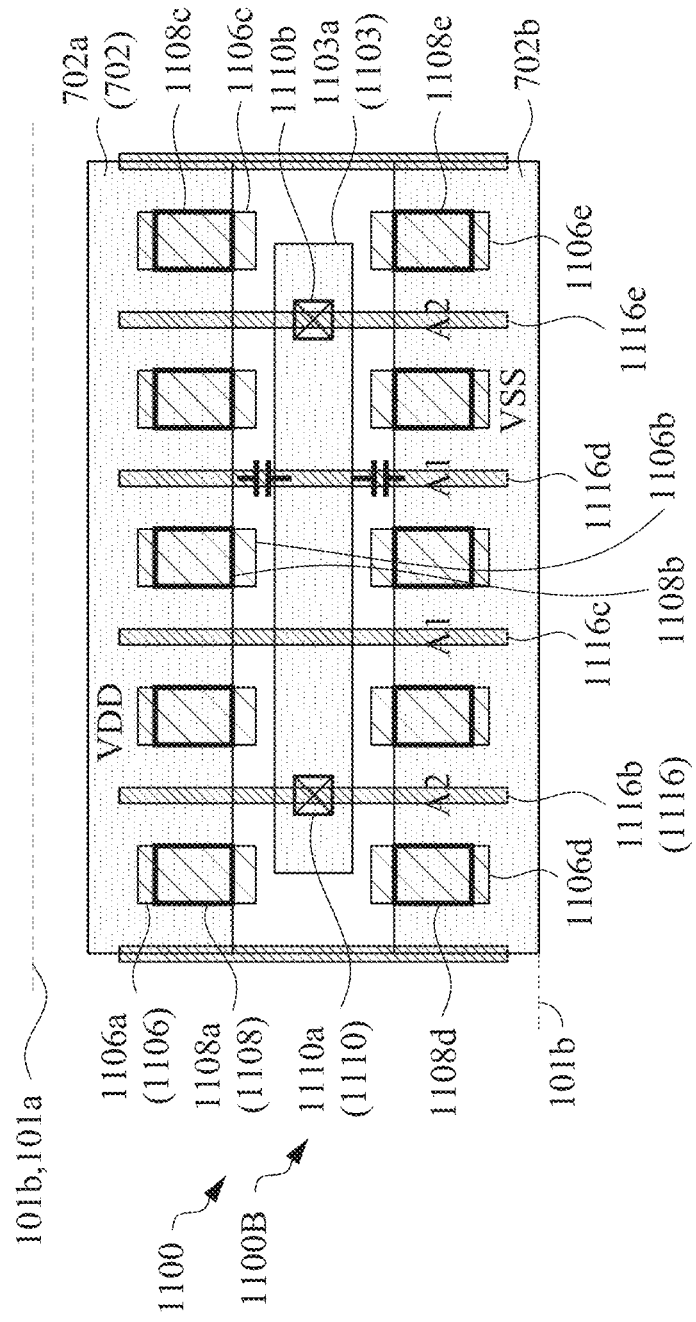

FIGS. 11A-11B are diagrams of an integrated circuit 1100, in accordance with some embodiments.

FIGS. 11A-11B are top views of corresponding portions 1100A-1100B of integrated circuit 1100, simplified for ease of illustration. Integrated circuit 1100 is an embodiment of integrated circuit 1000 with 5 M0 routing tracks (e.g., set of conductive features 1112).

Portion 1100A includes one or more features of integrated circuit 1100 of the VBP level, the OD level, POLY level, the MD level, the M0 level or the M1 level of integrated circuit 1100. Portion 1100B includes one or more features of integrated circuit 1100 of the BP level, the BS level, the VBP level, the VBS level, the POLY level or the MD level of integrated circuit 1100.

For ease of illustration, some of the elements of FIGS. 11A-11B are not labelled in FIGS. 11A-11B. In some embodiments, integrated circuit 1100 includes additional elements not shown in FIGS. 11A-11B.

Integrated circuit 1100 is manufactured by a corresponding layout design similar to integrated circuit 1100. For brevity FIGS. 11A-11B are described as integrated circuit 1100, but in some embodiments, FIGS. 11A-11B also correspond to layout designs similar to layout designs 100, 400, 500A and 500C, structural elements of integrated circuit 1100 also correspond to layout patterns, and structural relationships including alignment, lengths and widths, as well as configurations and layers of a corresponding layout design of integrated circuit 1100 are similar to the structural relationships and configurations and layers of integrated circuit 1100, and similar detailed description will not be described for brevity.

Integrated circuit 1100 is an embodiment of integrated circuit 400 (FIGS. 4A-4B) or integrated circuit 1000. In comparison with integrated circuit 400 of FIGS. 4A-4B, set of power rails 702 of integrated circuit 1100 replaces the set of power rails 202, a set of signal lines 1103 replaces the set of signal lines 203, a set of contacts 1106 replaces the set of contacts 406, a set of vias 1108 of replaces the set of vias 208 (shown in FIGS. 2A-2B), a set of vias 1110 replaces the set of vias 410, a set of conductive features 1112 replaces the set of conductive features 212, and a set of gates 1116 replaces the set of gates 416, and similar detailed description is therefore omitted.

The set of signal lines 1103 include at least signal line 1103a. The set of signal lines 1103 are configured to provide routing of signals from upper layers. Signal line 1103a is configured to electrically couple the gates of PMOS transistor P5 and one of NMOS transistor N6 or N8 with the gate of the other of NMOS transistor N8 or N6, resulting in additional routing resources compared to other approaches. Other connections with other gates are within the scope of the present disclosure.

Other configurations, arrangements on other layout levels or quantities of structures in the set of power rails 702 or set of signal lines 1103 are within the scope of the present disclosure. In some embodiments, set of signal lines 1103 electrically couple source or drain features of a transistor in FIG. 11B with gate features of another transistor in FIG. 11B. In some embodiments, set of signal lines 1103 electrically couple source or drain features of a transistor in FIG. 11B with source or drain features of another transistor in FIG. 11B.

The set of contacts 1106 includes one or more contacts 1106a, 1106b, 1106c, 1106d or 1106e. At least one of contacts 1106a, 1106b, 1106c, 1106d or 1106e is similar to at least one of contacts 406a, 406b, 406c, 406d, 406e, 406f, 406g or 406h, and similar detailed description is therefore omitted.

In some embodiments, contact 1106a corresponds to the source terminal of PMOS transistor P5. In some embodiments, contact 1106b corresponds to the source terminal of PMOS transistor P6. In some embodiments, contact 1106c corresponds to the source terminal of PMOS transistor P5.

In some embodiments, contact 1106d corresponds to the source terminal of NMOS transistor N6. In some embodiments, contact 1106e corresponds to the source terminal of NMOS transistor N8.

Other configurations, arrangements on other layout levels or quantities of contacts in the set of contacts 1106 are within the scope of the present disclosure.

The set of vias 1108 includes one or more vias 1108a, 1108b, 1108c, 1108d or 1108e. At least one of vias 1108a, 1108b, 1108c, 1108d or 1108e is similar to at least one of vias 208a or 208b, and similar detailed description is therefore omitted.

In some embodiments, via 1108a electrically couples power rail 702a and contact 1106a to each other, thereby coupling the source terminal of PMOS transistor P5 to supply voltage VDD. Via 1108b electrically couples power rail 702a and contact 1106b to each other, thereby coupling the source terminal of PMOS transistor P6 to supply voltage VDD. In some embodiments, via 1108c electrically couples power rail 702a and contact 1106c to each other, thereby coupling the source terminal of PMOS transistor P5 to supply voltage VDD.

In some embodiments, via 1108d electrically couples power rail 702b and contact 1106d to each other, thereby coupling the source terminal of NMOS transistor N6 to reference supply voltage VSS. In some embodiments, via 1108e electrically couples power rail 702b and contact 1106e to each other, thereby coupling the source terminal of NMOS transistor N8 to reference supply voltage VSS.

Other configurations, arrangements on other layout levels or quantities of vias in the set of vias 1108 are within the scope of the present disclosure.

The set of vias 1110 includes one or more vias 1110a or 1110b. At least one of vias 1110a or 1110b is similar to at least one of vias 410a or 410b, and similar detailed description is therefore omitted.

Via 1110a electrically couples signal line 1103a and gate 1116b to each other, thereby coupling the gate terminal of PMOS transistor P5 and the gate terminal of NMOS transistor N6 to signal line 1103a. Via 1110b electrically couples signal line 1103a and gate 1116e to each other, thereby coupling the gate terminal of PMOS transistor P5 and the gate terminal of NMOS transistor N8 to signal line 1103a. Thus, signal line 1103a and vias 1110a and 1110b electrically couple gates 1116b and 1116e to each other, thereby coupling the gate terminal of PMOS transistor P5, the gate terminal of NMOS transistor N6 and the gate terminal of NMOS transistor N8 to each other, resulting in additional routing resources on other metal layer compared to other approaches.

Other configurations, arrangements on other layout levels or quantities of vias in the set of vias 1110 are within the scope of the present disclosure. Other overlap positions or numbers of overlap positions between one or more of the set of contacts 1106, the set of vias 1110, the set of signal lines 1103 and the set of gates 1116 are within the scope of the present disclosure, and therefore other electrical connections are within the scope of the present disclosure.

The set of conductive features 1112 includes one or more of conductive features 1112a, 1112b, 1112c, 1112d, 1112e or 1112f. At least one of conductive features 1112a, 1112b, 1112c, 1112d, 1112e or 1112f is similar to at least one of conductive features 212a, 212b, 212c, 212d or 212e, and similar detailed description is therefore omitted.

Other configurations, arrangements on other layout levels or quantities of conductive features in the set of conductive features 1112 are within the scope of the present disclosure.

The set of gates 1116 includes one or more gates 1116a, 1116b, 1116c, 1116d, 1116e or 1116f. Gate 1116a, 1116c, 1116d or 1116f are not labelled in FIGS. 11A-11B for ease of illustration. At least one of gate 1116a, 1116b, 1116c, 1116d, 1116e or 1116f is similar to at least one of gates 416a, 416b, 416c, 416d or 416e, and similar detailed description is therefore omitted.

In some embodiments, gate 1116b corresponds to the gate of NMOS transistor N6, and gate 1116e corresponds to the gate of NMOS transistor N8.

In some embodiments, gate 1116c corresponds to the gate of NMOS transistor N5, and gate 1116d corresponds to the gate of NMOS transistor N7.

In some embodiments, at least gate 1116b or 1116e corresponds to the gate of PMOS transistor P5. In some embodiments, at least gate 1116c or 1116d corresponds to the gate of PMOS transistor P6.

Gate 1116b and gate 1116e are electrically coupled to each other by signal line 1103a, and vias 1110a and 1110b.

Signal line 1103a electrically couples gates 1116b and 1116e together, thereby using at least one less upper metal layer track in the set of conductive features 1112, resulting in integrated circuit 1100 with at least a smaller height, smaller area, better IR, EM and RC metal performance or additional routing resources on other metal layers compared to other approaches.

Other configurations, arrangements on other layout levels or quantities of conductive features in the set of gates 1116 are within the scope of the present disclosure.

Figure 12:
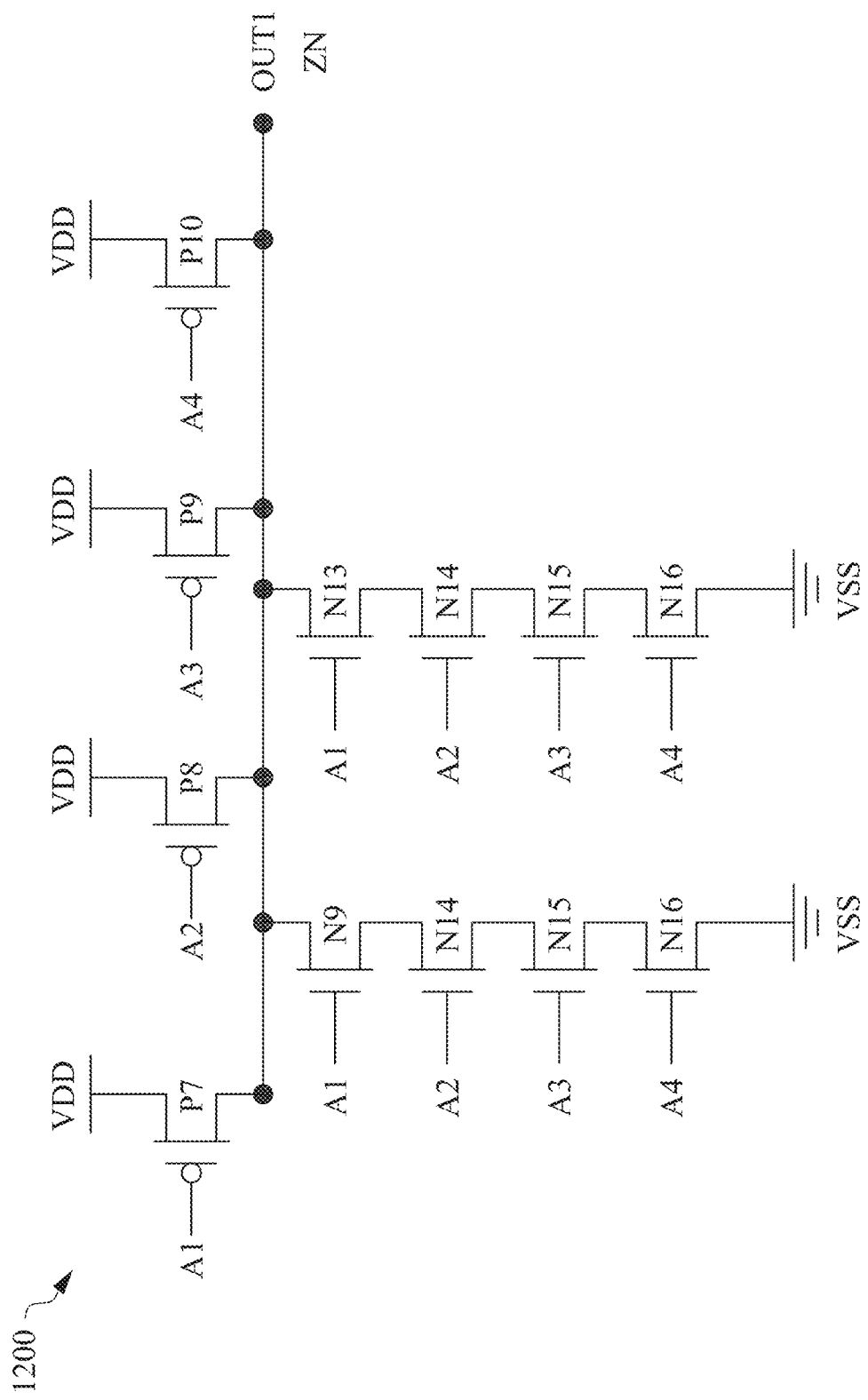
FIG. 12 is a circuit diagram of an integrated circuit, in accordance with some embodiments.

FIG. 12 is a circuit diagram of an integrated circuit 1200, in accordance with some embodiments. In some embodiments, integrated circuit 1200 is a split-gate 4-2 NAND logic gate (hereinafter "NAND") circuit. A 4-2 NAND circuit is used for illustration, other types of circuits including other types of NAND circuits are within the scope of the present disclosure.

Integrated circuit 1200 includes PMOS transistors P7, P8, P9 and P10, and NMOS transistors N9, N10, N11, N12, N13, N14, N15 and N16.

A gate terminal of PMOS transistor P7 is configured as an input node (not labelled) configured to receive input signal A1. A gate terminal of NMOS transistor N9 is configured as an input node (not labelled) configured to receive input signal A1. A gate terminal of NMOS transistor N13 is configured as an input node (not labelled) configured to receive input signal A1. In some embodiments, at least two of the gate terminal of PMOS transistor P7, the gate terminal of NMOS transistor N9 or the gate terminal of NMOS transistor N13 are coupled together.

A gate terminal of PMOS transistor P8 is configured as an input node (not labelled) configured to receive an input signal A2. A gate terminal of NMOS transistor N10 is configured as an input node (not labelled) configured to receive input signal A2. A gate terminal of NMOS transistor N14 is configured as an input node (not labelled) configured to receive input signal A2. In some embodiments, at least two of the gate terminal of PMOS transistor P8, the gate terminal of NMOS transistor N10 or the gate terminal of NMOS transistor N14 are coupled together.

A gate terminal of PMOS transistor P9 is configured as an input node (not labelled) configured to receive an input signal A3. A gate terminal of NMOS transistor N11 is configured as an input node (not labelled) configured to receive input signal A3. A gate terminal of NMOS transistor N15 is configured as an input node (not labelled) configured to receive input signal A3. In some embodiments, at least two of the gate terminal of PMOS transistor P9, the gate terminal of NMOS transistor N11 or the gate terminal of NMOS transistor N15 are coupled together.

A gate terminal of PMOS transistor P10 is configured as an input node (not labelled) configured to receive an input signal A4. A gate terminal of NMOS transistor N12 is configured as an input node (not labelled) configured to receive input signal A4. A gate terminal of NMOS transistor N16 is configured as an input node (not labelled) configured to receive input signal A4. In some embodiments, at least two of the gate terminal of PMOS transistor P10, the gate terminal of NMOS transistor N12 or the gate terminal of NMOS transistor N16 are coupled together.

In some embodiments, at least input signal A1, A2, A3 or A4 is a logically low signal or a logically high signal.

A source terminal of PMOS transistor P7, a source terminal of PMOS transistor P8, a source terminal of PMOS transistor P9, a source terminal of PMOS transistor P10 are coupled to the voltage supply VDD. In some embodiments, the source terminal of PMOS transistor P7, the source terminal of PMOS transistor P8, the source terminal of PMOS transistor P9 and the source terminal of PMOS transistor P10 are coupled together.

A drain terminal of PMOS transistor P7, a drain terminal of PMOS transistor P8, a drain terminal of PMOS transistor P9, a drain terminal of PMOS transistor P10, a drain terminal of NMOS transistor N9, and a drain terminal of NMOS transistor N13 are coupled to each other, and are configured as an output node OUT1.

A source terminal of NMOS transistor N9 and a drain terminal of NMOS transistor N10 are coupled to each other. A source terminal of NMOS transistor N10 and a drain terminal of NMOS transistor N11 are coupled to each other. A source terminal of NMOS transistor N11 and a drain terminal of NMOS transistor N12 are coupled to each other. A source terminal of NMOS transistor N12 is coupled to reference voltage supply VSS.

A source terminal of NMOS transistor N13 and a drain terminal of NMOS transistor N14 are coupled to each other. A source terminal of NMOS transistor N14 and a drain terminal of NMOS transistor N15 are coupled to each other. A source terminal of NMOS transistor N15 and a drain terminal of NMOS transistor N16 are coupled to each other. A source terminal of NMOS transistor N16 is coupled to reference voltage supply VSS. In some embodiments, the source terminal of NMOS transistor N12 and the source terminal of NMOS transistor N16 are coupled together.

Other circuits, other types of transistors, and/or quantities of transistors are within the scope of various embodiments. For example, in some embodiments, integrated circuit 1200 includes other types of NAND circuits, such as a 4-1 NAND circuit. Other values of at least input signal A1, A2, A3 or A4 are within the scope of various embodiments.

FIGS. 13A-13B are diagrams of an integrated circuit 1300, in accordance with some embodiments.

FIGS. 13A-13B are top views of corresponding portions 1300A-1300B of integrated circuit 1300, simplified for ease of illustration. Integrated circuit 1300 is an embodiment of integrated circuit 1200 with 4 M0 routing tracks (e.g., set of conductive features 1312).

Portion 1300A includes one or more features of integrated circuit 1300 of the VBP level, the OD level, POLY level, the MD level or the M0 level of integrated circuit 1300. Portion 1300B includes one or more features of integrated circuit 1300 of the BP level, the BS level, the VBP level, the VBS level, the POLY level or the MD level of integrated circuit 1300.

For ease of illustration, some of the elements of FIGS. 13A-13B are not labelled in FIGS. 13A-13B. In some embodiments, integrated circuit 1300 includes additional elements not shown in FIGS. 13A-13B.

Integrated circuit 1300 is manufactured by a corresponding layout design similar to integrated circuit 1300. For brevity FIGS. 13A-13B are described as integrated circuit 1300, but in some embodiments, FIGS. 13A-13B also correspond to layout designs similar to layout designs 100, 400, 500A and 500C, structural elements of integrated circuit 1300 also correspond to layout patterns, and structural relationships including alignment, lengths and widths, as well as configurations and layers of a corresponding layout design of integrated circuit 1300 are similar to the structural relationships and configurations and layers of integrated circuit 1300, and similar detailed description will not be described for brevity.

Integrated circuit 1300 is an embodiment of integrated circuit 400 (FIGS. 4A-4B) or integrated circuit 1200. In comparison with integrated circuit 400 of FIGS. 4A-4B, set of power rails 702 of integrated circuit 1300 replaces the set of power rails 202, a set of signal lines 1303 replaces the set of signal lines 203, a set of contacts 1306 replaces the set of contacts 406, a set of vias 1308 replaces the set of vias 208 (shown in FIGS. 2A-2B), a set of vias 1310 replaces the set of vias 410, a set of conductive features 1312 replaces the set of conductive features 212, and a set of gates 1316 replaces the set of gates 416, and similar detailed description is therefore omitted.

The set of signal lines 1303 are similar to the set of signal lines 403, and similar detailed description is therefore omitted. The set of signal lines 1303 include at least signal line 1303a. The set of signal lines 1303 are configured to provide routing of signals from upper layers. Signal line 1303a is configured to electrically couple the gates of PMOS transistor P9, the gate of NMOS transistor N11 and the gate of NMOS transistor N15 together, resulting in additional routing resources compared to other approaches. Other connections with other gates for signal line 1303a are within the scope of the present disclosure.

Other configurations, arrangements on other layout levels or quantities of structures in the set of power rails 702 or set of signal lines 1303 are within the scope of the present disclosure. In some embodiments, set of signal lines 1303 electrically couple source or drain features of a transistor in FIG. 13 with gate features of another transistor in FIG. 13. In some embodiments, set of signal lines 1303 electrically couple source or drain features of a transistor in FIG. 13 with source or drain features of another transistor in FIG. 13.

The set of contacts 1306 includes one or more contacts 1306a, 1306b, 1306c, 1306d, 1306e or 1306f. At least one of contacts 1306a, 1306b, 1306c, 1306d, 1306e or 1306f is similar to at least one of contacts 406a, 406b, 406c, 406d, 406e, 406f, 406g or 406h, and similar detailed description is therefore omitted.

In some embodiments, contact 1306a corresponds to the source terminal of PMOS transistors P10 and P9. In some embodiments, contact 1306b corresponds to the source terminal of PMOS transistors P7 and P8. In some embodiments, contact 1306b corresponds to the source terminal of PMOS transistors P7 and P8. In some embodiments, contact 1306d corresponds to the source terminal of PMOS transistors P10 and P9.

In some embodiments, contact 1306e corresponds to the source terminal of NMOS transistor N12, and contact 1306f corresponds to the source terminal of NMOS transistor N16.

Other configurations, arrangements on other layout levels or quantities of contacts in the set of contacts 1306 are within the scope of the present disclosure.

The set of vias 1308 includes one or more vias 1308a, 1308b, 1308c, 1308d, 1308e or 1308f. At least one of vias 1308a, 1308b, 1308c, 1308d, 1308e or 1308f is similar to at least one of vias 208a or 208b, and similar detailed description is therefore omitted.

In some embodiments, via 1308a electrically couples power rail 702a and contact 1306a to each other, thereby coupling the source terminal of at least PMOS transistor P9 or P10 to supply voltage VDD. In some embodiments, via 1308b electrically couples power rail 702a and contact 1306b to each other, thereby coupling the source terminal of at least PMOS transistor P7 or P8 to supply voltage VDD. In some embodiments, via 1308c electrically couples power rail 702a and contact 1306c to each other, thereby coupling the source terminal of at least PMOS transistor P7 or P8 to supply voltage VDD. In some embodiments, via 1308d electrically couples power rail 702a and contact 1306d to each other, thereby coupling the source terminal of at least PMOS transistor P9 or P10 to supply voltage VDD.

In some embodiments, via 1308e electrically couples power rail 702b and contact 1306e to each other, thereby coupling the source terminal of NMOS transistor N12 to reference supply voltage VSS. In some embodiments, via 1308f electrically couples power rail 702b and contact 1306f to each other, thereby coupling the source terminal of NMOS transistor N16 to reference supply voltage VSS.

Other configurations, arrangements on other layout levels or quantities of vias in the set of vias 1308 are within the scope of the present disclosure.

The set of vias 1310 includes one or more vias 1310a or 1310b. At least one of vias 1310a or 1310b is similar to at least one of vias 410a or 410b, and similar detailed description is therefore omitted.

Via 1310a electrically couples signal line 1303a and gate 1316c to each other, thereby coupling the gate terminal of PMOS transistor P9 and the gate terminal of NMOS transistor N11 to signal line 1303a. Via 1310b electrically couples signal line 1303a and gate 1316h to each other, thereby coupling the gate terminal of PMOS transistor P9 and the gate terminal of NMOS transistor N15 to signal line 1303a. Thus, signal line 1303a and vias 1310a and 1310b electrically couple gates 1316c and 1316h to each other, thereby coupling the gate terminal of PMOS transistor P9, the gate terminal of NMOS transistor N11, and the gate terminal of NMOS transistor N15 to each other, resulting in additional routing resources on other metal layer compared to other approaches.

Other configurations, arrangements on other layout levels or quantities of vias in the set of vias 1310 are within the scope of the present disclosure. Other overlap positions or numbers of overlap positions between one or more of the set of contacts 1306, the set of vias 1310, the set of signal lines 1303 and the set of gates 1316 are within the scope of the present disclosure, and therefore other electrical connections are within the scope of the present disclosure.

The set of conductive features 1312 includes one or more of conductive features 1312a, 1312b, 1312c, 1312d, 1312e or 1312f. At least one of conductive features 1312a, 1312b, 1312c, 1312d, 1312e or 1312f is similar to at least one of conductive features 212a, 212b, 212c, 212d or 212e, and similar detailed description is therefore omitted.

Other configurations, arrangements on other layout levels or quantities of conductive features in the set of conductive features 1312 are within the scope of the present disclosure.

The set of gates 1316 includes one or more gates 1316a, 1316b, 1316c, 1316d, 1316e, 1316f, 1316g, 1316i or 1316j. Gates 1316a, 1316b, 1316d-1316g and 1316i-1316j are not labelled in FIGS. 13A-13B for ease of illustration. At least one of gate 1316a, 1316b, 1316c, 1316d, 1316e, 1316f, 1316g, 1316i or 1316j is similar to at least one of gates 416a, 416b, 416c, 416d or 416e, and similar detailed description is therefore omitted.

In some embodiments, gate 1316c corresponds to the gate of PMOS transistor P9 and NMOS transistor N11. In some embodiments, gate 1316h corresponds to the gate of PMOS transistor P9 and NMOS transistor N15.

In some embodiments, gate 1316b corresponds to the gate of PMOS transistor P10, and NMOS transistor N12. In some embodiments, gate 1316i corresponds to the gate of PMOS transistor P10 and NMOS transistor N16.

In some embodiments, gate 1316d corresponds to the gate of PMOS transistor P8 and NMOS transistor N10. In some embodiments, gate 1316g corresponds to the gate of PMOS transistor P8 and NMOS transistor N14.

In some embodiments, gate 1316e corresponds to the gate of PMOS transistor P7 and NMOS transistor N9. In some embodiments, gate 1316f corresponds to the gate of PMOS transistor P7 and NMOS transistor N13.

Gate 1316c and gate 1316h are electrically coupled to each other by signal line 1303a, and vias 1310a and 1310b.

Signal line 1303a electrically couples gates 1316c and 1316h together, thereby using at least one less upper metal layer track in the set of conductive features 1312, resulting in integrated circuit 1300 with at least a smaller height, smaller area, better IR, EM and RC metal performance or additional routing resources on other metal layers compared to other approaches.

Other configurations, arrangements on other layout levels or quantities of conductive features in the set of gates 1316 are within the scope of the present disclosure.

Figure 14A:
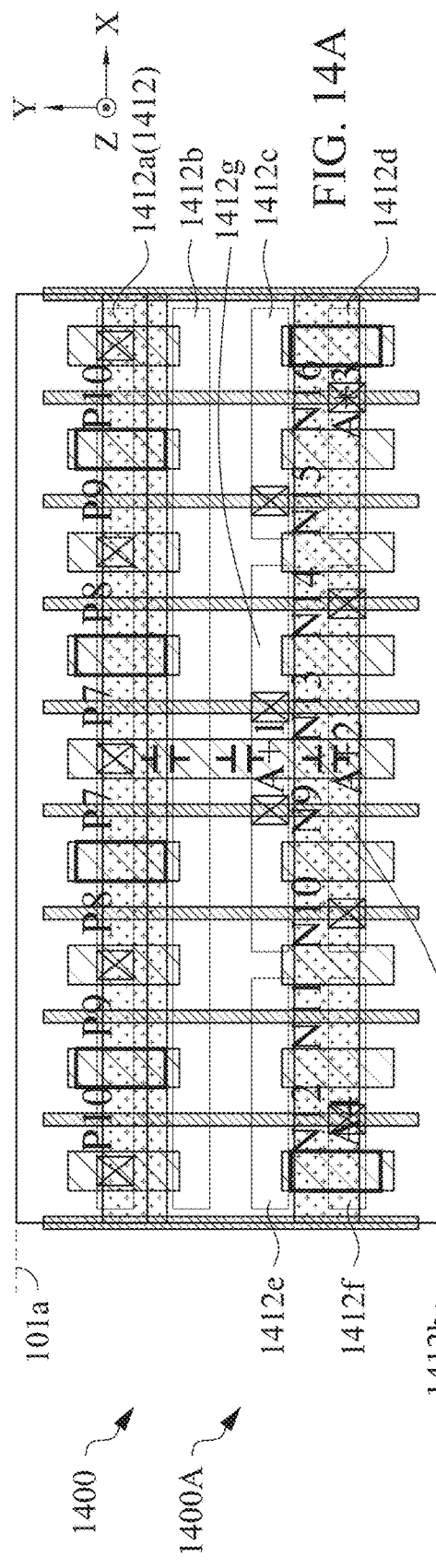
FIGS. 14A-14B are diagrams of an integrated circuit, in accordance with some embodiments.
Figure 14B:
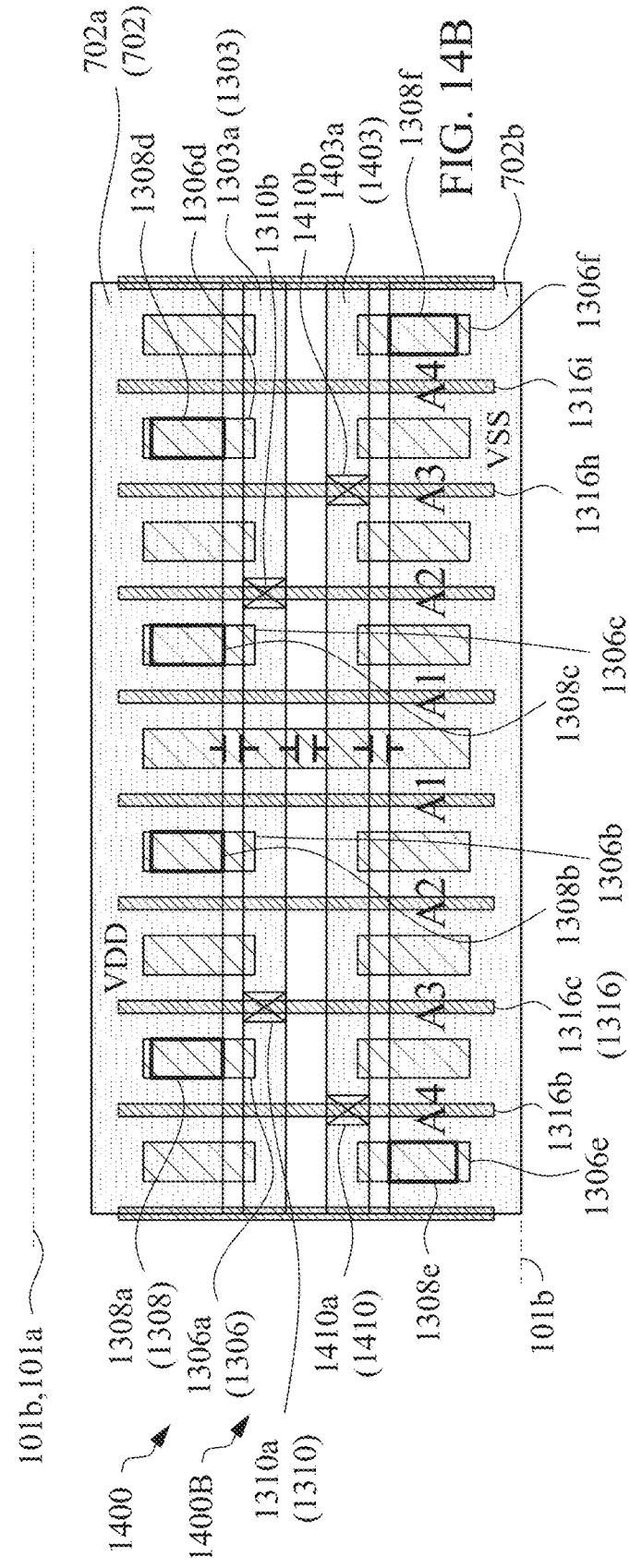

FIGS. 14A-14B are diagrams of an integrated circuit 1400, in accordance with some embodiments.

FIGS. 14A-14B are top views of corresponding portions 1400A-1400B of integrated circuit 1400, simplified for ease of illustration. Integrated circuit 1400 is an embodiment of integrated circuit 1200 with 4 M0 routing tracks (e.g., set of conductive features 1412) and 2 BS tracks on the back-side of integrated circuit 1400.

Portion 1400A includes one or more features of integrated circuit 1400 of the VBP level, the OD level, POLY level, the MD level or the M0 level of integrated circuit 1400. Portion 1400B includes one or more features of integrated circuit 1400 of the BP level, the BS level, the VBP level, the VBS level, the POLY level or the MD level of integrated circuit 1400.

For ease of illustration, some of the elements of FIGS. 14A-14B are not labelled in FIGS. 14A-14B. In some embodiments, integrated circuit 1400 includes additional elements not shown in FIGS. 14A-14B.

Integrated circuit 1400 is manufactured by a corresponding layout design similar to integrated circuit 1400. For brevity FIGS. 14A-14B are described as integrated circuit 1400, but in some embodiments, FIGS. 14A-14B also correspond to layout designs similar to layout designs 100, 400, 500A and 500C, structural elements of integrated circuit 1400 also correspond to layout patterns, and structural relationships including alignment, lengths and widths, as well as configurations and layers of a corresponding layout design of integrated circuit 1400 are similar to the structural relationships and configurations and layers of integrated circuit 1400, and similar detailed description will not be described for brevity.

Integrated circuit 1400 is an embodiment of integrated circuit 400 (FIGS. 4A-4B) or integrated circuit 1200.

Integrated circuit 1400 is a variation of integrated circuit 1300 of FIGS. 13A-13B, and similar detailed description will not be described for brevity. In comparison with integrated circuit 1300 of FIGS. 13A-13B, a set of conductive features 1412 of integrated circuit 1400 replaces the set of conductive features 1412, and integrated circuit 1400 further includes a signal line 1403 and a set of vias 1410, and similar detailed description is therefore omitted.

The set of signal lines 1403 are similar to the set of signal lines 403, and similar detailed description is therefore omitted. The set of signal lines 1403 include at least signal line 1403a. The set of signal lines 1403 are configured to provide routing of signals from upper layers. Signal line 1403a is configured to electrically couple the gates of PMOS transistor P10, the gate of NMOS transistor N12 and the gate of NMOS transistor N16 together, resulting in additional routing resources compared to other approaches. Other connections with other gates for signal line 1403a are within the scope of the present disclosure.

Other configurations, arrangements on other layout levels or quantities of structures in the set of power rails 702 or set of signal lines 1403 are within the scope of the present disclosure. In some embodiments, set of signal lines 1403 electrically couple source or drain features of a transistor in FIG. 14B with gate features of another transistor in FIG. 14B. In some embodiments, set of signal lines 1403 electrically couple source or drain features of a transistor in FIG. 14B with source or drain features of another transistor in FIG. 14B.

The set of vias 1410 are similar to the set of vias 410, and similar detailed description is therefore omitted. The set of vias 1410 includes one or more vias 1410a or 1410b. At least one of vias 1410a or 1410b is similar to at least one of vias 410a or 410b, and similar detailed description is therefore omitted.

Via 1410a electrically couples signal line 1403a and gate 1316b to each other, thereby coupling the gate terminal of PMOS transistor P10 and the gate terminal of NMOS transistor N12 to signal line 1403a. Via 1410b electrically couples signal line 1403a and gate 1316i to each other, thereby coupling the gate terminal of PMOS transistor P10 and the gate terminal of NMOS transistor N12 to signal line 1403a. Thus, signal line 1403a and vias 1410a and 1410b electrically couple gates 1316b and 1316i to each other, thereby coupling the gate terminal of PMOS transistor P10, the gate terminal of NMOS transistor N12, and the gate terminal of NMOS transistor N16 to each other, resulting in additional routing resources on other metal layer compared to other approaches.

Other configurations, arrangements on other layout levels or quantities of vias in the set of vias 1410 are within the scope of the present disclosure. Other overlap positions or numbers of overlap positions between one or more of the set of contacts 1306, the set of vias 1310 or 1410, the set of signal lines 1303 or 1403 and the set of gates 1316 are within the scope of the present disclosure, and therefore other electrical connections are within the scope of the present disclosure.

The set of conductive features 1412 includes one or more of conductive features 1412a, 1412b, 1412c, 1412d, 1412e, 1412f, 1412g or 1412h. At least one of conductive features 1412a, 1412b, 1412c, 1412d, 1412e, 1412f, 1412g or 1412h is similar to at least one of conductive features 212a, 212b, 212c, 212d or 212e, and similar detailed description is therefore omitted.

Other configurations, arrangements on other layout levels or quantities of conductive features in the set of conductive features 1412 are within the scope of the present disclosure.

Gate 1316c and gate 1316h are electrically coupled to each other by signal line 1303a, and vias 1310a and 1310b. Gate 1316b and gate 1316i are electrically coupled to each other by signal line 1403a, and vias 1410a and 1410b.

Signal line 1303a electrically couples gates 1316c and 1316h together and signal line 1403a electrically couples gates 1316c and 1316h together, thereby using at least one less upper metal layer track in the set of conductive features 1412, resulting in integrated circuit 1400 with at least a smaller height, smaller area, better IR, EM and RC metal performance or additional routing resources on other metal layers compared to other approaches.

Figure 15:
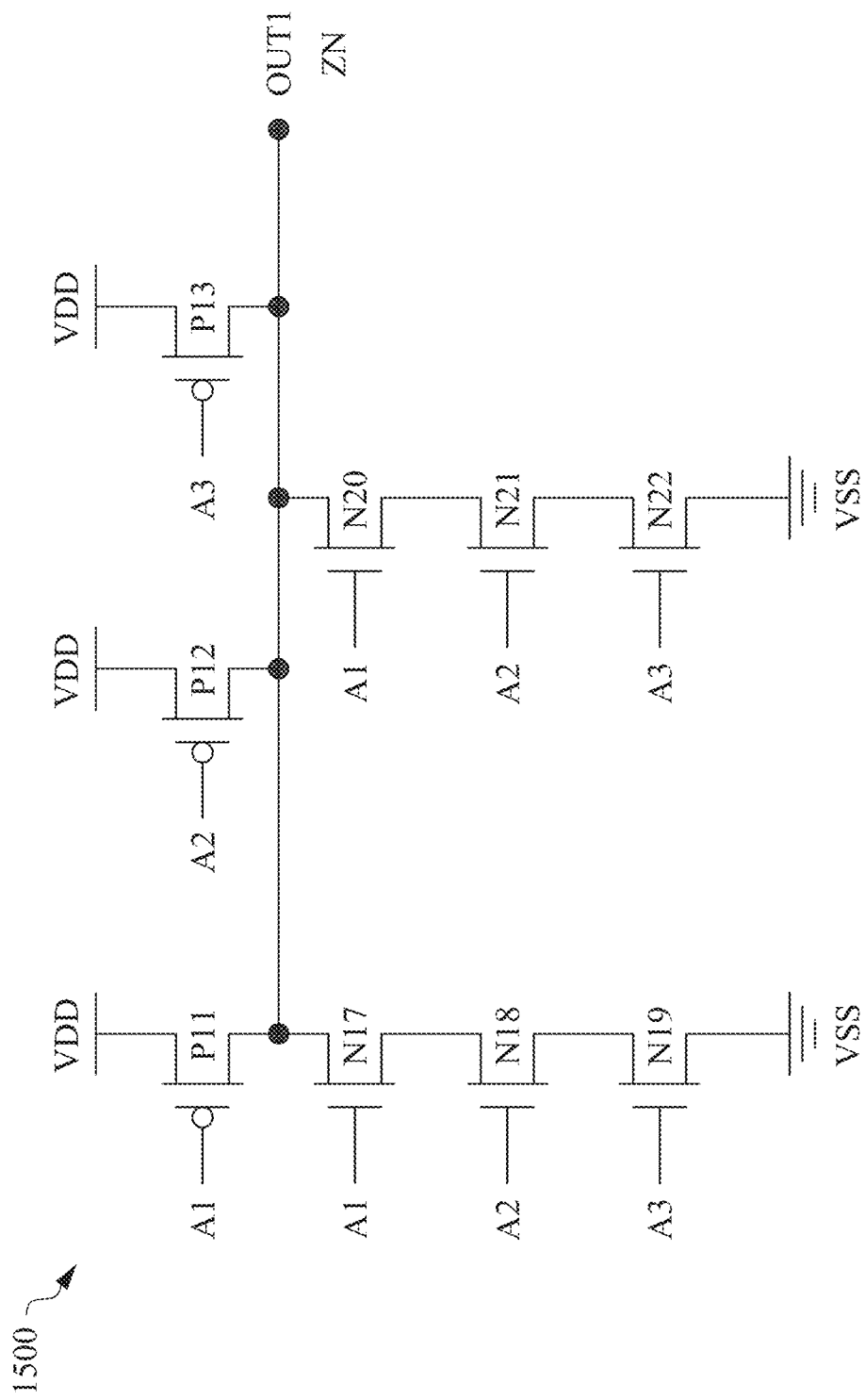
FIG. 15 is a circuit diagram of an integrated circuit, in accordance with some embodiments.

FIG. 15 is a circuit diagram of an integrated circuit 1500, in accordance with some embodiments. In some embodiments, integrated circuit 1500 is a 3-2 NAND logic gate (hereinafter "NAND") circuit. A 3-2 NAND circuit is used for illustration, other types of circuits including other types of NAND circuits are within the scope of the present disclosure.

Integrated circuit 1500 includes PMOS transistors P11, P12 and P13, and NMOS transistors N17, N18, N19, N20, N21 and N22.

A gate terminal of PMOS transistor P11 is configured as an input node (not labelled) configured to receive input signal A1. A gate terminal of NMOS transistor N17 is configured as an input node (not labelled) configured to receive input signal A1. A gate terminal of NMOS transistor N20 is configured as an input node (not labelled) configured to receive input signal A1. In some embodiments, at least two of the gate terminal of PMOS transistor P11, the gate terminal of NMOS transistor N17 or the gate terminal of NMOS transistor N20 are coupled together.

A gate terminal of PMOS transistor P12 is configured as an input node (not labelled) configured to receive an input signal A2. A gate terminal of NMOS transistor N18 is configured as an input node (not labelled) configured to receive input signal A2. A gate terminal of NMOS transistor N21 is configured as an input node (not labelled) configured to receive input signal A2. In some embodiments, at least two of the gate terminal of PMOS transistor P12, the gate terminal of NMOS transistor N18 or the gate terminal of NMOS transistor N21 are coupled together.

A gate terminal of PMOS transistor P13 is configured as an input node (not labelled) configured to receive an input signal A3. A gate terminal of NMOS transistor N19 is configured as an input node (not labelled) configured to receive input signal A3. A gate terminal of NMOS transistor N22 is configured as an input node (not labelled) configured to receive input signal A3. In some embodiments, at least two of the gate terminal of PMOS transistor P13, the gate terminal of NMOS transistor N19 or the gate terminal of NMOS transistor N22 are coupled together.

In some embodiments, at least input signal A1, A2 or A3 is a logically low signal or a logically high signal.

A source terminal of PMOS transistor P11, a source terminal of PMOS transistor P12 and a source terminal of PMOS transistor P13 are coupled to the voltage supply VDD. In some embodiments, the source terminal of PMOS transistor P11, the source terminal of PMOS transistor P12 and the source terminal of PMOS transistor P13 are coupled together.

A drain terminal of PMOS transistor P11, a drain terminal of PMOS transistor P12, a drain terminal of PMOS transistor P13, a drain terminal of NMOS transistor N17, and a drain terminal of NMOS transistor N20 are coupled to each other, and are configured as an output node OUT1.

A source terminal of NMOS transistor N17 and a drain terminal of NMOS transistor N18 are coupled to each other. A source terminal of NMOS transistor N18 and a drain terminal of NMOS transistor N19 are coupled to each other. A source terminal of NMOS transistor N19 is coupled to reference voltage supply VSS.

A source terminal of NMOS transistor N20 and a drain terminal of NMOS transistor N21 are coupled to each other. A source terminal of NMOS transistor N21 and a drain terminal of NMOS transistor N22 are coupled to each other. A source terminal of NMOS transistor N22 is coupled to reference voltage supply VSS. In some embodiments, the source terminal of NMOS transistor N19 and the source terminal of NMOS transistor N22 are coupled together.

Other circuits, other types of transistors, and/or quantities of transistors are within the scope of various embodiments. For example, in some embodiments, integrated circuit 1500 includes other types of NAND circuits, such as a 3-1 NAND circuit. Other values of at least input signal A1, A2 or A3 are within the scope of various embodiments.

Figure 16A:
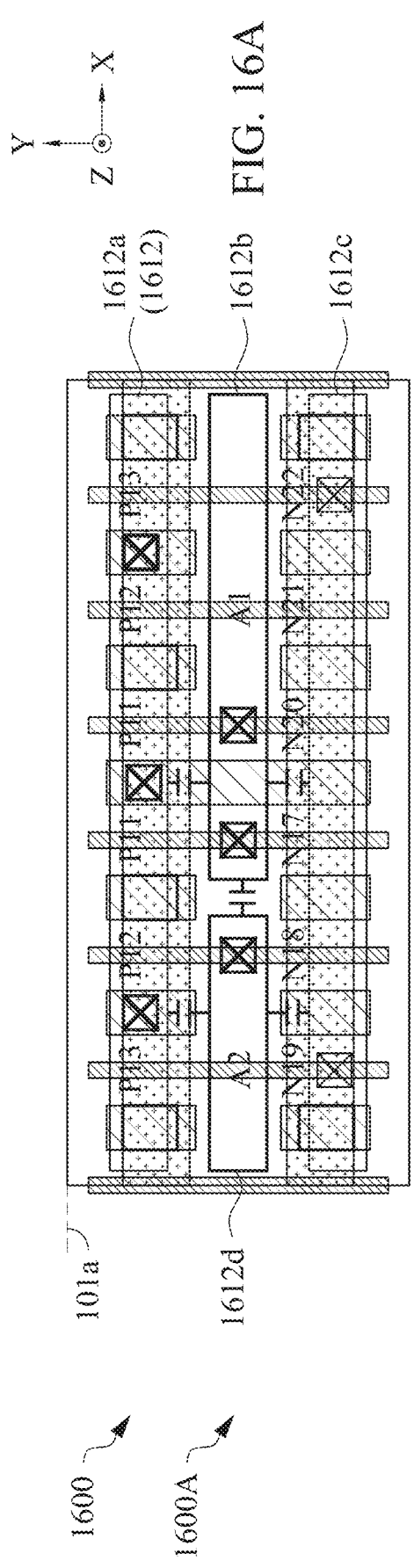
FIGS. 16A-16B are diagrams of an integrated circuit, in accordance with some embodiments.
Figure 16B:
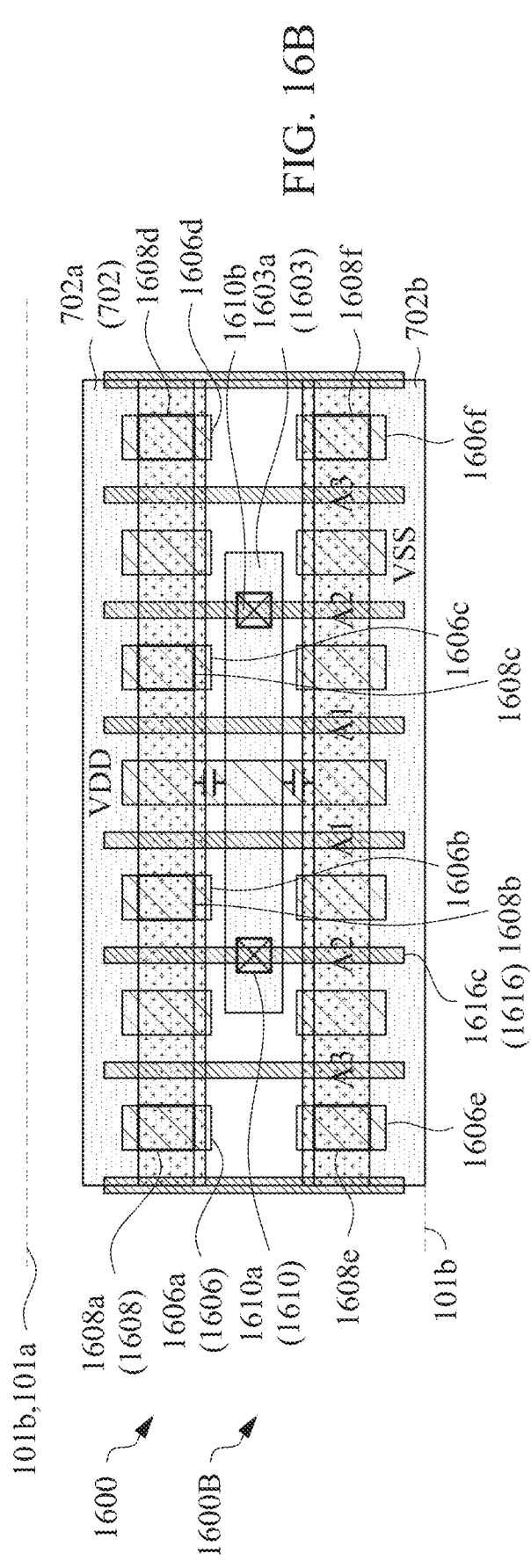

FIGS. 16A-16B are diagrams of an integrated circuit 1600, in accordance with some embodiments.

FIGS. 16A-16B are top views of corresponding portions 1600A-1600B of integrated circuit 1600, simplified for ease of illustration. Integrated circuit 1600 is an embodiment of integrated circuit 1500 with 3 M0 routing tracks (e.g., set of conductive features 1612).

Portion 1600A includes one or more features of integrated circuit 1600 of the VBP level, the OD level, POLY level, the MD level or the M0 level of integrated circuit 1600. Portion 1600B includes one or more features of integrated circuit 1600 of the BP level, the BS level, the VBP level, the VBS level, the POLY level or the MD level of integrated circuit 1600.

For ease of illustration, some of the elements of FIGS. 16A-16B are not labelled in FIGS. 16A-16B. In some embodiments, integrated circuit 1600 includes additional elements not shown in FIGS. 16A-16B.

Integrated circuit 1600 is manufactured by a corresponding layout design similar to integrated circuit 1600. For brevity FIGS. 16A-16B are described as integrated circuit 1600, but in some embodiments, FIGS. 16A-16B also correspond to layout designs similar to layout designs 100, 400, 500A and 500C, structural elements of integrated circuit 1600 also correspond to layout patterns, and structural relationships including alignment, lengths and widths, as well as configurations and layers of a corresponding layout design of integrated circuit 1600 are similar to the structural relationships and configurations and layers of integrated circuit 1600, and similar detailed description will not be described for brevity.

Integrated circuit 1600 is an embodiment of integrated circuit 400 (FIGS. 4A-4B) or integrated circuit 1500.

FIGS. 16A-16B are diagrams of an integrated circuit 1600, in accordance with some embodiments.

FIGS. 16A-16B are top views of corresponding portions 1600A-1600B of integrated circuit 1600, simplified for ease of illustration. Integrated circuit 1600 is an embodiment of integrated circuit 1500 with 3 M0 routing tracks (e.g., set of conductive features 1612).

Portion 1600A includes one or more features of integrated circuit 1600 of the VBP level, the OD level, POLY level, the MD level or the M0 level of integrated circuit 1600. Portion 1600B includes one or more features of integrated circuit 1600 of the BP level, the BS level, the VBP level, the VBS level, the POLY level or the MD level of integrated circuit 1600.

For ease of illustration, some of the elements of FIGS. 16A-16B are not labelled in FIGS. 16A-16B. In some embodiments, integrated circuit 1600 includes additional elements not shown in FIGS. 16A-16B.

Integrated circuit 1600 is manufactured by a corresponding layout design similar to integrated circuit 1600. For brevity FIGS. 16A-16B are described as integrated circuit 1600, but in some embodiments, FIGS. 16A-16B also correspond to layout designs similar to layout designs 100, 400, 500A and 500C, structural elements of integrated circuit 1600 also correspond to layout patterns, and structural relationships including alignment, lengths and widths, as well as configurations and layers of a corresponding layout design of integrated circuit 1600 are similar to the structural relationships and configurations and layers of integrated circuit 1600, and similar detailed description will not be described for brevity.

Integrated circuit 1600 is an embodiment of integrated circuit 400 (FIGS. 4A-4B) or integrated circuit 1500.

In comparison with integrated circuit 400 of FIGS. 4A-4B, set of power rails 702 of integrated circuit 1600 replaces the set of power rails 202, a set of signal lines 1603 replaces the set of signal lines 203, a set of contacts 1606 replaces the set of contacts 406, a set of vias 1608 replaces the set of vias 208 (shown in FIGS. 2A-2B), a set of vias 1610 replaces the set of vias 410, a set of conductive features 1612 replaces the set of conductive features 212, and a set of gates 1616 replaces the set of gates 416, and similar detailed description is therefore omitted.

The set of signal lines 1603 are similar to the set of signal lines 403, and similar detailed description is therefore omitted. The set of signal lines 1603 include at least signal line 1603*a*. The set of signal lines 1603 are configured to provide routing of signals from upper layers of other approaches. Signal line 1603*a* is configured to electrically couple the gates of PMOS transistor P12, the gate of NMOS transistor N18 and the gate of NMOS transistor N21 together, resulting in additional routing resources compared to other approaches. Other connections with other gates for signal line 1603*a* are within the scope of the present disclosure.

Other configurations, arrangements on other layout levels or quantities of structures in the set of power rails 702 or set of signal lines 1603 are within the scope of the present disclosure. In some embodiments, set of signal lines 1603 electrically couple source or drain features of a transistor in FIG. 16B with gate features of another transistor in FIG. 16B. In some embodiments, set of signal lines 1603 electrically couple source or drain features of a transistor in FIG. 16B with source or drain features of another transistor in FIG. 16B.

The set of contacts 1606 includes one or more contacts 1606*a*, 1606*b*, 1606*c*, 1606*d*, 1606*e* or 1606*f*. At least one of contacts 1606*a*, 1606*b*, 1606*c*, 1606*d*, 1606*e* or 1606*f* is similar to at least one of contacts 406*a*, 406*b*, 406*c*, 406*d*, 406*e*, 406*f*, 406*g* or 406*h*, and similar detailed description is therefore omitted.

In some embodiments, contact 1606*a* corresponds to the source terminal of PMOS transistor P13. In some embodiments, contact 1606*b* corresponds to the source terminal of PMOS transistors P12 and P11. In some embodiments, contact 1606*c* corresponds to the source terminal of PMOS transistors P11 and P12. In some embodiments, contact 1606*d* corresponds to the source terminal of PMOS transistor P13.

In some embodiments, contact 1606*e* corresponds to the source terminal of NMOS transistor N19, and contact 1606*f* corresponds to the source terminal of NMOS transistor N22.

Other configurations, arrangements on other layout levels or quantities of contacts in the set of contacts 1606 are within the scope of the present disclosure.

The set of vias 1608 includes one or more vias 1608*a*, 1608*b*, 1608*c*, 1608*d*, 1608*e* or 1608*f*. At least one of vias 1608*a*, 1608*b*, 1608*c*, 1608*d*, 1608*e* or 1608*f* is similar to at least one of vias 208*a* or 208*b*, and similar detailed description is therefore omitted.

In some embodiments, via 1608*a* electrically couples power rail 702*a* and contact 1606*a* to each other, thereby coupling the source terminal of PMOS transistor P13 to supply voltage VDD. In some embodiments, via 1608*b* electrically couples power rail 702*a* and contact 1606*b* to each other, thereby coupling the source terminal of at least PMOS transistor P12 or P11 to supply voltage VDD. In some embodiments, via 1608*c* electrically couples power rail 702*a* and contact 1606*c* to each other, thereby coupling the source terminal of at least PMOS transistor P11 or P12 to supply voltage VDD. In some embodiments, via 1608*d* electrically couples power rail 702*a* and contact 1606*d* to each other, thereby coupling the source terminal of PMOS transistor P13 to supply voltage VDD.

In some embodiments, via 1608*e* electrically couples power rail 702*b* and contact 1606*e* to each other, thereby coupling the source terminal of NMOS transistor N19 to reference supply voltage VSS. In some embodiments, via 1608*f* electrically couples power rail 702*b* and contact 1606*f* to each other, thereby coupling the source terminal of NMOS transistor N22 to reference supply voltage VSS.

Other configurations, arrangements on other layout levels or quantities of vias in the set of vias 1608 are within the scope of the present disclosure.

The set of vias 1610 includes one or more vias 1610*a* or 1610*b*. At least one of vias 1610*a* or 1610*b* is similar to at least one of vias 410*a* or 410*b*, and similar detailed description is therefore omitted.

Via 1610*a* electrically couples signal line 1603*a* and gate 1616*c* to each other, thereby coupling the gate terminal of PMOS transistor P12 and the gate terminal of NMOS transistor N18 to signal line 1603*a*. Via 1610*b* electrically couples signal line 1603*a* and gate 1616*f* to each other, thereby coupling the gate terminal of PMOS transistor P12 and the gate terminal of NMOS transistor N21 to signal line 1603*a*. Thus, signal line 1603*a* and vias 1610*a* and 1610*b* electrically couple gates 1616*c* and 1616*f* to each other, thereby coupling the gate terminal of PMOS transistor P12, the gate terminal of NMOS transistor N18, and the gate terminal of NMOS transistor N21 to each other, resulting in additional routing resources on other metal layer compared to other approaches.

Other configurations, arrangements on other layout levels or quantities of vias in the set of vias 1610 are within the scope of the present disclosure. Other overlap positions or numbers of overlap positions between one or more of the set of contacts 1606, the set of vias 1610, the set of signal lines 1603 and the set of gates 1616 are within the scope of the present disclosure, and therefore other electrical connections are within the scope of the present disclosure.

The set of conductive features 1612 includes one or more of conductive features 1612*a*, 1612*b*, 1612*c* or 1612*d*. At least one of conductive features 1612*a*, 1612*b*, 1612*c* or 1612*d* is similar to at least one of conductive features 212*a*, 212*b*, 212*c*, 212*d* or 212*e*, and similar detailed description is therefore omitted.

Conductive feature 1612*a* electrically couples each of the drain terminals of PMOS transistors P11, P12 and P13 together. Conductive feature 1612*c* electrically couples each of the gate terminals of NMOS transistors N19 and N22 together.

Other configurations, arrangements on other layout levels or quantities of conductive features in the set of conductive features 1612 are within the scope of the present disclosure.

The set of gates 1616 includes one or more gates 1616*a*, 1616*b*, 1616*c*, 1616*d*, 1616*e*, 1616*f*, 1616*g* or 1616*h*. Gates 1616*a*, 1616*b*, 1616*d*-1616*e* and 1616*g*-1616*h* are not labelled in FIGS. 16A-16B for ease of illustration. At least one of gate 1616*a*, 1616*b*, 1616*c*, 1616*d*, 1616*e*, 1616*f*, 1616*g* or 1616*h* is similar to at least one of gates 416*a*, 416*b*, 416*c*, 416*d* or 416*e*, and similar detailed description is therefore omitted.

In some embodiments, gate 1616*c* corresponds to the gate of PMOS transistor P12 and NMOS transistor N18. In some embodiments, gate 1616*f* corresponds to the gate of PMOS transistor P12 and NMOS transistor N21.

In some embodiments, gate 1616*b* corresponds to the gate of PMOS transistor P13 and NMOS transistor N19. In some embodiments, gate 1616*g* corresponds to the gate of PMOS transistor P13 and NMOS transistor N22.

In some embodiments, gate 1616*d* corresponds to the gate of PMOS transistor P11 and NMOS transistor N17. In some embodiments, gate 1616*e* corresponds to the gate of PMOS transistor P11 and NMOS transistor N20.

Gate 1616*c* and gate 1616*f* are electrically coupled to each other by signal line 1603*a*, and vias 1610*a* and 1610*b*.

Signal line 1603*a* electrically couples gates 1616*c* and 1616*f* together, thereby using at least one less upper metal layer track in the set of conductive features 1612, resulting in integrated circuit 1600 with at least a smaller height, smaller area, better IR, EM and RC metal performance or additional routing resources on other metal layers compared to other approaches.

Other configurations, arrangements on other layout levels or quantities of conductive features in the set of gates 1616 are within the scope of the present disclosure.

Figure 17:
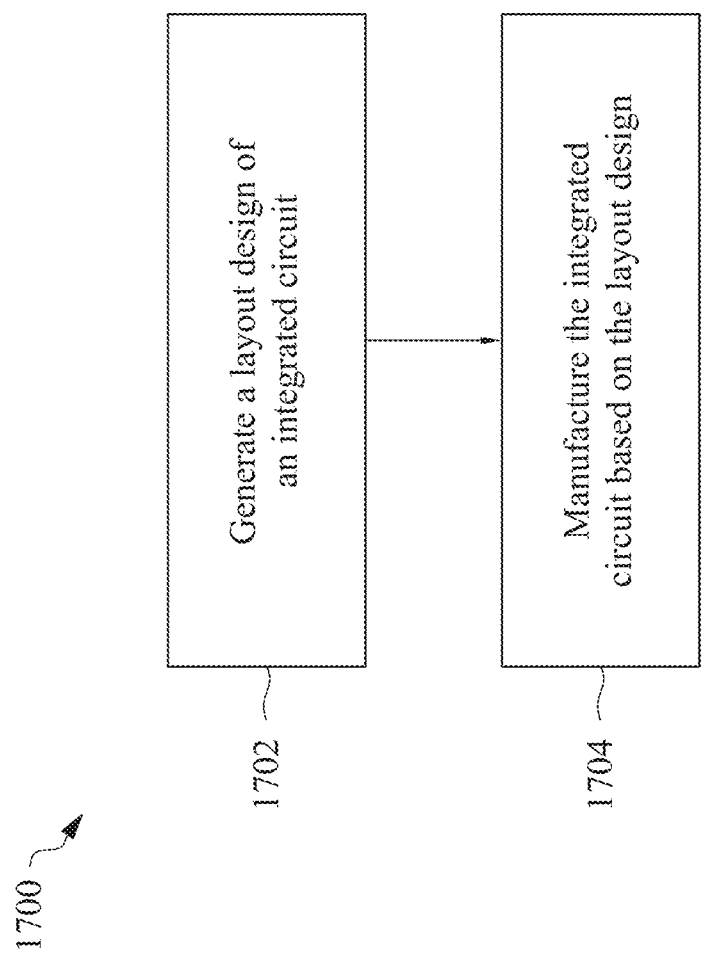
FIG. 17 is a flowchart of a method of forming or manufacturing an integrated circuit in accordance with some embodiments.

FIG. 17 is a flowchart of a method 1700 of forming or manufacturing an integrated circuit in accordance with some embodiments. It is understood that additional operations may be performed before, during, and/or after the method 1700 depicted in FIG. 17, and that some other operations may only be briefly described herein. In some embodiments, the method 1700 is usable to form integrated circuits, such as 200, 400, 500B, 500D, 600-1600 or 1900B. In some embodiments, the method 1700 is usable to form integrated circuits having similar structural relationships as one or more of layout design 100, 300, 500A or 500C.

In operation 1702 of method 1700, a layout design of an integrated circuit is generated. Operation 1702 is performed by a processing device (e.g., processor 2002 (FIG. 20)) configured to execute instructions for generating a layout design. In some embodiments, the layout design of method 1700 includes one or more patterns of at least layout design 100, 300, 500A or 500C, or features similar to at least integrated circuit 700-900, 1100, 1300-1400 or 1600. In some embodiments, the layout design of the present application is in a graphic database system (GDSII) file format.

In operation 1704 of method 1700, the integrated circuit is manufactured based on the layout design. In some embodiments, operation 1704 of method 1700 comprises manufacturing at least one mask based on the layout design, and manufacturing the integrated circuit based on the at least one mask.

Figure 18:
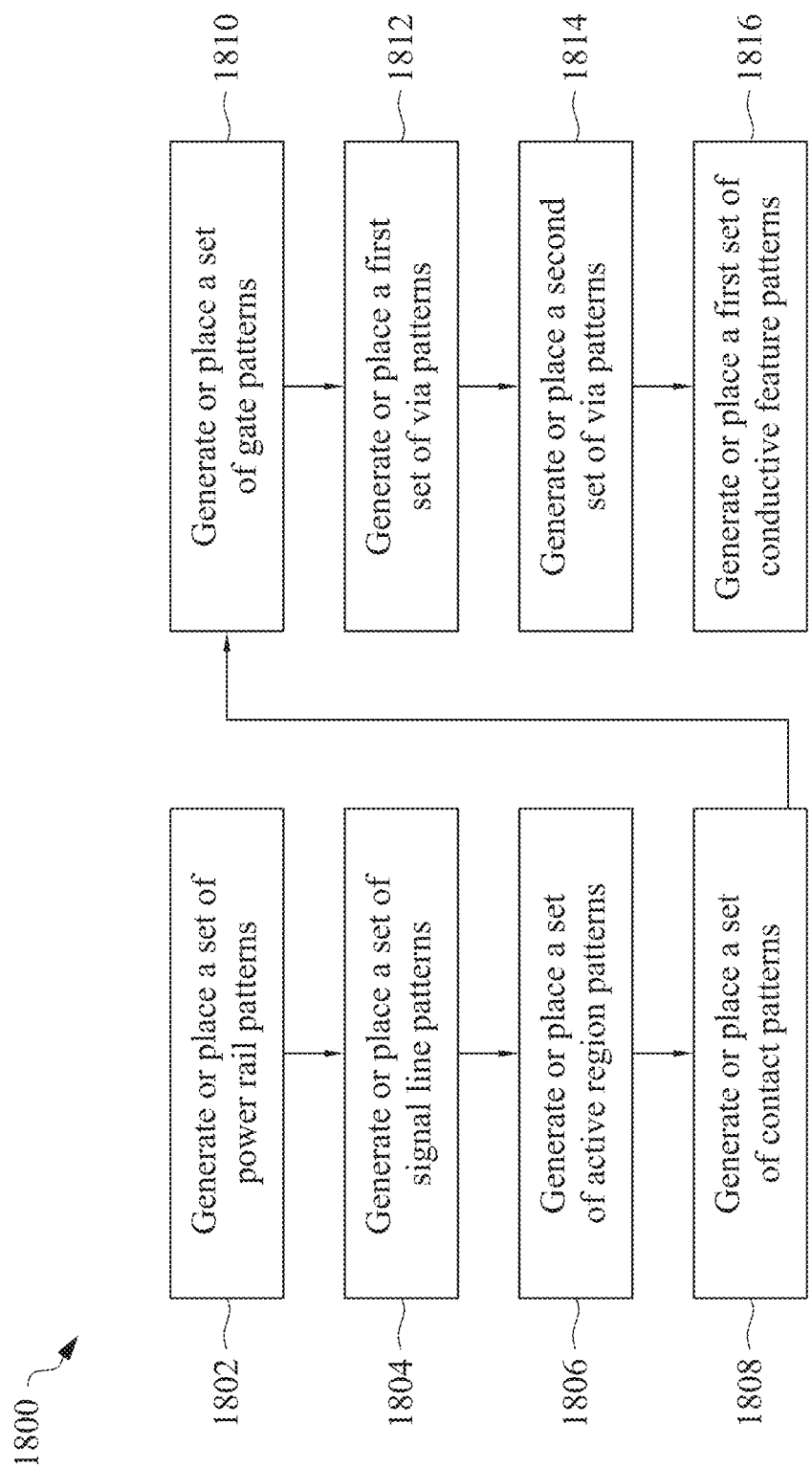
FIG. 18 is a flowchart of a method of generating a layout design of an integrated circuit in accordance with some embodiments.

FIG. 18 is a flowchart of a method 1800 of generating a layout design of an integrated circuit in accordance with some embodiments. It is understood that additional operations may be performed before, during, and/or after the method 1800 depicted in FIG. 18, and that some other processes may only be briefly described herein. In some embodiments, method 1800 is an embodiment of operation 1702 of method 1700. In some embodiments, method 1800 is usable to generate one or more layout patterns of at least layout design 100, 300, 500A or 500C, or one or more patterns similar to at least integrated circuit 200, 400, 500B, 500D, 700-900, 1100, 1300-1400 or 1600. In some embodiments, method 1800 is usable to generate one or more layout patterns having structural relationships including alignment, lengths and widths, as well as configurations and layers of at least layout design 100, 300, 500A or 500C, or one or more patterns similar to at least integrated circuit 200, 400, 500B, 500D, 700-900, 1100, 1300-1400 or 1600, and similar detailed description will not be described in FIG. 18, for brevity.

In operation 1802 of method 1800, a set of power rail patterns is generated or placed on the layout design. In some embodiments, the set of power rail patterns of method 1800 includes at least portions of one or more patterns of the set of power rail patterns 102. In some embodiments, the set of power rail patterns of method 1800 includes at least portions of features similar to set of power rails 702.

In operation 1804 of method 1800, a set of signal line patterns is generated or placed on the layout design. In some embodiments, the set of signal line patterns of method 1800 includes at least portions of one or more patterns of the set of signal line patterns 103. In some embodiments, the set of signal line patterns of method 1800 includes at least portions of features similar to set of signal lines 703, 1103, 1303, 1403 or 1603.

In operation 1806 of method 1800, a set of active region patterns is generated or placed on a layout design. In some embodiments, the set of active region patterns of method 1800 includes at least portions of one or more patterns of the set of active region patterns 104. In some embodiments, the set of active region patterns of method 1800 includes at least portions of features similar to set of active regions 704.

In operation 1808 of method 1800, a set of contact patterns is generated or placed on the layout design. In some embodiments, the set of contact patterns of method 1800 includes at least portions of one or more patterns of the set of contact patterns 106 or 306. In some embodiments, the set of contact patterns of method 1800 includes at least portions of features similar to set of contacts 706, 1106, 1306 or 1606.

In operation 1810 of method 1800, a set of gate patterns is generated or placed on the layout design. In some embodiments, the set of gate patterns of method 1800 includes at least portions of one or more patterns of the set of gate patterns 116 or 316. In some embodiments, the set of gate patterns of method 1800 includes at least portions of features similar to set of gates 716, 1116, 1316 or 1616.

In operation 1812 of method 1800, a first set of via patterns is generated or placed on the layout design. In some embodiments, the first set of via patterns of method 1800 includes at least portions of one or more patterns of the set of via patterns 108. In some embodiments, the first set of via patterns of method 1800 includes at least portions of features similar to set of vias 708, 1108, 1308 or 1608.

In operation 1814 of method 1800, a second set of via patterns is generated or placed on the layout design. In some embodiments, the second set of via patterns of method 1800 includes at least portions of one or more patterns of the set of via patterns 110 or 310. In some embodiments, the second set of via patterns of method 1800 includes at least portions of features similar to set of vias 710, 1110, 1310, 1410 or 1610.

In operation 1816 of method 1800, a first set of conductive feature patterns is generated or placed on the layout design. In some embodiments, the first set of conductive feature patterns of method 1800 includes at least portions of one or more patterns of the set of conductive feature patterns 112, 512 or 514. In some embodiments, the first set of conductive feature patterns of method 1800 includes at least portions of features similar to set of conductive features 712, 812, 912, 1112, 1312, 1412 or 1612.

Figure 19:
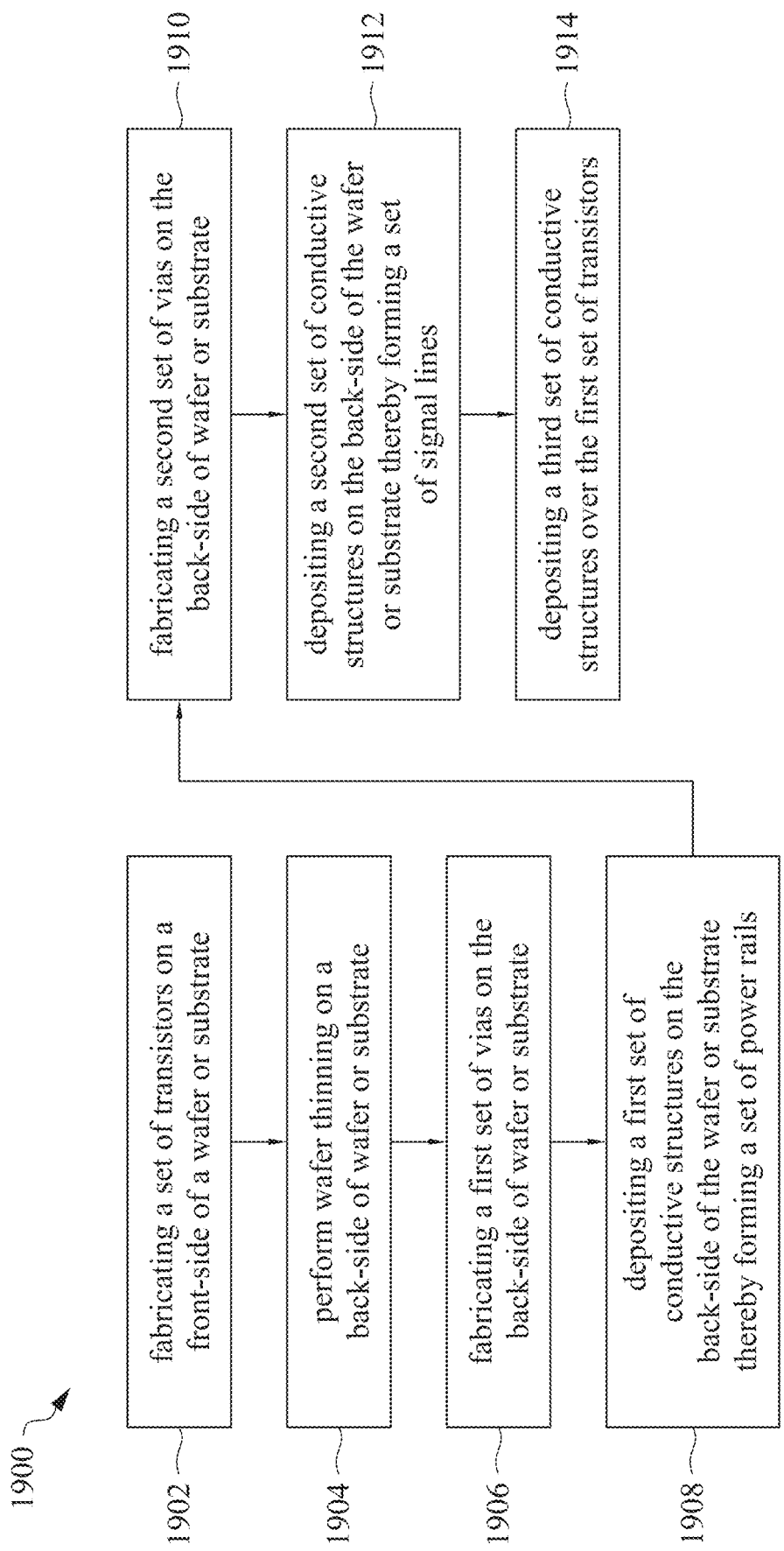
FIG. 19 is a functional flow chart of a method of manufacturing an IC device, in accordance with some embodiments.

FIG. 19 is a functional flow chart of a method of manufacturing an IC device, in accordance with some embodiments. It is understood that additional operations may be performed before, during, and/or after the method 1900 depicted in FIG. 19, and that some other processes may only be briefly described herein.

In some embodiments, method 1900 is an embodiment of operation 1704 of method 1700. In some embodiments, the method 1900 is usable to manufacture or fabricate at least integrated circuit 200, 400, 500B, 500D, 700-1600 or an integrated circuit with similar features as at least layout design 100, 300, 500A or 500C. In some embodiments, other order of operations of method 1900 is within the scope of the present disclosure. Method 1900 includes exemplary operations, but the operations are not necessarily performed in the order shown. Operations may be added, replaced, changed order, and/or eliminated as appropriate, in accordance with the spirit and scope of disclosed embodiments.

In operation 1902 of method 1900, a first set of transistors is fabricated in a semiconductor wafer or substrate. In some embodiments, the first set of transistors of method 1900 includes one or more of NMOS transistors N1-N22, the NMOS transistors of FIG. 15, PMOS transistors P1-P13 or the PMOS transistors of FIG. 15.

In some embodiments, operation 1902 includes fabricating source and drain regions of the first set of transistors in a first well. In some embodiments, the first well comprises p-type dopants. In some embodiments, the p-dopants include boron, aluminum or other suitable p-type dopants. In some embodiments, the first well comprises an epi-layer grown over a substrate. In some embodiments, the epi-layer is doped by adding dopants during the epitaxial process. In some embodiments, the epi-layer is doped by ion implantation after the epi-layer is formed. In some embodiments, the first well is formed by doping the substrate. In some embodiments, the doping is performed by ion implantation. In some embodiments, the first well has a dopant concentration ranging from $1 \times 10^{12}$ atoms/cm3 to $1 \times 10^{14}$ atoms/cm3.

In some embodiments, the first well comprises n-type dopants. In some embodiments, the n-type dopants include phosphorus, arsenic or other suitable n-type dopants. In some embodiments, the n-type dopant concentration ranges from about $1 \times 10^{12}$ atoms/cm$^3$ to about $1 \times 10^{14}$ atoms/cm$^3$.

In some embodiments, the formation of the source/drain features includes removing a portion of the substrate to form recesses at an edge of spacers, and a filling process is then performed by filling the recesses in the substrate. In some embodiments, the recesses are etched, for example, by a wet etching or a dry etching, after removal of a pad oxide layer or a sacrificial oxide layer. In some embodiments, the etch process is performed to remove a top surface portion of the active region adjacent to an isolation region, such as an STI region. In some embodiments, the filling process is performed by an epitaxy or epitaxial (epi) process. In some embodiments, the recesses are filled using a growth process which is concurrent with an etch process where a growth rate of the growth process is greater than an etch rate of the etch process. In some embodiments, the recesses are filled using a combination of growth process and etch process. For example, a layer of material is grown in the recess and then the grown material is subjected to an etch process to remove a portion of the material. Then a subsequent growth process is performed on the etched material until a desired thickness of the material in the recess is achieved. In some embodiments, the growth process continues until a top surface of the material is above the top surface of the substrate. In some embodiments, the growth process is continued until the top surface of the material is co-planar with the top surface of the substrate. In some embodiments, a portion of the first well is removed by an isotropic or an anisotropic etch process. The etch process selectively etches the first well without etching a gate structure and any spacers. In some embodiments, the etch process is performed using a reactive ion etch (RIE), wet etching, or other suitable techniques. In some embodiments, a semiconductor material is deposited in the recesses to form the source/drain features. In some embodiments, an epi process is performed to deposit the semiconductor material in the recesses. In some embodiments, the epi process includes a selective epitaxy growth (SEG) process, CVD process, molecular beam epitaxy (MBE), other suitable processes, and/or combination thereof. The epi process uses gaseous and/or liquid precursors, which interacts with a composition of substrate. In some embodiments, the source/drain features include epitaxially grown silicon (epi Si), silicon carbide, or silicon germanium. Source/drain features of the IC device associated with the gate structure are in-situ doped or undoped during the epi process in some instances. When source/drain features are undoped during the epi process, source/drain features are doped during a subsequent process in some instances. The subsequent doping process is achieved by an ion implantation, plasma immersion ion implantation, gas and/or solid source diffusion, other suitable processes, and/or combination thereof. In some embodiments, source/drain features are further exposed to annealing processes after forming source/drain features and/or after the subsequent doping process.

In some embodiments, operation 1902 further includes forming contacts of the first set of transistors. In some embodiments, operation 1902 further includes forming a gate region of the first set of transistors. In some embodiments, the gate region is between the drain region and the source region. In some embodiments, the gate region is over the first well and the substrate. In some embodiments, fabricating the gate regions of operation 1902 includes performing one or more deposition processes to form one or more dielectric material layers. In some embodiments, a deposition process includes a chemical vapor deposition (CVD), a plasma enhanced CVD (PECVD), an atomic layer deposition (ALD), or other process suitable for depositing one or more material layers. In some embodiments, fabricating the gate regions includes performing one or more deposition processes to form one or more conductive material layers. In some embodiments, fabricating the gate regions includes forming gate electrodes or dummy gate electrodes. In some embodiments, fabricating the gate regions includes depositing or growing at least one dielectric layer, e.g., gate dielectric. In some embodiments, gate regions are formed using a doped or non-doped polycrystalline silicon (or polysilicon). In some embodiments, the gate regions include a metal, such as Al, Cu, W, Ti, Ta, TiN, TaN, NiSi, CoSi, other suitable conductive materials, or combinations thereof.

In operation 1904 of method 1900, thinning is performed on the back-side of the wafer or substrate. In some embodiments, operation 1904 includes a thinning process performed on the back-side of the semiconductor wafer or substrate. In some embodiments, the thinning process includes a grinding operation and a polishing operation (such as chemical mechanical polishing (CMP)) or other suitable processes. In some embodiments, after the thinning process, a wet etching operation is performed to remove defects formed on the backside of the semiconductor wafer or substrate.

In operation 1906 of method 1900, a first set of vias are fabricated in a back-side of the wafer or substrate opposite from the front-side. In some embodiments, operation 1906 includes forming a first set of self-aligned contacts (SACs) in an insulating layer over the back-side of the wafer. In some embodiments, the first set of vias of method 1900 includes at least portions of one or more of the set of vias 208, 708, 1108, 1308 or 1608.

In operation 1908 of method 1900, a first set of conductive structures is deposited on the back-side of the wafer or substrate thereby forming a set of power rails. In some embodiments, operation 1906 includes at least depositing a first set of conductive regions over the back-side of the integrated circuit thereby forming a set of back-side power rails electrically connected to a first set of contacts of the set of transistors by the first set of vias.

In some embodiments, the set of power rails of method 1900 includes at least portions of one or more of the set of power rails 202 or 702. In some embodiments, the first set of contacts of method 1900 includes at least portions of one or more of the set of contacts 206, 406, 706, 1106, 1306 or 1606.

In operation 1910 of method 1900, a second set of vias are fabricated in the back-side of the wafer or substrate. In some embodiments, operation 1910 includes forming a second set of self-aligned contacts (SACs) in the insulating layer over the back-side of the wafer. In some embodiments, the second set of vias of method 1900 includes at least portions of one or more of the set of vias 210 or 710. In some embodiments, the second set of vias of method 1900 includes at least portions of one or more of the set of vias 410, 1110, 1310, 1410 or 1610.

In operation 1912 of method 1900, a second set of conductive structures is deposited on the back-side of the wafer or substrate thereby forming a set of signal lines.

In some embodiments, operation 1912 includes at least depositing a second set of conductive regions over the back-side of the integrated circuit thereby forming a set of back-side signal lines electrically connected to a second set of contacts of the set of transistors by the second set of vias. In some embodiments, the set of signal lines of method 1900 includes at least portions of one or more of the set of signal lines 203 or 703. In some embodiments, the second set of contacts of method 1900 includes at least portions of one or more of the set of contacts 206, 406, 706, 1106, 1306 or 1606.

In some embodiments, operation 1912 includes at least depositing the second set of conductive regions over the back-side of the integrated circuit thereby forming a set of back-side signal lines electrically connected to a set of gates of the set of transistors by the second set of vias.

In some embodiments, the set of signal lines of method 1900 includes at least portions of one or more of the set of signal lines 203, 1103, 1303, 1403 or 1603. In some embodiments, the set of gates of method 1900 includes at least portions of one or more of the set of gates 216, 416, 716, 1116, 1316 or 1616.

In some embodiments, operation 1912 further includes at least electrically connecting the set of signal lines to the second set of contacts of the set of transistors by the second set of vias, or electrically connecting the set of signal lines to at least the set of gates of the set of transistors by the second set of vias.

In operation 1914 of method 1900, a third set of conductive structures is deposited over the first set of transistors. In some embodiments, the third set of conductive structures of method 1900 includes at least portions of one or more of the set of conductive features 212, 512', 514', 712, 812, 912, 1112, 1312, 1412 or 1612.

In some embodiments, one or more of operations 1906, 1908, 1910, 1912 or 1914 of method 1900 include using a combination of photolithography and material removal processes to form openings in an insulating layer (not shown) over the substrate. In some embodiments, the photolithography process includes patterning a photoresist, such as a positive photoresist or a negative photoresist. In some embodiments, the photolithography process includes forming a hard mask, an antireflective structure, or another suitable photolithography structure. In some embodiments, the material removal process includes a wet etching process, a dry etching process, an RIE process, laser drilling or another suitable etching process. The openings are then filled with conductive material, e.g., copper, aluminum, titanium, nickel, tungsten, or other suitable conductive material. In some embodiments, the openings are filled using CVD, PVD, sputtering, ALD or other suitable formation process.

Figure 21:
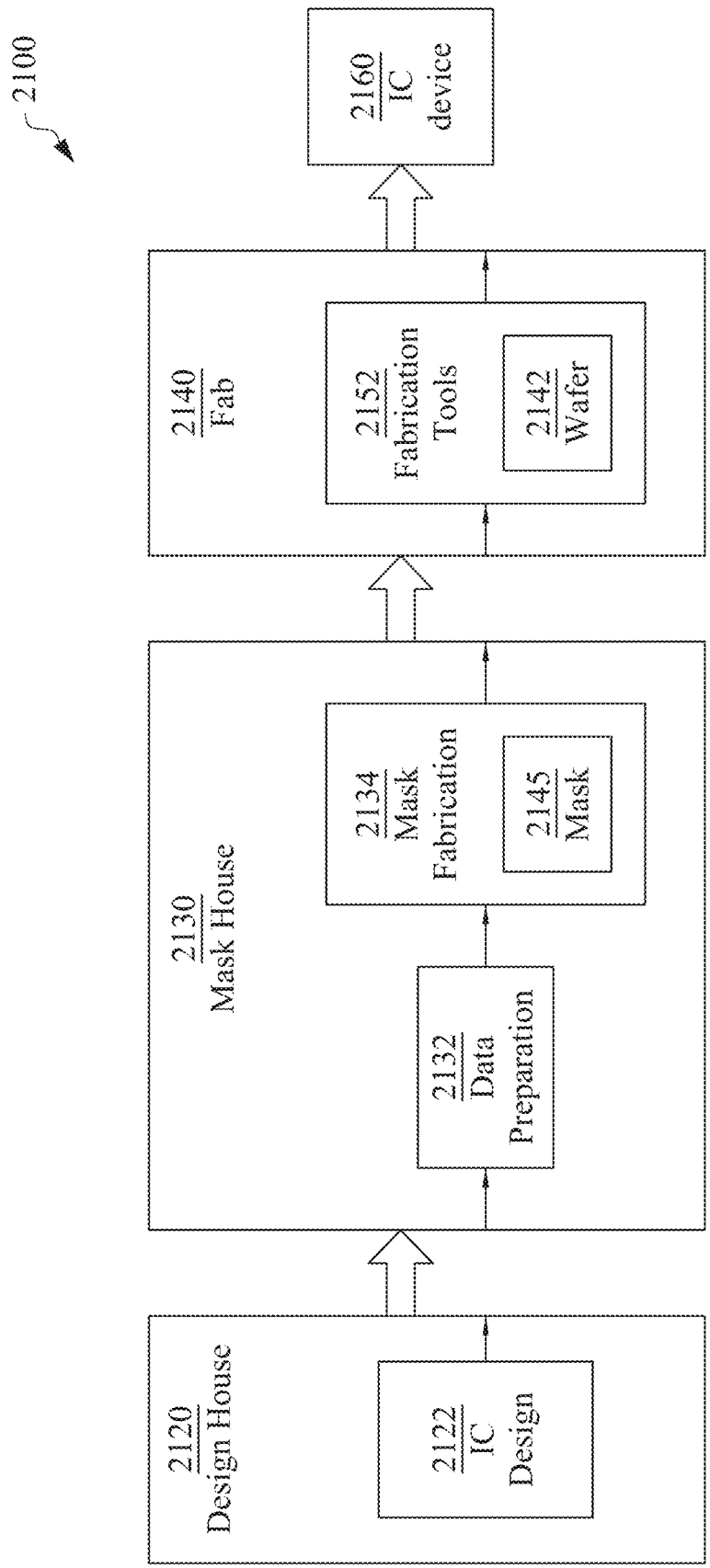
FIG. 21 is a block diagram of an integrated circuit (IC) manufacturing system, and an IC manufacturing flow associated therewith, in accordance with at least one embodiment of the present disclosure.

In some embodiments, at least one or more operations of method 1900 is performed by system 2100 of FIG. 21. In some embodiments, at least one method(s), such as method 1900 discussed above, is performed in whole or in part by at least one manufacturing system, including system 2100. One or more of the operations of method 1900 is performed by IC fab 2140 (FIG. 21) to fabricate IC device 2160. In some embodiments, one or more of the operations of method 1900 is performed by fabrication tools 2152 to fabricate wafer 2142.

In some embodiments, one or more of the operations of method 1700, 1800 or 1900 is not performed. One or more of the operations of methods 1700-1800 is performed by a processing device configured to execute instructions for manufacturing an integrated circuit, such as integrated circuit 200, 400, 500B, 500D, 700-1600. In some embodiments, one or more operations of methods 1700-1800 is performed using a same processing device as that used in a different one or more operations of methods 1700-1800. In some embodiments, a different processing device is used to perform one or more operations of methods 1700-1800 from that used to perform a different one or more operations of methods 1700-1800. In some embodiments, other order of operations of method 1700, 1800 or 1900 is within the scope of the present disclosure. Method 1700, 1800 or 1900 includes exemplary operations, but the operations are not necessarily performed in the order shown. Operations in method 1700, 1800 or 1900 may be added, replaced, changed order, and/or eliminated as appropriate, in accordance with the spirit and scope of disclosed embodiments.

Figure 20:
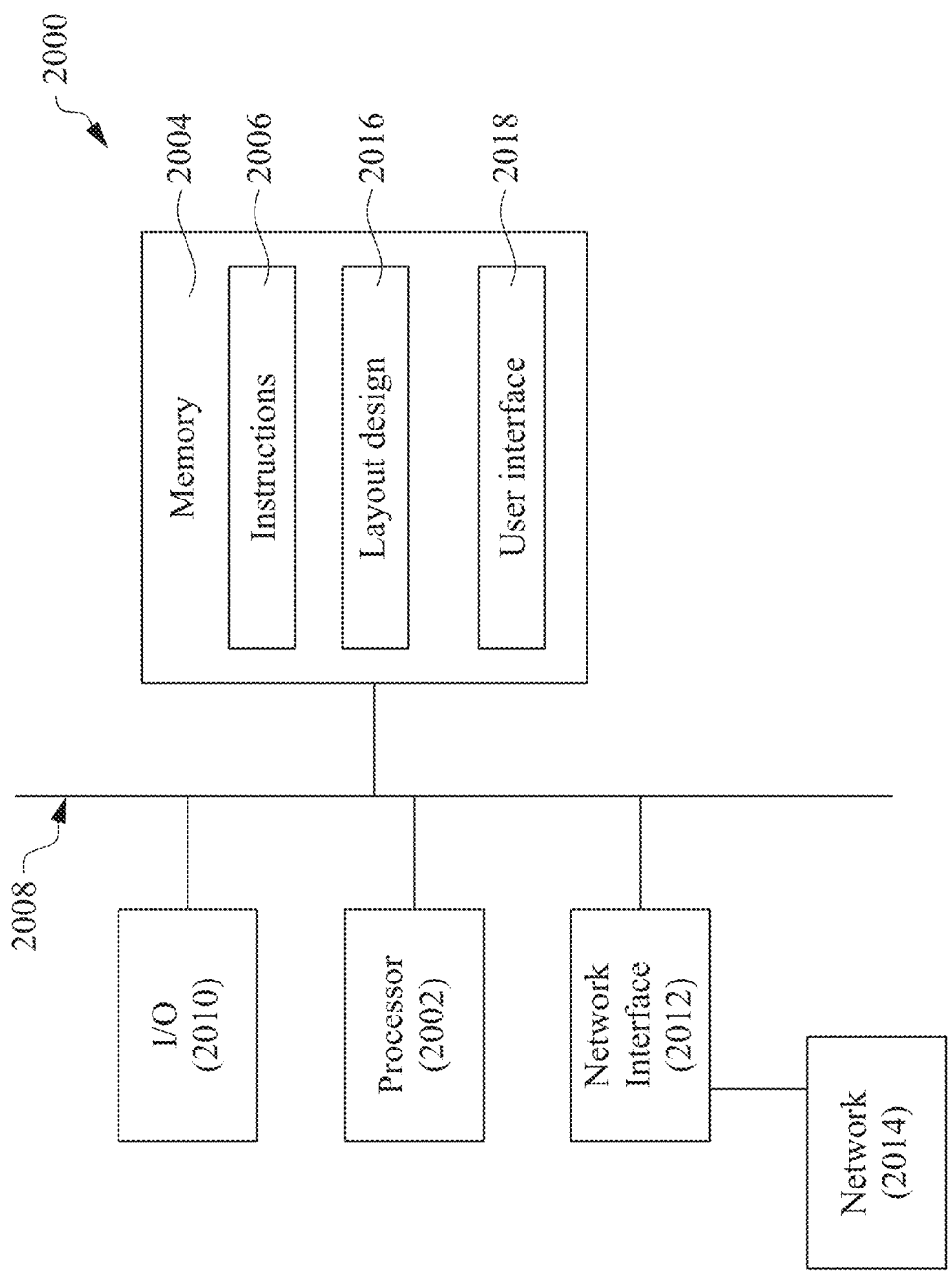
FIG. 20 is a schematic view of a system for designing an IC layout design and manufacturing an IC circuit in accordance with some embodiments.

FIG. 20 is a schematic view of a system 2000 for designing an IC layout design and manufacturing an IC circuit in accordance with some embodiments. In some embodiments, system 2000 generates or places one or more IC layout designs described herein. System 2000 includes a hardware processor 2002 and a non-transitory, computer readable storage medium 2004 (e.g., memory 2004) encoded with, i.e., storing, the computer program code 2006, i.e., a set of executable instructions 2006. Computer readable storage medium 2004 is configured for interfacing with manufacturing machines for producing the integrated circuit. The processor 2002 is electrically coupled to the computer readable storage medium 2004 via a bus 2008. The processor 2002 is also electrically coupled to an I/O interface 2010 by bus 2008. A network interface 2012 is also electrically connected to the processor 2002 via bus 2008. Network interface 2012 is connected to a network 2014, so that processor 2002 and computer readable storage medium 2004 are capable of connecting to external elements via network 2014. The processor 2002 is configured to execute the computer program code 2006 encoded in the computer readable storage medium 2004 in order to cause system 2000 to be usable for performing a portion or all of the operations as described in method 1800.

In some embodiments, the processor 2002 is a central processing unit (CPU), a multi-processor, a distributed processing system, an application specific integrated circuit (ASIC), and/or a suitable processing unit.

In some embodiments, the computer readable storage medium 2004 is an electronic, magnetic, optical, electromagnetic, infrared, and/or a semiconductor system (or apparatus or device). For example, the computer readable storage medium 2004 includes a semiconductor or solid-state memory, a magnetic tape, a removable computer diskette, a random access memory (RAM), a read-only memory (ROM), a rigid magnetic disk, and/or an optical disk. In some embodiments using optical disks, the computer readable storage medium 2004 includes a compact disk-read only memory (CD-ROM), a compact disk-read/write (CD-R/W), and/or a digital video disc (DVD).

In some embodiments, the storage medium 2004 stores the computer program code 2006 configured to cause system 2000 to perform method 1800. In some embodiments, the storage medium 2004 also stores information needed for performing method 1800 as well as information generated during performing method 1800, such as layout design 2016, user interface 2018 and fabrication unit 2020, and/or a set of executable instructions to perform the operation of method 1800. In some embodiments, layout design 2016 comprises one or more of layout patterns of at least layout design 100, 300, 500A or 500C, or features similar to at least integrated circuit 700-900, 1100, 1300-1400, or 1600.

In some embodiments, the storage medium 2004 stores instructions (e.g., computer program code 2006) for interfacing with manufacturing machines. The instructions (e.g., computer program code 2006) enable processor 2002 to generate manufacturing instructions readable by the manufacturing machines to effectively implement method 1800 during a manufacturing process.

System 2000 includes I/O interface 2010. I/O interface 2010 is coupled to external circuitry. In some embodiments, I/O interface 2010 includes a keyboard, keypad, mouse, trackball, trackpad, and/or cursor direction keys for communicating information and commands to processor 2002.

System 2000 also includes network interface 2012 coupled to the processor 2002. Network interface 2012 allows system 2000 to communicate with network 2014, to which one or more other computer systems are connected. Network interface 2012 includes wireless network interfaces such as BLUETOOTH, WIFI, WIMAX, GPRS, or WCDMA; or wired network interface such as ETHERNET, USB, or IEEE-2094. In some embodiments, method 1800 is implemented in two or more systems 2000, and information such as layout design, and user interface are exchanged between different systems 2000 by network 2014.

System 2000 is configured to receive information related to a layout design through I/O interface 2010 or network interface 2012. The information is transferred to processor 2002 by bus 2008 to determine a layout design for producing at least integrated circuit 200, 400, 500B, 500D, or 600-1600 or 1900B. The layout design is then stored in computer readable medium 2004 as layout design 2016. System 2000 is configured to receive information related to a user interface through I/O interface 2010 or network interface 2012. The information is stored in computer readable medium 2004 as user interface 2018. System 2000 is configured to receive information related to a fabrication unit through I/O interface 2010 or network interface 2012. The information is stored in computer readable medium 2004 as fabrication unit 2020. In some embodiments, the fabrication unit 2020 includes fabrication information utilized by system 2000. In some embodiments, the fabrication unit 2020 corresponds to mask fabrication 2134 of FIG. 21.

In some embodiments, method 1800 is implemented as a standalone software application for execution by a processor. In some embodiments, method 1800 is implemented as a software application that is a part of an additional software application. In some embodiments, method 1800 is implemented as a plug-in to a software application. In some embodiments, method 1800 is implemented as a software application that is a portion of an EDA tool. In some embodiments, method 1800 is implemented as a software application that is used by an EDA tool. In some embodiments, the EDA tool is used to generate a layout of the integrated circuit device. In some embodiments, the layout is stored on a non-transitory computer readable medium. In some embodiments, the layout is generated using a tool such as VIRTUOSO® available from CADENCE DESIGN SYSTEMS, Inc., or another suitable layout generating tool. In some embodiments, the layout is generated based on a netlist which is created based on the schematic design. In some embodiments, method 1800 is implemented by a manufacturing device to manufacture an integrated circuit using a set of masks manufactured based on one or more layout designs generated by system 2000. In some embodiments, system 2000 is a manufacturing device configured to manufacture an integrated circuit using a set of masks manufactured based on one or more layout designs of the present disclosure. In some embodiments, system 2000 of FIG. 20 generates layout designs of an integrated circuit that are smaller than other approaches. In some embodiments, system 2000 of FIG. 20 generates layout designs of integrated circuit structure that occupy less area and provide better routing resources than other approaches.

FIG. 21 is a block diagram of an integrated circuit (IC) manufacturing system 2100, and an IC manufacturing flow associated therewith, in accordance with at least one embodiment of the present disclosure. In some embodiments, based on a layout diagram, at least one of (A) one or more semiconductor masks or (B) at least one component in a layer of a semiconductor integrated circuit is fabricated using manufacturing system 2100.

In FIG. 21, IC manufacturing system 2100 (hereinafter "system 2100") includes entities, such as a design house 2120, a mask house 2130, and an IC manufacturer/fabricator ("fab") 2140, that interact with one another in the design, development, and manufacturing cycles and/or services related to manufacturing an IC device 2160. The entities in system 2100 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, one or more of design house 2120, mask house 2130, and IC fab 2140 is owned by a single larger company. In some embodiments, one or more of design house 2120, mask house 2130, and IC fab 2140 coexist in a common facility and use common resources.

Design house (or design team) 2120 generates an IC design layout 2122. IC design layout 2122 includes various geometrical patterns designed for an IC device 2160. The geometrical patterns correspond to patterns of metal, oxide, or semiconductor layers that make up the various components of IC device 2160 to be fabricated. The various layers combine to form various IC features. For example, a portion of IC design layout 2122 includes various IC features, such as an active region, gate electrode, source electrode and drain electrode, metal lines or vias of an interlayer interconnection, and openings for bonding pads, to be formed in a semiconductor substrate (such as a silicon wafer) and various material layers disposed on the semiconductor substrate. Design house 2120 implements a proper design procedure to form IC design layout 2122. The design procedure includes one or more of logic design, physical design or place and route. IC design layout 2122 is presented in one or more data files having information of the geometrical patterns. For example, IC design layout 2122 can be expressed in a GDSII file format or DFII file format.

Mask house 2130 includes data preparation 2132 and mask fabrication 2134. Mask house 2130 uses IC design layout 2122 to manufacture one or more masks 2145 to be used for fabricating the various layers of IC device 2160 according to IC design layout 2122. Mask house 2130 performs mask data preparation 2132, where IC design layout 2122 is translated into a representative data file (RDF). Mask data preparation 2132 provides the RDF to mask fabrication 2134. Mask fabrication 2134 includes a mask writer. A mask writer converts the RDF to an image on a substrate, such as a mask (reticle) 2145 or a semiconductor wafer 2142. The design layout 2122 is manipulated by mask data preparation 2132 to comply with particular characteristics of the mask writer and/or requirements of IC fab 2140. In FIG. 21, mask data preparation 2132 and mask fabrication 2134 are illustrated as separate elements. In some embodiments, mask data preparation 2132 and mask fabrication 2134 can be collectively referred to as mask data preparation.

In some embodiments, mask data preparation 2132 includes optical proximity correction (OPC) which uses lithography enhancement techniques to compensate for image errors, such as those that can arise from diffraction, interference, other process effects and the like. OPC adjusts IC design layout 2122. In some embodiments, mask data preparation 2132 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 2132 includes a mask rule checker (MRC) that checks the IC design layout that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout to compensate for limitations during mask fabrication 2134, which may undo part of the modifications performed by OPC in order to meet mask creation rules.

In some embodiments, mask data preparation 2132 includes lithography process checking (LPC) that simulates processing that will be implemented by IC fab 2140 to fabricate IC device 2160. LPC simulates this processing based on IC design layout 2122 to create a simulated manufactured device, such as IC device 2160. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus (DOF), mask error enhancement factor (MEEF), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout 2122.

It should be understood that the above description of mask data preparation 2132 has been simplified for the purposes of clarity. In some embodiments, data preparation 2132 includes additional features such as a logic operation (LOP) to modify the IC design layout according to manufacturing rules. Additionally, the processes applied to IC design layout 2122 during data preparation 2132 may be executed in a variety of different orders.

After mask data preparation 2132 and during mask fabrication 2134, a mask 2145 or a group of masks 2145 are fabricated based on the modified IC design layout 2122. In some embodiments, mask fabrication 2134 includes performing one or more lithographic exposures based on IC design 2122. In some embodiments, an electron-beam (e-beam) or a mechanism of multiple e-beams is used to form a pattern on a mask (photomask or reticle) 2145 based on the modified IC design layout 2122. The mask 2145 can be formed in various technologies. In some embodiments, the mask 2145 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary version of mask 2145 includes a transparent substrate (e.g., fused quartz) and an opaque material (e.g., chromium) coated in the opaque regions of the binary mask. In another example, the mask 2145 is formed using a phase shift technology. In the phase shift mask (PSM) version of mask 2145, various features in the pattern formed on the mask are configured to have proper phase difference to enhance the resolution and imaging quality. In various examples, the phase shift mask can be attenuated PSM or alternating PSM. The mask(s) generated by mask fabrication 2134 is used in a variety of processes. For example, such a mask(s) is used in an ion implantation process to form various doped regions in the semiconductor wafer, in an etching process to form various etching regions in the semiconductor wafer, and/or in other suitable processes.

IC fab 2140 is an IC fabrication entity that includes one or more manufacturing facilities for the fabrication of a variety of different IC products. In some embodiments, IC Fab 2140 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry entity.

IC fab 2140 includes wafer fabrication tools 2152 (hereinafter "fabrication tools 2152") configured to execute various manufacturing operations on semiconductor wafer 2142 such that IC device 2160 is fabricated in accordance with the mask(s), e.g., mask 2145. In various embodiments, fabrication tools 2152 include one or more of a wafer stepper, an ion implanter, a photoresist coater, a process chamber, e.g., a CVD chamber or LPCVD furnace, a CMP system, a plasma etch system, a wafer cleaning system, or other manufacturing equipment capable of performing one or more suitable manufacturing processes as discussed herein.

IC fab 2140 uses mask(s) 2145 fabricated by mask house 2130 to fabricate IC device 2160. Thus, IC fab 2140 at least indirectly uses IC design layout 2122 to fabricate IC device 2160. In some embodiments, a semiconductor wafer 2142 is fabricated by IC fab 2140 using mask(s) 2145 to form IC device 2160. In some embodiments, the IC fabrication includes performing one or more lithographic exposures based at least indirectly on IC design 2122. Semiconductor wafer 2142 includes a silicon substrate or other proper substrate having material layers formed thereon. Semiconductor wafer 2142 further includes one or more of various doped regions, dielectric features, multilevel interconnects, and the like (formed at subsequent manufacturing steps).

System 2100 is shown as having design house 2120, mask house 2130 or IC fab 2140 as separate components or entities. However, it is understood that one or more of design house 2120, mask house 2130 or IC fab 2140 are part of the same component or entity.

Details regarding an integrated circuit (IC) manufacturing system (e.g., system 2100 of FIG. 21), and an IC manufacturing flow associated therewith are found, e.g., in U.S. Pat. No. 9,256,709, granted Feb. 9, 2016, U.S. Pre-Grant Publication No. 20150278429, published Oct. 1, 2015, U.S. Pre-Grant Publication No. 20140040838, published Feb. 6, 2014, and U.S. Pat. No. 7,260,442, granted Aug. 21, 2007, the entireties of each of which are hereby incorporated by reference.

One aspect of this description relates to an integrated circuit. In some embodiments, the integrated circuit includes a first power rail, a conductive structure, a first active region of a first set of transistors and a second active region of a second set of transistors. In some embodiments, the first power rail is on a back-side of a substrate, extends in a first direction, and is configured to supply a first supply voltage. In some embodiments, the first active region extends in the first direction, and is on a first level of a front-side of the substrate opposite from the back-side. In some embodiments, the second active region extends in the first direction, is on the first level of the front-side of the substrate, and is separated from the first active region in a second direction different from the first direction. In some embodiments, the conductive structure is on the back-side of the substrate, extending in the first direction, and is electrically coupled to the first active region and the second active region.

Another aspect of this description relates to an integrated circuit. In some embodiments, the integrated circuit includes a first power rail, a first signal line, a first gate and a second gate. In some embodiments, the first power rail is on a back-side of a substrate, extends in a first direction, and is configured to supply a first supply voltage. In some embodiments, the first signal line is on the back-side of the substrate, and extends in the first direction. In some embodiments, the first gate extends in a second direction different from the first direction, overlaps at least the first signal line, is located on a first level of a front-side of the substrate opposite from the back-side. In some embodiments, the second gate extends in the second direction, overlaps at least the first signal line, is on the first level, and is separated from the first gate in the first direction. In some embodiments, the first signal line electrically couples the first gate and the second gate together.

Still another aspect of this description relates to a method of fabricating an integrated circuit. In some embodiments, the method includes fabricating a first set of gates of a set of transistors in a front-side of a substrate, depositing a first set of conductive structures on a back-side of the substrate opposite from the front-side thereby forming a set of power rails, fabricating a first set of vias in the back-side of the substrate, and depositing a second set of conductive structures on the back-side of the substrate thereby forming a set of signal lines electrically connected to the first set of gates of the set of transistors by the first set of vias.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit comprising:
   a first power rail on a back-side of a substrate, extending in a first direction, and configured to supply a first supply voltage;
   a first active region of a first set of transistors, the first active region extending in the first direction, and being on a first level of a front-side of the substrate opposite from the back-side;
   a second active region of a second set of transistors, the second active region extending in the first direction, being on the first level of the front-side of the substrate, and being separated from the first active region in a second direction different from the first direction;
   a conductive structure on the back-side of the substrate, extending in the first direction, and being electrically coupled to the first active region and the second active region;
   a first contact extending in the second direction, overlapping the first active region, and being located on a second level different from the first level; and
   a second contact extending in the second direction, overlapping the second active region, being located on the second level, and being electrically coupled to the first contact.

2. The integrated circuit of claim 1,
   wherein the second contact is separated from the first contact in at least the first direction or the second direction.

3. The integrated circuit of claim 2, further comprising:
   a first via between the conductive structure and the first contact, the first via electrically coupling the conductive structure to the first contact; and
   a second via between the conductive structure and the second contact, the second via electrically coupling the conductive structure to the second contact.

4. The integrated circuit of claim 3, wherein
   the first set of transistors comprises:
      a first transistor; and
      a second transistor,
   the second set of transistors comprises:
      a third transistor; and
      a fourth transistor,
   wherein a drain of the first transistor and a drain of the second transistor are coupled to the first contact; and a drain of the third transistor and a drain of the fourth transistor are coupled to the second contact.

5. The integrated circuit of claim 4, wherein the conductive structure electrically couples each of the drain of the first transistor, the drain of the second transistor, the drain of the third transistor and the drain of the fourth transistor together.

6. The integrated circuit of claim 1, further comprising:
a third contact extending in the second direction, overlapping the first active region, being located on the second level;
a fourth contact extending in the second direction, overlapping the second active region, being located on the second level, and being separated from the third contact in at least the first direction or the second direction; and
a fifth contact extending in the second direction, overlapping the second active region, being located on the second level, and being separated from the fourth contact in the first direction.

7. The integrated circuit of claim 6, further comprising:
a second power rail on the back-side of the substrate, extending in the first direction, being separated from the first power rail in the second direction, and configured to supply a second supply voltage different from the first supply voltage;
a first via between the first power rail and the third contact, the first via electrically coupling the first power rail to the third contact;
a second via between the second power rail and the fourth contact, the second via electrically coupling the second power rail to the fourth contact; and
a third via between the second power rail and the fifth contact, the second via electrically coupling the second power rail to the fourth contact.

8. The integrated circuit of claim 7, wherein
the first set of transistors comprises:
   a first transistor; and
   a second transistor;
the second set of transistors comprises:
   a third transistor; and
   a fourth transistor,
wherein a source of the first transistor and a source of the second transistor are coupled to the first power rail by the third contact and the first via;
a source of the third transistor is coupled to the second power rail by the fourth contact and the second via; and
a source of the fourth transistor is coupled to the second power rail by the fifth contact and the third via.

9. The integrated circuit of claim 1, wherein the first set of transistors and the second set of transistors are part of an AND OR INVERT logic circuit.

10. An integrated circuit comprising:
a first power rail on a back-side of a substrate, extending in a first direction, and configured to supply a first supply voltage;
a first signal line on the back-side of the substrate, and extending in the first direction;
a first gate extending in a second direction different from the first direction, overlapping at least the first signal line, being located on a first level of a front-side of the substrate opposite from the back-side; and
a second gate extending in the second direction, overlapping at least the first signal line, being on the first level, and being separated from the first gate in the first direction,
wherein the first signal line electrically couples the first gate and the second gate together.

11. The integrated circuit of claim 10, further comprising:
a first via between the first signal line and the first gate, the first via electrically coupling the first signal line and the first gate together; and
a second via between the first signal line and the second gate, the second via electrically coupling the first signal line and the second gate together.

12. The integrated circuit of claim 11, further comprising:
a third gate extending in the second direction, overlapping at least the first signal line, being located on the first level, and being separated from the first gate and the second gate in the first direction; and
a fourth gate extending in the second direction, overlapping at least the first signal line, being on the first level, and being separated from the first gate, the second gate and the third gate in the first direction.

13. The integrated circuit of claim 10, further comprising:
a first active region of a first set of transistors of a first type, the first active region extending in the first direction, and being on a second level different from the first level; and
a second active region of a second set of transistors of a second type different from the first type, the second active region extending in the first direction, being on the second level, and being separated from the first active region in the second direction.

14. The integrated circuit of claim 13, wherein
the first set of transistors comprises:
   a first transistor;
   a second transistor; and
   a third transistor;
the second set of transistors comprises:
   a fourth transistor; and
   a fifth transistor.

15. The integrated circuit of claim 14, further comprising:
a first contact extending in the second direction, overlapping the first active region, being located on a third level different from at least the second level;
a second contact extending in the second direction, overlapping the first active region, being located on the third level, and being separated from the first contact in the first direction;
a third contact extending in the second direction, overlapping the first active region, being located on the third level, and being separated from the first contact and the second contact in the first direction;
a fourth contact extending in the second direction, overlapping the second active region, being located on the third level, and being separated from the first contact in the second direction; and
a fifth contact extending in the second direction, overlapping the second active region, being located on the third level, and being separated from the third contact in the second direction.

16. The integrated circuit of claim 15, further comprising:
a second power rail on the back-side of the substrate, extending in the first direction, being separated from the first power rail in the second direction, and configured to supply a second supply voltage different from the first supply voltage;
a first via between the first power rail and the first contact, the first via electrically coupling the first power rail to the first contact;
a second via between the first power rail and the second contact, the second via electrically coupling the first power rail to the second contact;

a third via between the first power rail and the third contact, the third via electrically coupling the first power rail to the third contact;

a fourth via between the second power rail and the fourth contact, the fourth via electrically coupling the second power rail to the fourth contact; and a fifth via between the second power rail and the fifth contact, the fifth via electrically coupling the second power rail to the fifth contact.

17. The integrated circuit of claim 13, wherein the first set of transistors and the second set of transistors is part of a NAND logic circuit.

18. A method of fabricating an integrated circuit, the method comprising:

fabricating a first set of gates of a set of transistors in a front-side of a substrate;

depositing a first set of conductive structures on a back-side of the substrate opposite from the front-side thereby forming a set of power rails;

fabricating a first set of vias in the back-side of the substrate; and depositing a second set of conductive structures on the back-side of the substrate thereby forming a set of signal lines, the set of signal lines being electrically connected to the first set of gates of the set of transistors by the first set of vias.

19. The method of claim 18, further comprising:

depositing a third set of conductive structures over the set of transistors thereby forming a first metal layer.

20. The method of claim 18, further comprising:

performing thinning on the back-side of the substrate opposite from the front-side.

\* \* \* \* \*